United States Patent
Sugasaki

(10) Patent No.: US 7,491,487 B2
(45) Date of Patent: Feb. 17, 2009

(54) POLYMERIZABLE COMPOSITION AND LITHOGRAPHIC PRINTING PLATE PRECURSOR

(75) Inventor: Atsushi Sugasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/071,441

(22) Filed: Mar. 4, 2005

(65) Prior Publication Data

US 2005/0196698 A1    Sep. 8, 2005

(30) Foreign Application Priority Data

Mar. 4, 2004    (JP) .................... P. 2004-061114

(51) Int. Cl.
  *G03F 7/00*    (2006.01)
(52) U.S. Cl. .............. 430/284.1; 430/281.1; 430/288.1; 430/302; 430/300; 430/906
(58) Field of Classification Search ............... 430/284.1
See application file for complete search history.

(56) References Cited

U.S. PATENT DOCUMENTS

| 5,102,774 | A | * | 4/1992 | Setthachayanon | ........ | 430/284.1 |
| 5,341,799 | A | * | 8/1994 | Fifield et al. | ................... | 528/49 |
| 2002/0156316 | A1 | * | 10/2002 | Gruzins et al. | ................ | 560/76 |

FOREIGN PATENT DOCUMENTS

| EP | 0 949 540 A1 | * | 10/1999 |
| EP | 1 213 619 A1 | | 6/2002 |
| EP | 1 353 235 A1 | | 10/2003 |
| JP | 63-287944 A | | 11/1988 |
| JP | 63-287947 A | | 11/1988 |
| JP | 1-271741 A | | 10/1989 |
| JP | 7-120040 B2 | | 12/1995 |
| JP | 7-120041 B2 | | 12/1995 |
| JP | 7-120042 B2 | | 12/1995 |
| JP | 8-12424 B2 | | 2/1996 |

OTHER PUBLICATIONS

Aoshima Keitaro, "Photosensitive Composition"—JP 63 287946 (1989) vol. 013, No. 112.
Kamiya Akihiko, "Photosensitive Composition"—JP 63 287943 (1989) vol. 013, No. 112.
Aotani Norimasa, "Photosensitive Composition"—JP 1 271741 (1990) vol. 014, No. 035.
Kamiya Akihiko, "Photosensitive Composition"—JP 63 287944 (1989) vol. 013, No. 112.
European Search Report dated Jul. 8, 2005.

* cited by examiner

*Primary Examiner*—Cynthia Hamilton
(74) *Attorney, Agent, or Firm*—Sughrue Mion, PLLC

(57) ABSTRACT

A polymerizable composition comprising: a polyurethane resin synthesized by using a compound represented by the following formula (I) as one of starting materials; a photopolymerization or thermal polymerization initiator; and an addition-polymerizable compound having an ethylenically unsaturated bond:

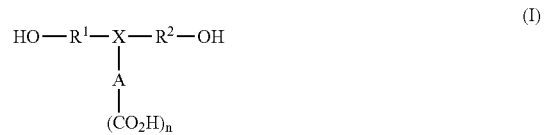

wherein X represents a tri- or higher valent atom; $R^1$ and $R^2$ each independently represent a single bond or an alkylene group optionally having a substituent, provided that $R^1$ and $R^2$ do not represent a single bond at a same time; A represents a straight chain linking group; and n is an integer of from 1 to 5.

12 Claims, No Drawings

POLYMERIZABLE COMPOSITION AND LITHOGRAPHIC PRINTING PLATE PRECURSOR

FIELD OF THE INVENTION

This invention relates to a polymerizable composition and a lithographic printing plate precursor. More specifically, it relates to a negative type polymerizable composition and a lithographic printing plate precursor usable in high-sensitive writing with the use of laser beams.

BACKGROUND OF THE INVENTION

As photosensitive lithographic printing plates, there have been widely employed PS plates comprising a hydrophilic support and a lipophilic photosensitive resin layer formed thereon. As a plate-making method therefor, it has been a common practice to perform mask-exposure (face exposure) via a lith film followed by the dissolution and removal of non-image parts, thereby giving a desired printing plate.

As photosensitive lithographic printing plate precursors, there have been widely employed PS plates comprising a hydrophilic support and a lipophilic photosensitive resin layer formed thereon. As a plate-making method therefor, it has been a common practice to perform mask-exposure (face exposure) via a lith film followed by the dissolution and removal of non-image parts, thereby giving a desired printing plate. In recent years, digitization techniques whereby image data are electronically processed, stored and output with the use of a computer have been widely diffused. Thus, various image-outputting systems for these digitization techniques have been put into practical use. As a result, it has been urgently required to establish computer-to-plate (CTP) technology whereby an image is scanned with highly directional light such as laser beams in accordance with digitized data and thus a printing plate is directly made without resort to a lith film. Accordingly, it is an important technical problem to provide a lithographic printing plate precursor appropriate for the technology.

As such lithographic printing plate precursors usable in scanning exposure, there has been proposed a construction comprising a hydrophilic support and a lipophilic photosensitive resin layer (hereinafter also called a photosensitive layer) containing a photosensitive compound, which can generate an active species such as a radical or bronsted acid upon laser-exposure, formed on the support and such a product has been already put on the market. When a lithographic printing plate precursor of this type is laser-scanned in accordance with digital data, an active species thus generated induces a physical or chemical change in the photosensitive layer and insolubilizes the same. Next, the lithographic printing plate precursor is subjected to development, thereby giving a lithographic printing plate of the negative type. Among all, a lithographic printing plate precursor having a hydrophilic support and a photosensitive layer of the photopolymerization type, which is formed on the support and contains a photopolymerization initiator showing a favorable photosensitization speed, an ethylenically unsaturated compound capable of undergoing addition polymerization and a binder polymer soluble in alkali developing solution, together with, if needed, an oxygen-blocking protective layer has advantages such as a high productivity, convenience in development, high resolution and favorable ink impression and, therefore, available as a printing plate having desirable printing performance.

To improve press life of printing plates, use has been made of urethane resin binders (see, for example, JP-B-7-120040, JP-B-7-120041, JP-B-7-120042, JP-B-8-12424, JP-A-63-287944, JP-A-63-287947 and JP-A-1-271741). In these documents, however, no description is made on image drawing by laser-scanning exposure. Although there are lithographic printing plates which contain a urethane binder and are suitable for laser-scanning exposure, these plates are still insufficient in press life energy per unit area is lowered and thus the discrimination of exposed part/unexposed part is lessened. As a result, there arises a problem that the image part is frequently damaged by an alkali component in the developing solution and thus a favorable press life cannot be obtained.

SUMMARY OF THE INVENTION

The present invention, which has been made by considering the problems occurring in the related art, aims at providing a lithographic printing plate precursor which is excellent in press life, suitable for scanning exposure with laser beams, enables high-speed writing and has a high productivity, and a polymerizable composition appropriately usable in the photosensitive layer thereof.

As the results of intensive studies in order to achieve the above objects, the inventor has found out that the above objects can be achieved by using a polyurethane resin having a specific carboxylic acid unit as a polymer binder constituting a photosensitive layer, thereby completing the invention.

Accordingly, the polymerizable composition according to the invention is a polymerizable composition which contains a polyurethane resin synthesize by using a compound represented by the following formula (I) as one of starting materials (hereinafter optionally called "a specific polyurethane resin"), a photopolymerization or thermal polymerization initiator and an addition-polymerizable compound having ethylenically unsaturated bond.

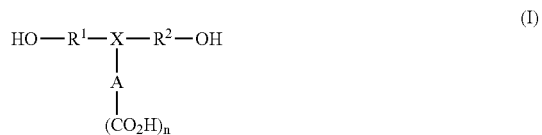

In the above formula (I), X represents a trivalent or higher atom (tri- or higher valent atom). $R^1$ and $R^2$ independently represent each a single bond or an alkylene group optionally having a substituent, provided that $R^1$ and $R^2$ do not represent a single bond at the same time (the case that both of $R^1$ and $R^2$ represent a single bond is excluded). A represents a straight chain linking group. n is an integer of from 1 to 5.

The lithographic printing plate precursor according to the invention is a lithographic printing plate precursor which has a photosensitive layer containing the polymerizable composition according to the invention on a support.

A lithographic printing plate precursor having the polymerizable composition according to the invention containing the specific polyurethane resin in the photosensitive layer has a sufficient press life and can exhibit a high productivity even under such exposure conditions as having less irradiation energy per unit area.

Although the mechanism of the invention still remains unclear, it is assumed as follows.

The specific polyurethane resin employed in the polymerizable composition and the lithographic printing plate precursor according to the invention is excellent in diffusion properties in a developing solution and alkali-response (i.e., solubility in an aqueous alkali solution) and is highly soluble in the developing solution even at a small acid content (i.e., at an insufficient acid value). Therefore, it appears that a lithographic printing plate precursor containing this specific polyurethane resin in the photosensitive layer can maintain high development properties while preventing developer penetration damages caused by and productivityThat is to say, as scanning speed is elevated to further improve productivity, exposure the acid content. Because of containing the specific polyurethane resin, the lithographic printing plate precursor according to the invention can exert excellent characteristics such that the developer penetration damages are prevented in an exposed part, an image part having hardened surface is rigidly sustained in an exposed area and no stain occurs in an unexposed part owing to the high dissolution speed in an alkali developing solution. It is estimated that, therefore, the lithographic printing plate precursor can show an excellent performance of achieving both of a high press life in an image part and favorable development properties in an non-image part even under such exposure conditions as having a low irradiation energy per unit area and, in its turn, achieves a high productivity.

According to the invention, it is possible to provide a lithographic printing plate precursor which is excellent in press life, suitable for scanning exposure with laser beams, enables high-speed writing and has a high productivity, and a polymerizable composition appropriately usable in the photosensitive layer thereof.

DETAILED DESCRIPTION OF THE INVENTION

<Polymerizable Composition>

The polymerizable composition according to the invention is characterized by containing a polyurethane resin synthesized by using a compound represented by the following formula (I) as one of starting materials, a photopolymerization or thermal polymerization initiator and an addition-polymerizable compound having ethylenically unsaturated bond.

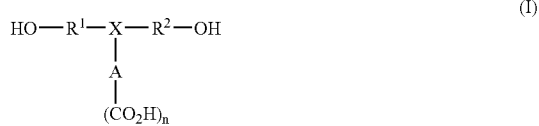

In the formula (I), X represents a trivalent or higher atom. $R^1$ and $R^2$ independently represent each a single bond or an alkylene group optionally having a substituent, provided that $R^1$ and $R^2$ do not represent a single bond at the same time. A represents a straight chain linking group. n is an integer of from 1 to 5.

This polymerizable composition has a mechanism wherein the polymerization initiator is decomposed due to light or heat to generate a radical and the polymerizable compound undergoes polymerization due to the thus generated radical. The polymerizable composition according to the invention is applicable to various uses. Namely, it is appropriately usable as the photosensitive layer of lithographic printing plate precursors allowing direct drawing by infrared laser beams or the like, image recording materials and highly sensitive photomodeling materials. Moreover, it is usable as hologramic materials with the use of a change in refractive index in association with the polymerization and in the production of electronic materials such as photoresists. Among all, it is particularly suitable as a photosensitive layer of lithographic printing plate precursors allowing direct drawing with laser beams or the like.

The polymerizable composition according to the invention will be described in greater detail by reference to a lithographic printing plate precursor (the lithographic printing plate precursor according to the invention) in which it is most suitably usable.

<Lithographic Printing Plate Precursor>

The lithographic printing plate precursor according to the invention is characterized by having a photosensitive layer containing the polymerizable composition according to the invention as described above. The lithographic printing plate precursor according to the invention is particularly suitable for plate making by direct drawing with laser beams of 300 to 1,200 nm in wavelength and, as a result, can achieve a high press life compared with the existing lithographic printing plate precursors.

[Photosensitive Layer]

First, the photosensitive layer of the lithographic printing plate precursor according to the invention will be described in detail.

The photosensitive layer of the lithographic printing plate precursor according to the invention is a photosensitive layer which contains a polyurethane resin containing a compound represented by the formula (I) as a monomer component, a photopolymerization or thermal polymerization initiator and an addition-polymerizable compound having ethylenically unsaturated bond (hereinafter merely called "an addition-polymerizable compound" too) as the essential components optionally together with various additives such as a cosensitizer, a coloring agent, a plasticizer and a polymerization inhibitor, if necessary. Next, individual components constituting the photosensitive layer in the invention will be described.

(Specific Polyurethane Resin)

The photosensitive layer of the lithographic printing plate precursor according to the invention contains a polyurethane resin (a specific polyurethane resin) containing a compound represented by the formula (I) as a monomer component.

First, the compound represented by the formula (I) will be described in greater detail.

In the formula (I), X represents a trivalent or higher atom. As examples of the a trivalent or higher atom, a nitrogen atom, a carbon atom, a silicon atom and so on may be cited. Among them, a nitrogen atom and a carbon atom are preferable. The fact that atom represented by X is a trivalent or higher atom means X has at least three bonds to which $R^1$, $R^2$ and terminal —COOH (mediated by the linking group A) are attached. X may further have a hydrogen atom or a substituent. Examples of the substituent which can be introduced into X include substituents composed of atom(s) selected from the group consisting of a hydrogen atom, an oxygen atom, a sulfur atom and halogen atoms. More specifically speaking, a hydrocarbon group having from 1 to 50 carbon atoms is preferable therefor.

In the formula (I), $R^1$ and $R^2$ independently represent each a single bond or an alkylene group optionally having a substituent, provided that $R^1$ and $R^2$ do not represent a single bond at the same time. As the alkylene group, an alkylene group having from 1 to 20 carbon atoms is preferable and an alkylene group having 2 to 10 carbon atoms is still preferable. Examples of the substituent which can be introduced into the alkylene group include halogen atoms (—F, —Br, —Cl and —I), alkyl groups optionally having a substituent and so on.

In the formula (I), A represents a straight chain linking group. The term "straight chain linking group" as used herein does not include those having a cyclic structure as a part of its structure. Examples of the straight chain linking group represented by A include straight chain linking groups composed of two or more atoms selected from the group consisting of a carbon atom, a hydrogen atom, an oxygen atom, a nitrogen atom and a sulfur atom. More specifically speaking, it is preferable that the main skeleton constituting the linking group represented by A has from 1 to 30 atoms, still preferably from 3 to 25 atoms, still preferably from 4 to 20 atoms and most desirably from 5 to 10 atoms. The term "main skeleton of linking group" as used herein means the atoms or the atomic group exclusively employed for linking X to the terminal COOH in the formula (I). In the case of having a plural number of linking pathways, in particular, it means the atoms or the atomic group constituting the pathway having the smallest number of atoms.

In the most desirable embodiment, the linking group represented by A has a main skeleton consisting of from 5 to 10 atoms.

Next, examples of the structure of the compound represented by the formula (I) will be presented. Further, the number of atoms constituting the main skeleton of the linking group represented by A and a method of calculating the same will be described for each example.

| | Number of atoms constituting the main skeleton of linking group |
|---|---|
| (1) 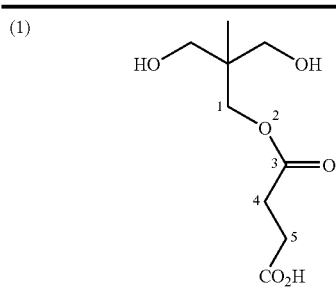 | 5 |
| (2) 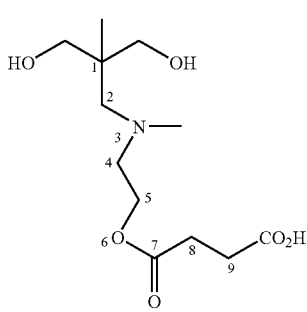 | 9 |
| (3) 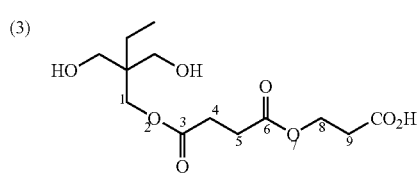 | 9 |

-continued

| | Number of atoms constituting the main skeleton of linking group |
|---|---|
| (4) 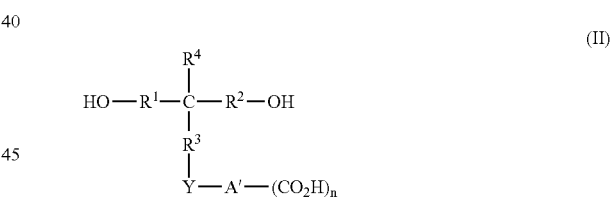 | 8 |

More specifically examples of the linking group represented by A in the formula (I) include alkylenes, substituted alkylenes, arylenes and substituted arylenes. These divalent groups may have a structure comprising —O—, —S—, —N($R^4$)—, —C(=O)—, —OC(=O)—, —C(=O)O—, —NHC(=O)O—, NHC(=O)NH— or the like either alone or a combination thereof liked to each other. $R^4$ represents a hydrogen atom or a monovalent hydrocarbon group having from 1 to 10 carbon atoms.

Examples of a linking group having a chain structure include ethylene, propylene and so on. Also, a structure wherein such alkylenes are bonded to each other via an ester bond may be cited as a preferable example.

In the formula (I), n is an integer of from 1 to 5. From the viewpoint of press life, it is preferable that n is 1.

In the compounds represented by the formula (I), compounds represented by the following formula (II) are preferable and compounds represented by the formula (III) are still preferable.

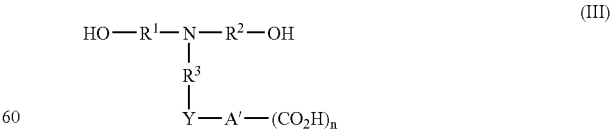

(II)

In the formula (II), $R^1$, $R^2$ and A' respectively have the same meanings as $R^1$, $R^2$ and A as defined in the above formula (I). $R^3$ represents an alkylene group. $R^4$ represents a straight chain or cyclic alkyl group. Y represents an oxygen atom, a nitrogen atom or a sulfur atom. n is an integer of from 1 to 5.

$$HO-R^1-N-R^2-OH$$
$$\begin{array}{c} | \\ R^3 \\ | \\ Y-A'-(CO_2H)_n \end{array}$$

(III)

In the formula (III), $R^1$, $R^2$, A' and n respectively have the same meanings as $R^1$, $R^2$, A and n as defined in the above formula (I). $R^3$ represents an alkylene group. $R^3$ represents an alkylene group. Y represents an oxygen atom, a nitrogen atom or a sulfur atom.

In the formula (II) or (III), the main skeleton of the straight chain linking group represented by A' preferably has from 1 to 20 atoms, still preferably from 2 to 10 atoms and still preferably form 3 to 7 atoms.

In the formula (II) or (III), the alkylene group represented by $R^3$ preferably has from 1 to 20 carbon atoms, still preferably from 1 to 10 carbon atoms and still preferably from 1 to 5 carbon atoms. The alkylene group may have a substituent. Examples of the substituent which can be introduced thereinto include alkyl groups, an ethylene oxide group and so on. It is preferred that the alkylene group is in the insubstituted state.

As the alkyl group represented by $R^4$ in the formula (II), an alkyl group having from 1 to 50 carbon atoms is preferable and an alkyl group having from 1 to 15 carbon atoms is still preferable. Specific examples of the alkyl group include a methyl group, an ethyl group and so on. The alkyl group may further have a substituent. Examples of the substituent which can be introduced thereinto include halogen atoms, alkyl groups and so on.

Next, preferable examples of the compound represented by the formula (I) will be presented, though the invention is not restricted thereto.

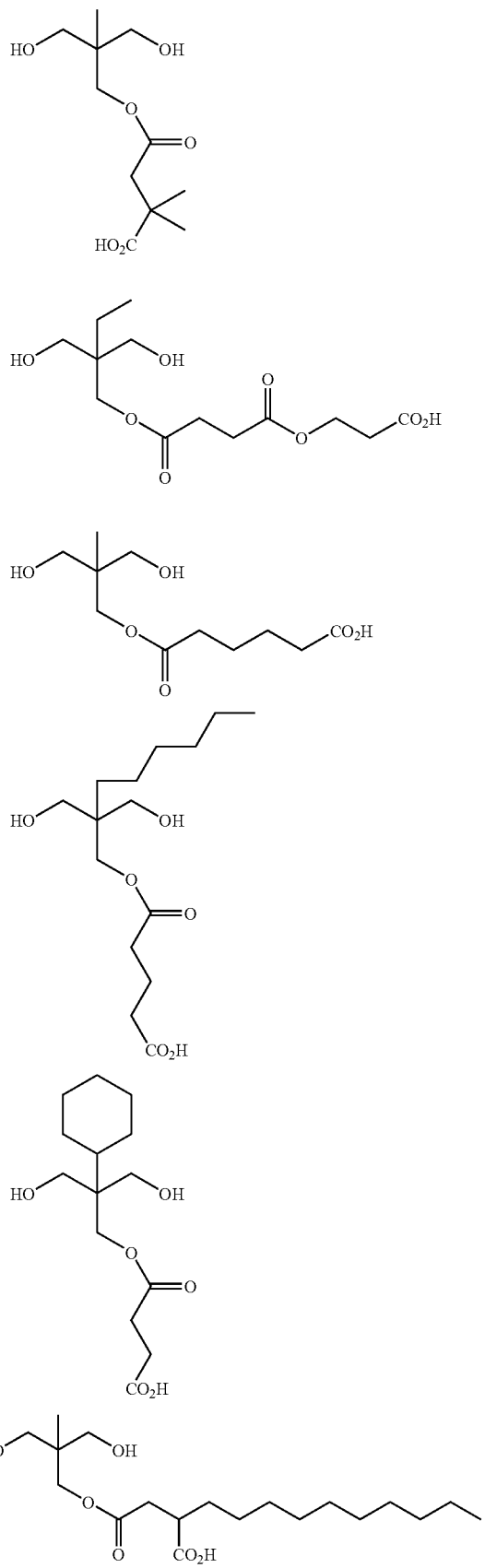

-continued
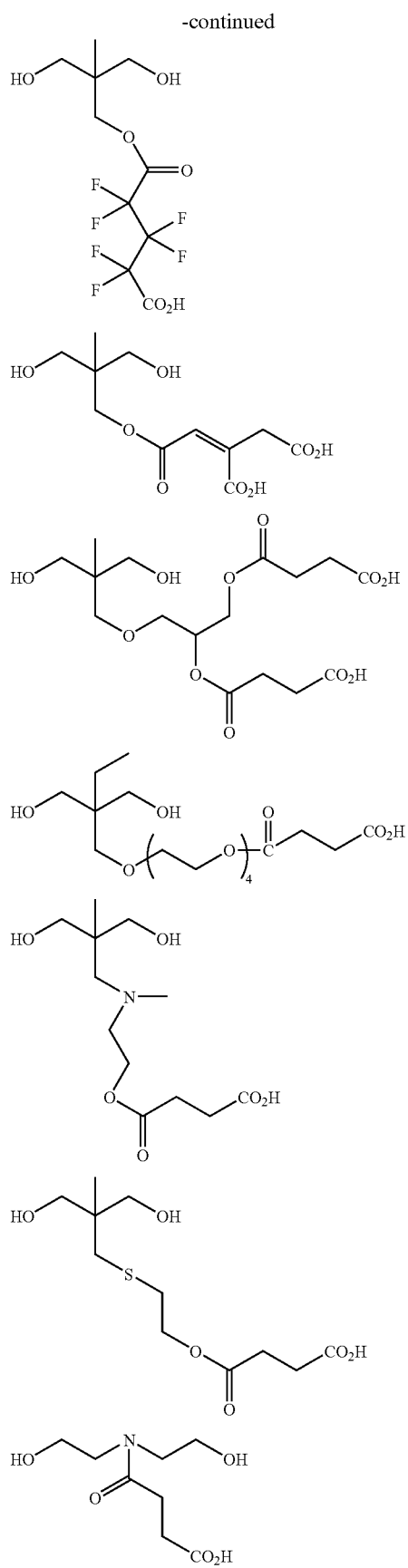
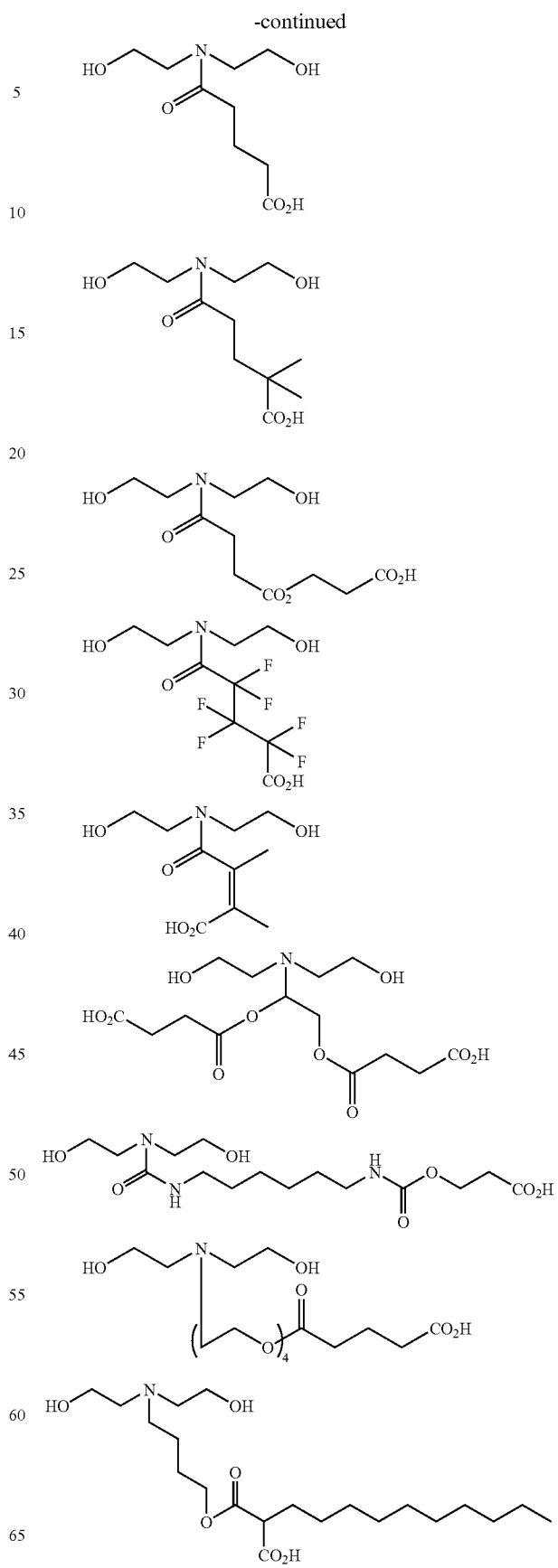

-continued

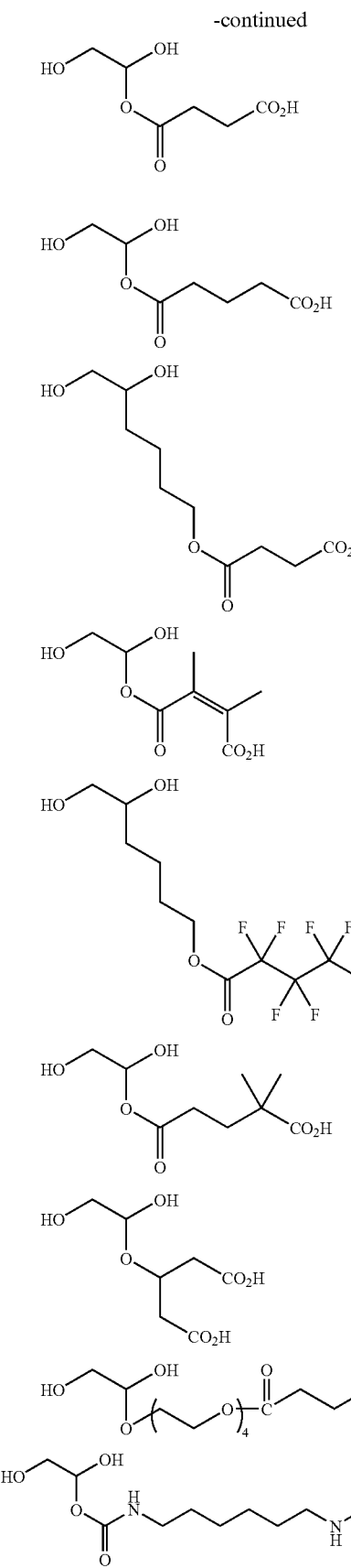

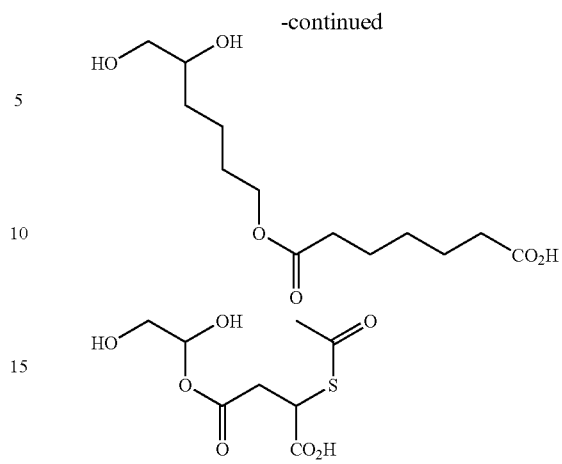

The specific polyurethane resin may contain either one or more types of the structure originating in the compound represented by the formula (I).

The total content of the repeating unit originating in the compound represented by the formula (I) in the specific polyurethane resin may be appropriately determined depending on the structure thereof, the design of the photosensitive layer, etc. It is preferable that the content thereof ranges from 1 to 50% by mol, still preferably from 10 to 50% by mol and still preferably from 20 to 50% by mol, based on the total amount by mol of the polymer components.

-Fundamental Skeleton of Specific Polyurethane Resin-

The specific polyurethane resin in the invention is a polyurethane resin which has a structural unit represented by the product of a reaction between at least one diisocyanate compound represented by the following formula (1) and at least one diol compound represented by the formula (2) as the fundamental skeleton. In the invention, at least one diol compound represented by the following formula (2) is a compound represented by the above formula (I).

$$OCN-X^0-NCO \quad (1)$$

$$HO-Y^0-OH \quad (2)$$

In the formulae (1) and (2), $X^0$ and $Y^0$ independently represent each a divalent organic group.

The specific polyurethane resin may be exclusively made of the diisocyanate group and the compound represented by the formula (I). However, it is usually synthesized with the use of other diol compounds together.

From the viewpoints of the image-forming properties by exposure and press life, the weight-average molecular weight of the specific polyurethane resin preferably ranges from 5000 to 500000, still preferably form 8000 to 300000 and most desirably from 10000 to 150000.

As the specific polyurethane resin according to the invention, it is preferable to use a polyurethane resin containing a functional group having an unsaturated bond in its side chain. As such a functional group having an unsaturated bond, the groups represented by the following formulae (3) to (5) are preferable and one having the group represented by the formula (3) is most desirable. Next, the groups represented by the formulae (3) to (5) will be described in greater detail.

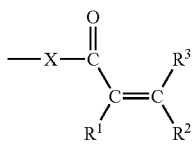

(3)

In the above formula (3), $R^1$ to $R^3$ independently represent each a monovalent organic group. It is preferable that $R^1$ is a hydrogen atom or an alkyl group optionally having a substituent. Among all, a hydrogen atom or a methyl group is preferred because of having a high radical reactivity. $R^2$ and $R^3$ independently represent each a hydrogen atom, a halogen atom, an amino group, a carboxyl group, an alkoxycarbonyl group, a sulfo group, a nitro group, a cyano group, an alkyl group optionally having a substituent, an aryl group optionally having a substituent, an alkoxy group optionally having a substituent, an aryloxy group optionally having a substituent, an alkylamino group optionally having a substituent, an arylamino group optionally having a substituent, an alkylsulfonyl group optionally having a substituent, an arylsulfonyl group optionally having a substituent or the like. Among all, a hydrogen atom, a carboxyl group, an alkoxycarbonyl group, an alkyl group optionally having a substituent or an aryl group optionally having a substituent is preferred because of having a high radical reactivity.

In the formula (3), X represents an oxygen atom, a sulfur atom or —N($R^{12}$)— wherein $R^{12}$ represents a hydrogen atom or a monovalent organic group. Examples of $R^{12}$ include an alkyl group optionally having a substituent and, among all, a hydrogen atom, a methyl group, an ethyl group or an isopropyl group is preferred because of having a high radical reactivity.

Examples of the substituent which can be introduced thereinto include alkyl groups, alkenyl groups, alkynyl groups, aryl groups, alkoxy groups, aryloxy groups, halogen atoms, an amino group, alkylamino groups, arylamino groups, a carboxyl group, alkoxycarbonyl groups, a sulfo group, a nitro group, a cyano group, an amido group, alkylsulfonyl groups, arylsulfonyl groups and so on.

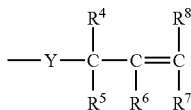

(4)

In the above formula (4), $R^4$ to $R^8$ independently represent each a monovalent organic group. Preferable examples of $R^4$ to $R^8$ include a hydrogen atom, halogen atoms, an amino group, dialkylamino groups, a carboxyl group, alkoxycarbonyl groups, a sulfo group, a nitro group, a cyano group, alkyl groups optionally having a substituent, aryl groups optionally having a substituent, alkoxy groups optionally having a substituent, aryloxy groups optionally having a substituent, alkylamino groups optionally having a substituent, arylamino groups optionally having a substituent, alkylsulfonyl groups optionally having a substituent, arylsulfonyl groups optionally having a substituent and so on. Among all, a hydrogen atom, a carboxyl group, alkoxycarbonyl groups, alkyl groups optionally having a substituent and aryl groups optionally having a substituent are preferred.

Examples of the substituent which can be introduced thereinto are the same as those in the formula (3). Y represents an oxygen atom, a sulfur atom or —N($R^{12}$)— wherein $R^{12}$ has the same meaning as in the formula (3) and preferable examples thereof are also the same.

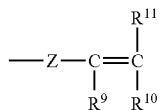

(5)

In the formula (5), $R^9$ preferably represents a hydrogen atom, an alkyl group optionally having a substituent or the like. Among all, a hydrogen atom or a methyl group is preferred because of having a high radical reactivity. $R^{10}$ and $R^{11}$ independently represent each a hydrogen atom, a halogen atom, an amino group, a dialkylamino group, a carboxyl group, an alkoxycarbonyl group, a sulfo group, a nitro group, a cyano group, an alkyl group optionally having a substituent, an aryl group optionally having a substituent, an alkoxy group optionally having a substituent, an aryloxy group optionally having a substituent, an alkylamino group optionally having a substituent, an arylamino group optionally having a substituent, an alkylsulfonyl group optionally having a substituent, an arylsulfonyl group optionally having a substituent or the like. Among all, a hydrogen atom, a carboxyl group, an alkoxycarbonyl group, an alkyl group optionally having a substituent or an aryl group optionally having a substituent is preferred because of having a high radical reactivity.

Examples of the substituent which can be introduced thereinto are the same as those in the formula (3). Z represents an oxygen atom, a sulfur atom, —N($R^{13}$)— or a phenylene group optionally having a substituent. $R^{13}$ represents an alkyl group optionally having a substituent or the like and, among all, a methyl group, an ethyl group or an isopropyl group is preferred because of having a high radical reactivity.

An unsaturated bond may be introduced into a side chain of the specific polyurethane resin as follows. Namely, in the case where at least one of the diisocyanate compound represented by the above formula (1) and the diol compound represented by the formula (2) has at least one of the groups represented by the formulae (3) to (5), a specific polyurethane resin having group(s) represented by the formulae (3) to (5) is formed as the product of the reaction between the diisocyanate compound and the diol compound as described above. According to this method, the specific polyurethane resin can be produced easily compared with the case wherein a desired side chain is introduced via substitution after the completion of the reaction for forming a polyurethane resin.

As an example of the triisocyanate compound to be used for introducing an unsaturated bond into a side chain of the specific polyurethane resin, a product obtained by addition-reacting a triisocyanate compound with one equivalent of a monofunctional alcohol or a monofunctional amine compound having an unsaturated group may be cited.

Next, examples of the triisocyanate compound will be presented, though the invention is not restricted thereto.

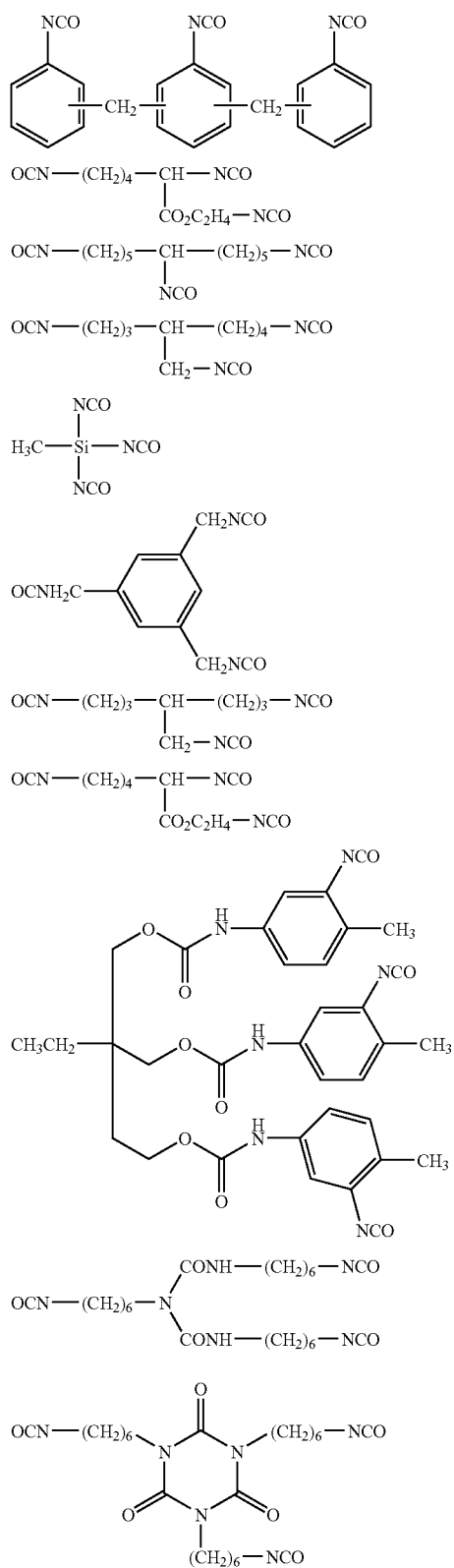
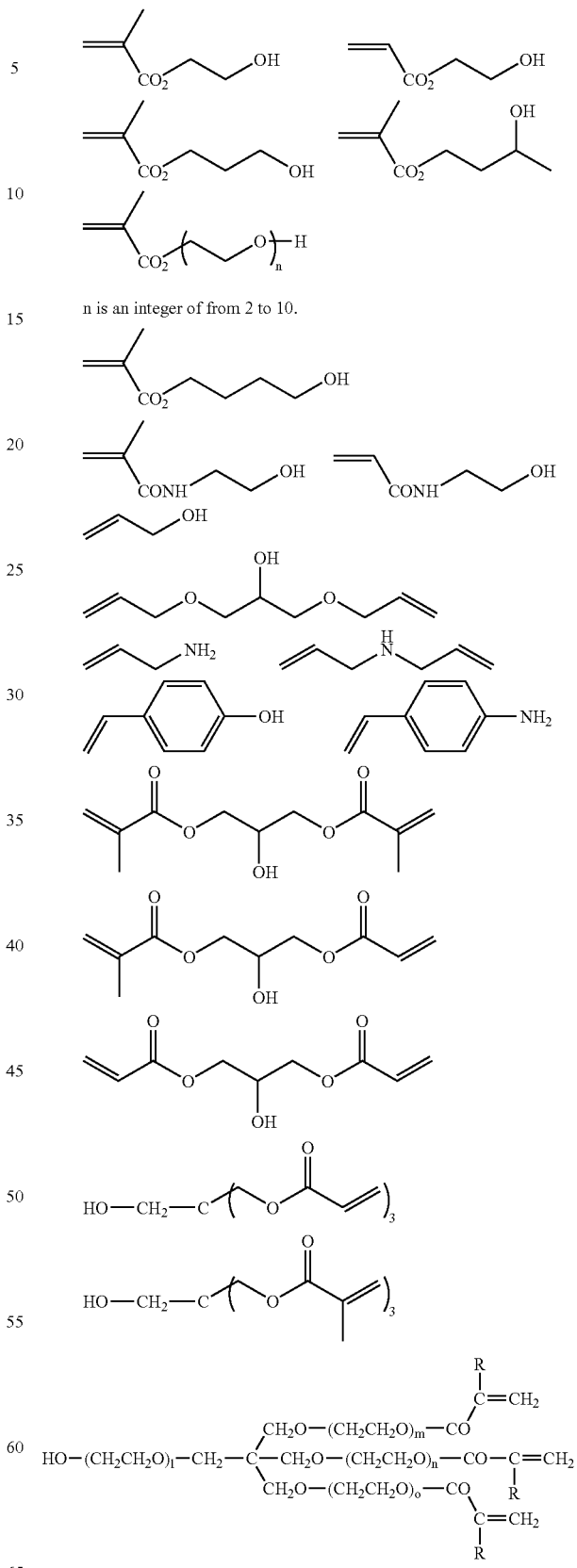
Next, examples of the monofunctional alcohol or a monofunctional amine compound having an unsaturated bond will be presented, though the invention is not restricted thereto.

-continued

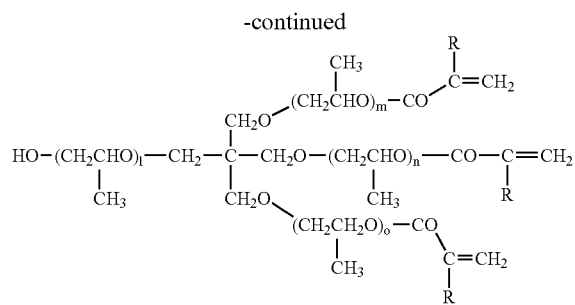

R:hydrogen or methyl group
l, m, n, o:an integer of from 1 to 20

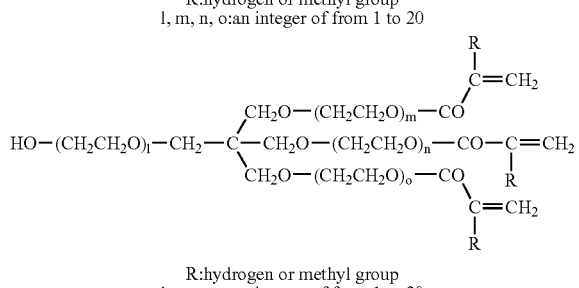

R:hydrogen or methyl group
l, m, n, o:an integer of from 1 to 20

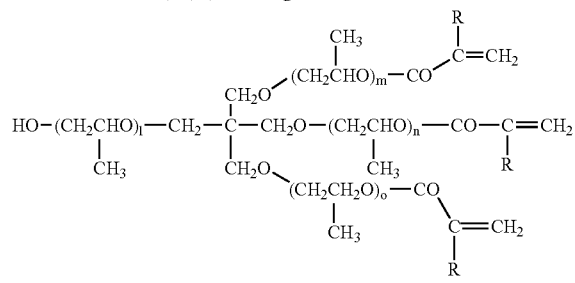

R:hydrogen or methyl group
l, m, n, o:an integer of from 1 to 20

-continued

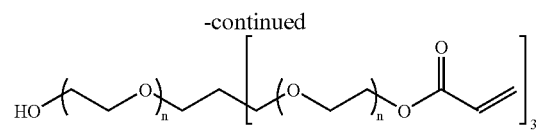

n:an integer of from 1 or 20

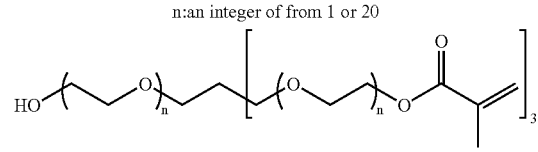

n:an integer of from 1 or 20

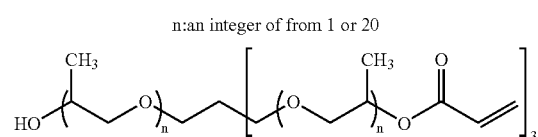

n:an integer of from 1 or 20

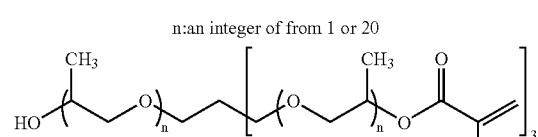

n:an integer of from 1 or 20

As a method of introducing an unsaturated group into a side chain of the polyurethane resin, use may be appropriately made of a method which comprises using a diisocyanate compound having an unsaturated group in its side chain as a material fro producing the polyurethane resin. Next, examples of the compound which is a diisocyanate compound having an unsaturated group in its side chain obtained by addition-reacting a triisocyanate compound with one equivalent of a monofunctional alcohol or a monofunctional amine compound having an unsaturated group will be presented, though the invention is not restricted thereto.

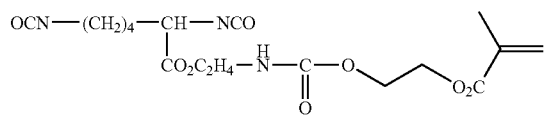

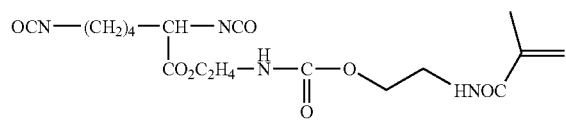

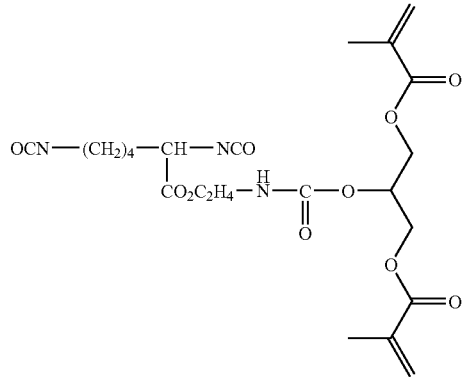

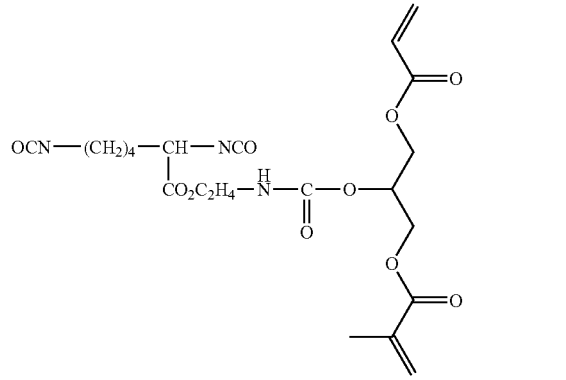

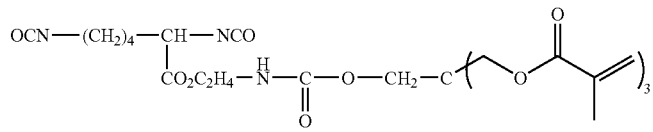

-continued
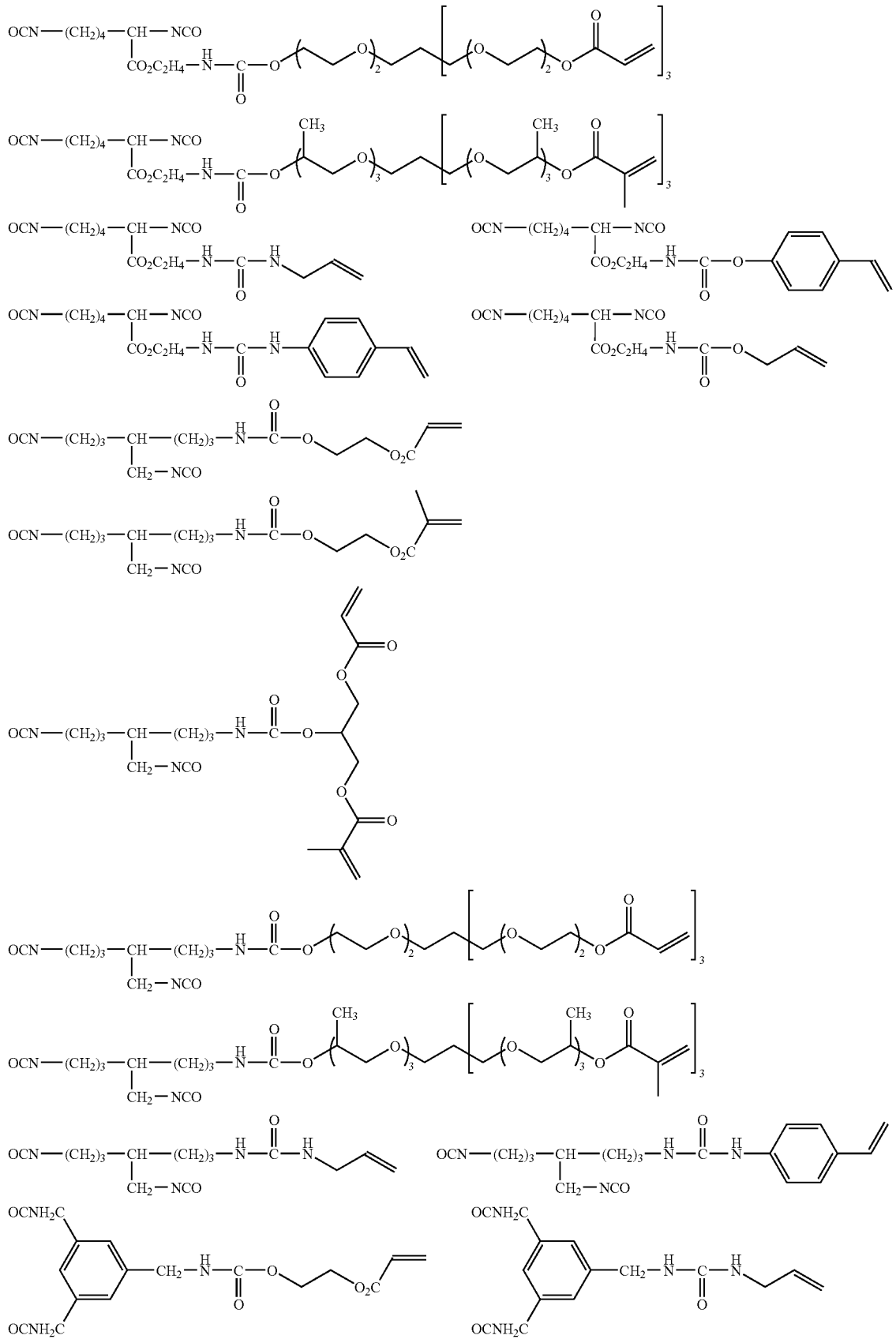

-continued
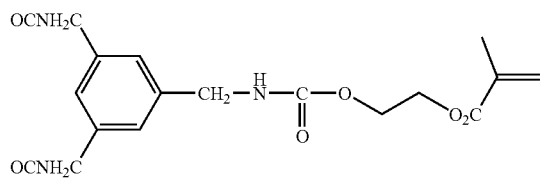
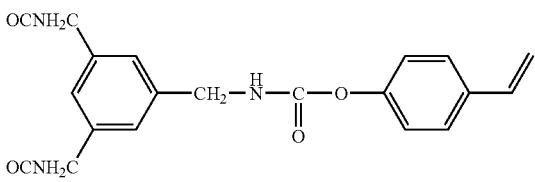
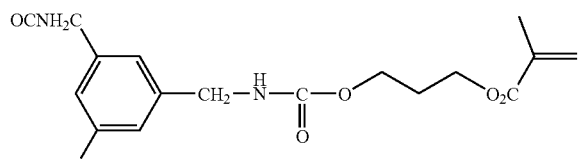
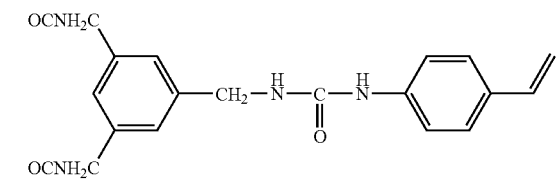
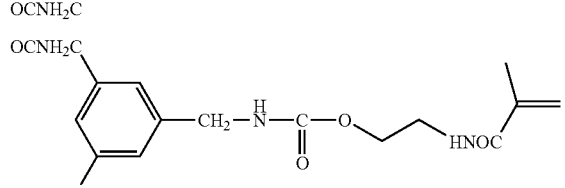
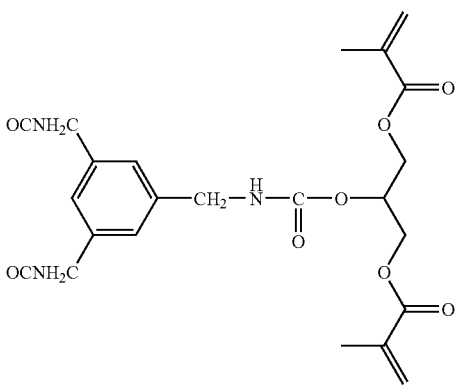
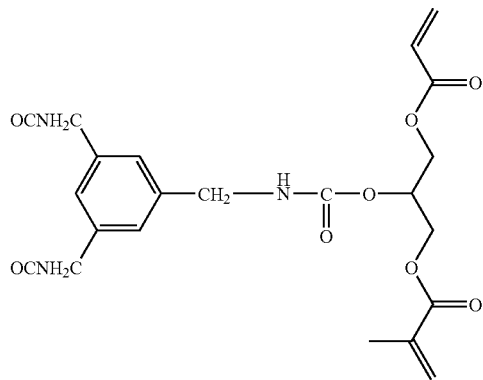
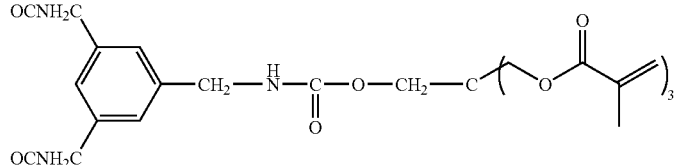
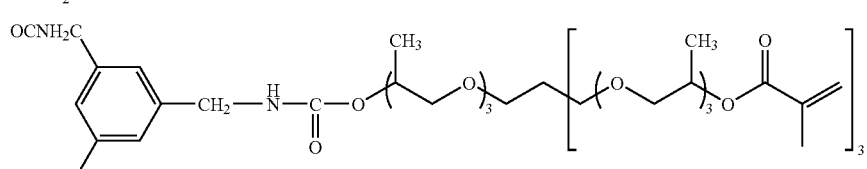
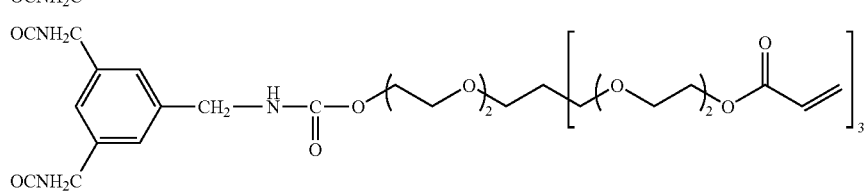

-continued

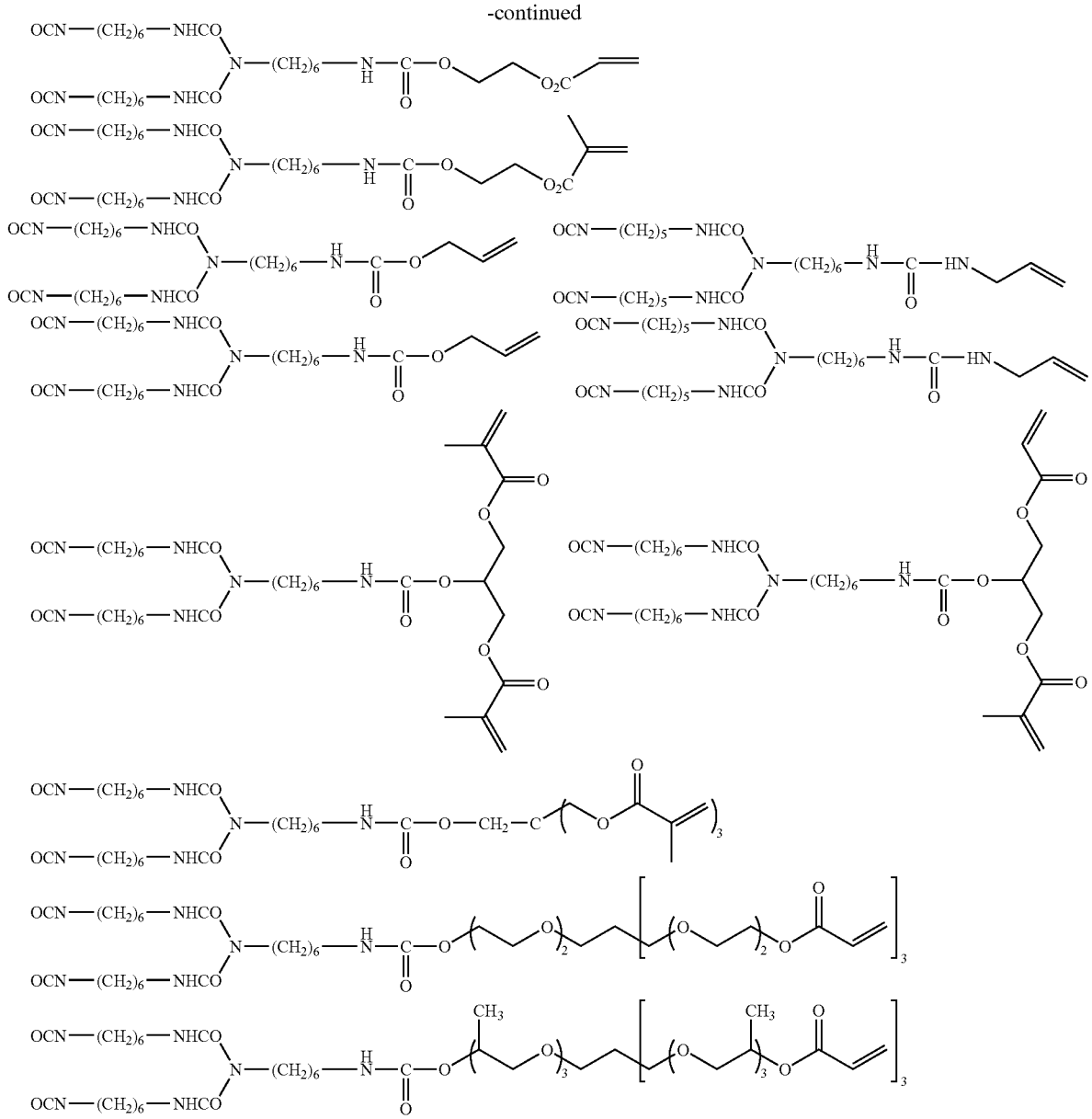

As a method of introducing an unsaturated group into a side chain of the specific polyurethane resin, it is also suitable to use a method which comprises using a diol compound having an unsaturated group in its side chain as a material for producing the polyurethane resin. As such a diol compound, use may be made of a marketed product such as trimethylolpropane monoallyl ether, or a compound which can be easily produced by reacting a halogenated diol compound, a triol compound or an aminodiol compound with a carboxylic acid, an acid chloride, an isocyanate, an alcohol, an amine, a thiol or a halogenated alkyl compound having an unsaturated group. Specific examples of these compounds include the compounds cited in the paragraphs [0064] to [0066] in JP-A-2002-251008 and so on.

In producing the specific polyurethane resin, publicly known diisocyanate compounds and diol compounds other than those cited above can be used without specific restriction in combination with the compound represented by the above formula (I) so long as the advantages of the invention are not worsened thereby. As specific examples thereof, compounds listed in *Kobunshi Deta Handobukku-Kiso hen-*, (ed. by The Society of Polymer Science, Baifukan, 1986) can be cited. Either one of the additional diisocyanate compounds and additional diol compounds or a combination of two or more thereof may be used.

Specific examples of the additional diisocyanate compounds include aromatic diisocyanate compounds such as 2,4-tolylene diisocyanate, 2,4-tolylene diisocyanate dimer, 2,6-tolylene diisocyanate, p-xylylene diisocyanate, m-xylylene diisocyanate, 4,4'-dipehnylmethane diisocyanate, 1,5-naphthylene diisocyanate and 3,3'-dimethylbiphenyl-4,4'-diisocyanate; aliphatic diisocyanate compounds such as hexamethylene diisocyanate, trimethylhexamethylene diisocyanate, lysine diisocyanate and dimeric acid diisocyanate;

alicyclic diisocyanate compounds such as isophorone diisocyanate, 4,4'-methylenebis(cyclohexyl isocyanate), methylcyclohexane-2,4(or 2,6) diisocyanateand 1,3-(isocyanomethyl)cyclohexane; and diisocyanate compounds obtained as the product of a reaction between a diol and a diisocyanate such as an adduct of 1 mole of 1,3-butylene glycol and 2 moles of tollylene diisocyanate.

Specific examples of the additional diols include polyether diol compounds, polyester diol compounds and polycarbonate diol compounds such as ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-heanediol, 2-butene-1,4-diol, 2,2,4-trimethyl-1,3-pentanediol, 1,4-bis-β-hydroxyethoxycyclohexane, cyclohexane dimethanol, tricyclodecane dimethanol, hydrogenated bisphenol A, hydrogenated bisphenol F, ethylene oxide adduct of bisphenol A, propylene oxide adduct of bisphenol A, ethylene oxide adduct of bis phenol F, propylene oxide adduct of bisphenol F, ethylene oxide adduct of hydrogenated bisphenol A, propylene oxide adduct of hydrogenated bisphenol A, hydroquinone dihydroxy ethyl ether, p-xylylene glycol, dihydroxyethyl sulfone, bis(2-hydroxyethyl)-2,4-tolylene dicarbamate, 2,4-tolylene-bis(2-hydroxyethylcarbamide), bis(2-hydroxyethyl)-m-xylylene dicarbamate, bis(2-hydroxyethyl) isophthalate, 1,3-propanediol, 1,4-butanediol, 1,5-pentanediol, 1,6-hexanediol, 1,7-heptanediol, 1,8-octanediol, 2-butene-1,4-diol, cis-2-butene-1,4-diol, trans-2-butene-1,4-diol, catechol, resorcin, hydroquinone, 4-methylcatechol, 4-t-butylcatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcin, 4-benzylresorcin, 4-acetylresorcin, 4-carbomethoxyresorcin, 2-methylresorcin, 5-methylresorcin, t-butylhydroquinone, 2,5-d-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)hexane, 1,4-bis(2-(hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxybenzoate, 2-hydroxyethyl-4-hydroxyphenyl acetate, resorcin mono-2-hydroxyethyl ether, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight-average molecular weight of 1000, polyethylene glycol having a weight-average molecular weight of 1500, polyethylene glycol having a weight-average molecular weight of 2000, polyethylene glycol having a weight-average molecular weight of 3000, polyethylene glycol having a weight-average molecular weight of 7500, polypropylene glycol having a weight-average molecular weight of 400, polypropylene glycol having a weight-average molecular weight of 700, polypropylene glycol having a weight-average molecular weight of 1000, polypropylene glycol having a weight-average molecular weight of 2000, polypropylene glycol having a weight-average molecular weight of 3000, polypropylene glycol having a weight-average molecular weight of 4000, PTMG650, PTMG1000, PTMC2000, PTMG3000, NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128, NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P, NEWPOL BPE-5P, NEWPOL 50HB-100, NEWPOL 50HB-260, NEWPOL 50HB-400, NEWPOL 50HB-660, NEWPOL 50HB-2000, NEWPOL 50HB-5100 (each being trade name manufactured by SANYO KASEI Co., Ltd.)

It is also possible to use combinations with diol compounds having carboxyl group such as 3,5-dihydroxybenzoic acid, 2,2-bis(hydorxymethyl)propionic acid, 2,2-bis(2-hydorxyethyl)propionic acid, 2,2-bis(3-hydorxydipropyl)propionic acid, bishydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine and N,N-bis(2-hydroxyethyl)-3-carboxypropionamide.

Moreover, it is possible to use aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropy)tetramethylsiloxane, piperazine, 2,5-dimethylpiperazine, N-(2-aminoethyl)piperazine, 4-amino-2,2-6,6-tetramethylpiperidine, N,N-dimethylethylenediamine, lysine, L-cysteine and isophoronediamine; aromatic diamine compounds such as o-phenylenediamine, m-phenylenediamine, p-phenylenediamine, 2,4-tolylenediamine, benzidine, o-ditolydine, o-dianinsidine, 4-nitrom-phenylenediamine, 2,5-dimethoxy-p-phenylenediamine, bis(4-aminophenyl)sulfone, 4-carboxyphonylenediamine, 3-carboxy-m-phenylenediamine, 4,4'-diaminophenyl ether and 1,8-naphthalenediamine; heterocyclic amine compounds such as 2-aminoimidazole, 3-aminotriazole, 5-amino-1H-tetrazole, 4-aminopyrazole, 2-aminobenzimidazole, 2-amine-5-carbxy-triazole, 2,4-diamino-6-methyl-s-triazine, 2,6-diaminopyridine, L-histidine, DL-tryptophan and adenine; and aminoalcohol or aminophenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol; p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenyglycine, 2-aminobenzyl alcohol, 4-aminophenethyl alcohol, 2-carboxy-5-amino-1-naphthol and L-tyrosine.

In the polymer synthesis, it is preferable that an unreacted terminal isocyanate group is capped with an alcohol compound having a radical-polymerizable group. This is because the urethane polymer obtained after terminating the reaction has further improved press life. Examples of the alcohol compound having a radical-polymerizable group include 2-hydroxyethyl (meth)acrylate, 2-hydroxypropyl (meth)acrylate, 2-hydroxy-3-chloropropyl (meth)acrylate, 2-hydroxy-3-allyloxypropyl (meth)acrylate, 2-hydroxy-3-phenoxypropyl (meth)acrylate, 4-hydroxybutyl (meth)acrylate, glycerol diacrylate, glycerol acrylate methacrylate, glycerol dimethacrylate, pentaerythritol acrylate, tris(acryloyloxyethyl) isocyanate and so on.

Either one of the specific polyurethane resins in the invention or a combination of two or more thereof may be used. It is also possible to add one or more polymer binders publicly known in the art to give a mixture. In the case of using as a mixture, the added polymer binder is employed in an amount of preferably from 1 to 60% by mass (by weight), more preferably from 1 to 40% by mass and still more preferably from 1 to 20% by mass based on the total mass of the polymer binder components including the specific polyurethane resins. In the case of using as a mixture, an amount of all binders contained in the photosensitive layer is not restricted and can be decided arbitrarily within a scope of purposes, but, the amount of all binders contained in the photosensitive layer is preferably from 10 to 90% by mass, more preferably from 20 to 80% by mass, and still more preferably from 30 to 60% by mass, based on the total solid content in the photosensitive layer. As the polymer binder to be added, any publicly known ones may be used without restriction. More specifically speaking, it is preferable to use binders having acrylic main chain, urethane binders, acetal-denatured polyvinyl alcohol resins (for example, butylal resin) and so on commonly employed in the art. An amount of the specific polyurethane resin contained in the photosensitive layer is not restricted and can be decided arbitrarily within a scope of purposes, but, the amount of the specific polyurethane resin contained in the photosensitive layer is preferably from 10 to 90% by mass, more preferably from 20 to 80% by mass, and still more preferably from 30 to 60% by mass, based on the total solid content in the photosensitive layer (the amount of the specific polyurethane resin contained in the polymerizable composition is preferably from 10 to 90% by mass, more preferably from 20 to 80% by mass, and still more preferably from 30 to 60% by mass, based on the nonvolatile components in the polymerizable composition).

Next, photosensitive layer components other than the polymer binders such as the specific polyurethane resin will be described.

(Addition-Polymerizable Compound)

The addition-polymerizable compound having ethylenically unsaturated bond (addition-polymerizable compound) to be used in the invention is an addition-polymerizable compound having at least one ethylenically unsaturated bond which is selected from the group consisting of compounds having at least one, preferably two or more ethylenically unsaturated bonds at terminus. Such compounds, which have been widely known in the art, can be employed in the invention without specific restriction. These compounds involve those having chemical forms of, for example, monomers, prepolymers (i.e., dimers, termers and oligomers), mixtures thereof and copolymers thereof. Examples of the monomers and copolymers thereof include unsaturated carboxylic acids (for example, acrylic acid, methacrylic acid, itaconic acid, crotonic acid, isocrotonic acid, maleic acid, etc.), esters thereof and amides thereof. It is preferable to use esters of unsaturated carboxylic acids with aliphatic polyhydric alcohols and amides of unsaturated carboxylic acids with aliphatic polyvalent amine compounds. Moreover, use may be appropriately made of addition reaction products of unsaturated carboxylic acid esters or amides having a nucleophilic substituent such as a hydroxyl group, an amino group or a mercapto group with monofunctional or polyfunctional isocyanates or epoxy compounds, dehydrocondensation products thereof with monofunctional or polyfunctional carboxylic acids, etc. In addition, it is also appropriate to use addition reaction products of unsaturated carboxylic acid esters or amides having an electrophilic substituent such as an isocyanate group or an epoxy group with monohydric or polyhydric alcohols, amides or thiols and substitution reaction products of unsaturated carboxylic acid esters or amides having a leaving substituent such as a halogen group or a tosyloxy group with monohydric or polyhydric alcohols, amines or thiols. As further examples, it is also possible to employ compounds prepared by substituting the unsaturated carboxylic acids as described above by unsaturated phosphonic acid, styrene, vinyl ether or the like.

As Specific examples of the monomers of the esters of aliphatic polyhydric alcohol compounds with unsaturated carboxylic acids, citation may be made of acrylic acid esters, e.g., ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomers.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate and sobritol tetraitaconate.

Examples of crotonic acid esters include ethyleneglycol dicrotonate, tetramethylene glycol dicrotonate, pentaerythritol dicrotonate and sorbitol tetracrotonate.

Examples of isocrotonic acid esters include ethyleneglycol diisocrotonate, pentaerythritol diisocrotonate and sorbitol tetraisocrotonate.

Examples of maleic acid esters include ethyleneglycol dimaleate, triethylene glycol dimaleate, pentaerythritol dimaleate and sorbitol tetramaleate.

As other examples of the esters, use may be appropriately made of aliphatic alcohol type esters described in JP-B-46-27926, JP-B-51-47334 and JP-A-57-196231, those having an aromatic skeleton described in JP-A-59-5240, JP-A-59-5241 and JP-A-2-226149, those having an amino group described in JP-A-1-165613, etc. Furthermore, it is also possible to use mixtures of the ester monomers as described above.

Specific examples of the monomers of amides of aliphatic polyvalent amine compounds with unsaturated carboxylic acids include methylene bis-acrylamide, methylene bis-methacrylamide, 1,6-hexamethyelne bis-acrylamide, 1,6-hexamethyelne bis-methacrylamide, diethylenetriamine trisacrylamide, xylylene bisacrylamide, xylylene bis-methacrylamide, etc.

Other preferable examples of amide-type monomers include those having a cyclohexylene structure described in JP-B-54-21726.

Also, a urethane-based addition-polymerizable compound produced by using the addition reaction between isocyanate and a hydroxyl group can be appropriately used. Specific examples thereof include vinylurethane compounds having two or more polymerizable vinyl groups per molecule, which are obtained by adding a vinyl monomer having a hydroxyl group as represented by the following formula to a polyisocyanate compound having two or more isocyanate groups per molecule, as described in, for example, JP-B-48-41708.

$$CH_2=C(R^4)COOCH_2CH(R^5)OH \qquad (i)$$

In the formula (i), $R^4$ and $R^5$ represent each H or $CH_3$.

Moreover, use may be appropriately made of urethane acrylates described in JP-A-51-37193, JP-B-2-32293 and JP-B-2-16765, urethane compounds having an ethylene oxide-type skeleton described in JP-B-58-49860, JP-B-56-17654, JP-B-62-39417 and JP-B-62-39418, etc.

Furthermore, thermally polymerizable compositions having highly favorable photosensitization speed can be obtained by using addition-polymerizable compounds having an amino structure or a sulfide structure in the molecule described in JP-A-63-277653, JP-A-63-260909 and JP-A-1-105238.

Additional examples of the polymerizable compound include polyester acrylates and polyfunctional acrylates and methacrylates such as epoxyacrylates obtained by reacting epoxy resins with (meth)acrylic acid which are described in JP-A-48-64138, JP-B-49-43191 and JP-B-52-30490. Furthermore, specific unsaturated compounds described in JP-B-46-43946, JP-B-1-40337 and JP-B-1-40336 and vinylphosphonic acid type compounds described in JP-A-2-25493 may be cited. In some cases, moreover, it is appropriate to use a structure having a perfluoroalkyl group as described in JP-A-61-22048. It is also possible to use light-hardening monomers and oligomers reported in *Nippon Secchaku Kyokai-shi*, vol. 20, No. 7, pp. 300-308 (1984).

Details in using such a polymerizable compound (i.e., it structure, either using alone or combinedly, the addition level, etc.) can be arbitrarily selected depending on the purpose of use, for example, design of the performance of the a recording material of the lithographic printing plate precursor according to the invention. For example, selection may be made from the following viewpoints. Concerning the photosensitization speed, it is preferable to employ a structure containing much unsaturated groups per molecule (preferably being bifunctional or higher in many cases). To elevate the strength in the image part (i.e., the hardened film), a trifunctional or higher compound is preferable. It is also effective to use a combination of compounds having different functional valences and different polymerizable groups (for example, an acrylic acid ester, a methacrylic acid ester, a styrene-type compound and a vinyl ether-type compound) so as to control both of the photosensitivity and the strength. Although a compound having a high molecular weight and a highly hydrophobic compound are favorable from the viewpoint of photosensitization speed and film strength, these compounds are sometimes undesirable with respects to development speed and deposition from a developing solution. Considering compatibility with other components in the recording layer (for example, a binder polymer, an initiator and a colorant) and dispersion properties, it is highly important to appropriately select and use an addition-polymerizable compound. For example, the compatibility can be improved in some cases by using a compound with a low purity or a combination of two or more compounds.

It is also possible to select a specific structure in order to enhance the adhesiveness to a substrate or an overcoat layer as will be described hereinafter. Concerning the composition ratio of the polymerizable compound in the recording layer, a higher ratio is the better from the viewpoint of sensitivity. However, an excessively large content of the polymerizable compound would result in undesirable phase separation, some problems in the production process due to the adhesiveness of the composition (for example, transfer of the sensitive components and troubles in the production due to adhesion), and deposition from a developing solution. From these points of view, it is preferable that the content of the polymerizable composition ranges from 5 to 80% by mass, still preferably from 25 to 75% by mass, based on the nonvolatile components (based on the total solid content) in the photosensitive layer (it is preferable that the content of the polymerizable composition ranges from 5 to 80% by mass, still preferably from 25 to 75% by mass, based on the nonvolatile components in the polymerizable compound). Either one polymerizable compound or two or more thereof may be used. In using the polymerizable compound, moreover, its structure, composition and addition level can be appropriately selected from the viewpoints of the degree of polymerization initiation to oxygen, resolution, fogging, change in refraction index, surface adhesiveness and so on. It is also possible in some cases to employ such a layer structure and coating method as forming undercoating or overcoating.

(Photopolymerization or Thermal Polymerization Initiator)

As a photopolymerization initiator, use can be made of an appropriate one selected from among various publicly known photopolymerization initiators reported in patents and documents or a system comprising a combination of two or more photopolymerization initiators (a photopolymerization initiator system) depending on the wavelength of a light source to be employed.

In the case of using blue semiconductor laser, Ar laser, the second higher harmonic wave of infrared semiconductor laser or SHG-YAG laser as a light source, there have been proposed various photopolymerization initiators (systems), for example, a specific photoreductive dye such as rose bengal, eosin or erythrosine or a system comprising a combination of dye with an initiator described in U.S. Pat. No. 2,850,445, a composite initiation system comprising, for example, a dye with an amine (JP-B-44-20189), a system comprising a combination of hexaarylbiimidazole, a radical generator and a dye (JP-B-45-37377), a system comprising hexaarylbiimidazole and p-dialkylaminobenzylidene ketone (JP-B-47-2528 and JP-A-54-155292), a system comprising a cyclic cys-α-dicarbonyl compound and a dye (JP-A-48-84183), a system comprising cyclic triazine and a merocyanine colorant (JP-A-54-151024), a system comprising 3-ketocoumarin and an active agent (JP-A-52-112681 and JP-A-58-15503), a system comprising biimidazole, a styrene derivative and thiol (JP-A-59-140203), a system comprising an organic peroxide with a colorant (JP-A-59-1504, JP-A-59-140203, JP-A-59-189340, JP-A-62-174203, JP-B-62-1641 and U.S. Pat. No. 4,766,055), a system comprising a dye and an active halogen compound (JP-A-63-1718105, JP-A-63-258903, JP-A-3-264771, etc.), a system comprising a dye and a borate compound (JP-A-62-143044, JP-A-150242, JP-A-64-13140, JP-A-64-13141, JP-A-64-13142, JP-A-64-13143, JP-A-64-13144, JP-A-64-17048, JP-A-1-229003, JP-A-1-298348, JP-A-1-138204, etc.), a system comprising a colorant having rhodamine ring and a radical generator (JP-A-2-179643 and JP-A-2-244050), a system comprising titanocene and a 3-ketocoumarin colorant (JP-A-63-221110), a system comprising a combination of titanocene with a xanthene colorant and an addition-polymerizable and ethylenically unsaturated compound having amino group or urethane group (JP-A-4-221958 and JP-A-4-219756), a system comprising titanocene and a specific merocyanine colorant (JP-A-6-295061), a system comprising titanocene and a colorant having benzopyran ring (JP-A-8-334897) and so on.

A particularly preferable photopolymerization initiator (system) in the photosensitive layer of the lithographic printing plate precursor according to the invention contains at least one titanocene. As the titanocene compound to be used as a photopolymerization initiator (system) in the invention, use may be made of any titanocene compound so long as it can generate active radical upon photoirradiation together with another sensitizing colorant. For example, it is possible to use a compound appropriately selected from publicly known compounds described in JP-A-59-152396, JPA-61-151197, JP-A-63-41483, JP-A-63-41484, JP-A-2-249, JP-A-2-291, JP-A-3-27393, JP-A-3-12403 and JP-A-6-41170.

Specific examples thereof include di-cyclopentadienyl-Ti-dichloride, di-cyclopentadienyl-Ti-bis-phenyl, dicyclopentadienyl-Ti-bis-2,3,4,5,6-pentafluorophen-1-yl (hereinafter also called "T-1"), di-cyclopentadienyl-Ti-bis-2,3,5,6-tetrafluorophen-1-yl, di-cyclopentadienyl-Ti-bis-2,4,6-trifluorophen-1-yl, diyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, bis(cyclopentadienyl)-bis(2,6-difluoro-3-pyr-1-yl)phenyl)titanium (hereinafter also called "T-2"), etc.

These titanocene compounds may further have various chemical modifications for improving the characteristics of the photosensitive layer. For example, use can be made of binding to a sensitizing colorant, an addition-polymerizable unsaturated compound or another radical-generating part, introduction of a hydrophilic moiety, improvement in compatibility, introduction of a substituent for inhibiting crystallization, introduction of a substituent for improving adhesiveness, polymerization and so on.

Details in using such a titanocene compound can be arbitrarily and appropriately selected depending on, for example, design of the performance of the lithographic printing plate precursor as in the case of the addition-polymerizable compound as described above. For example, the compatibility with the photosensitive layer can be elevated by using two or more titanocene compounds. From the viewpoint of photosensitization, it is usually advantageous to employ a photopolymerization initiator such as the above titanocene compound in a larger amount. Namely, sufficient photosensitization properties can be established by using from 0.5 to 80 parts by mass, preferably from 1 to 50 parts by mass, of titanocene per 100 parts by mass of nonvolatile components in the photosensitive layer. In the case of using under an all-round light (yellow, etc.), it is favorable to use titanocene in a smaller amount considering fogging with light at around 500 nm. By appropriately combining other sensitizing colorants, sufficient photosensitization properties can be obtained by using 6 parts by mass or less, specifically 1.9 parts by mass or less and still specifically 1.4 parts by mass or less, of titanocene.

As a thermal polymerization initiator to be used in the invention for initiating and progressing the hardening reaction of the above-described addition-polymerizable compound, it is useful to employ a radical generator of thermal decomposition type which decomposes upon heating and generates radical. When such a radical generator is used together with an infrared absorber as described above, the infrared absorber generates heat, thereby causing radical generation. Due to this combination, therefore, recording can be performed.

Examples of the radical generator include onium salts, triazine compounds having trihalomethyl group, peroxides, azo polymerization initiators, azide compounds, quinonediazide, oxime ester compounds, triaryl monoalkyl borates, etc. Among all, onium salts or oxime ester compounds are preferred because of being highly sensitive. Now, onium salts preferably usable as polymerization initiators in the invention will be illustrated. Preferable examples of the onium salts include iodonium salts, diazonium salts and sulfonium salts. In the invention, such an onium salt serves not as an acid generator but as a radical polymerization initiator. Onium salts represented by the following formulae (A) to (C) are preferably employed in the invention.

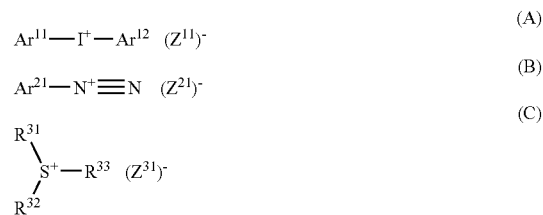

In the formula (A), $Ar^{11}$ and $Ar^{12}$ independently represent each an optionally substituted aryl group having not more than 20 carbon atoms. In the case where the aryl group has a substituent, preferable examples of the substituent include halogen atoms, a nitro group, alkyl groups having not more than 12 carbon atoms, alkoxy groups having not more than 12 carbon atoms and aryloxy groups having not more than 12 carbon atoms. $Z^{11-}$ represents a counter ion selected from the group consisting of halogen ions, a perchlorate ion, a tetrafluoroborate ion, a hexafluorophosphate ion, a carboxylate ion and sulfonate ions. It preferably represents a perchlorate ion, a hexafluorophosphate ion, a carboxylate ion or an arylsulfonate ion.

In the formula (B), $Ar^{21}$ represents an optionally substituted aryl group having not more than 20 carbon atoms. Preferable examples of the substituent include halogen atoms, a nitro group, alkyl groups having not more than 12 carbon atoms, alkoxy groups having not more than 12 carbon atoms, aryloxy groups having not more than 12 carbon atoms, alkylamino groups having not more than 12 carbon atoms, dialkylamino groups having not more than 12 carbon atoms, arylamino groups having not more than 12 carbon atoms and diarylamino groups having not more than 12 carbon atoms. $Z^{21-}$ represents the same counter ion as $Z^{11-}$.

In the formula (C), $R^{31}$, $R^{32}$ and $R^{33}$ may be the same or different and each represents an optionally substituted hydrocarbon group having not more than 20 carbon atoms. Preferable examples of the substituent include halogen atoms, a nitro group, alkyl groups having not more than 12 carbon atoms, alkoxy groups having not more than 12 carbon atoms and aryloxy groups having not more than 12 carbon atoms. $Z^{31-}$ represents the same counter ion as $Z^{11-}$.

Particular examples of the onium salt appropriately usable in the invention include the compounds described in JP-A-2001-133696. Next, specific examples of the onium salts represented by the formula (A) ([OI-1] to [OI-10]), the onium salts represented by the formula (B) ([ON-1] to [ON-5]) and the onium salts represented by the formula (C) ([OS-1] to [OS-7]) will be presented, though the invention is not restricted thereto.
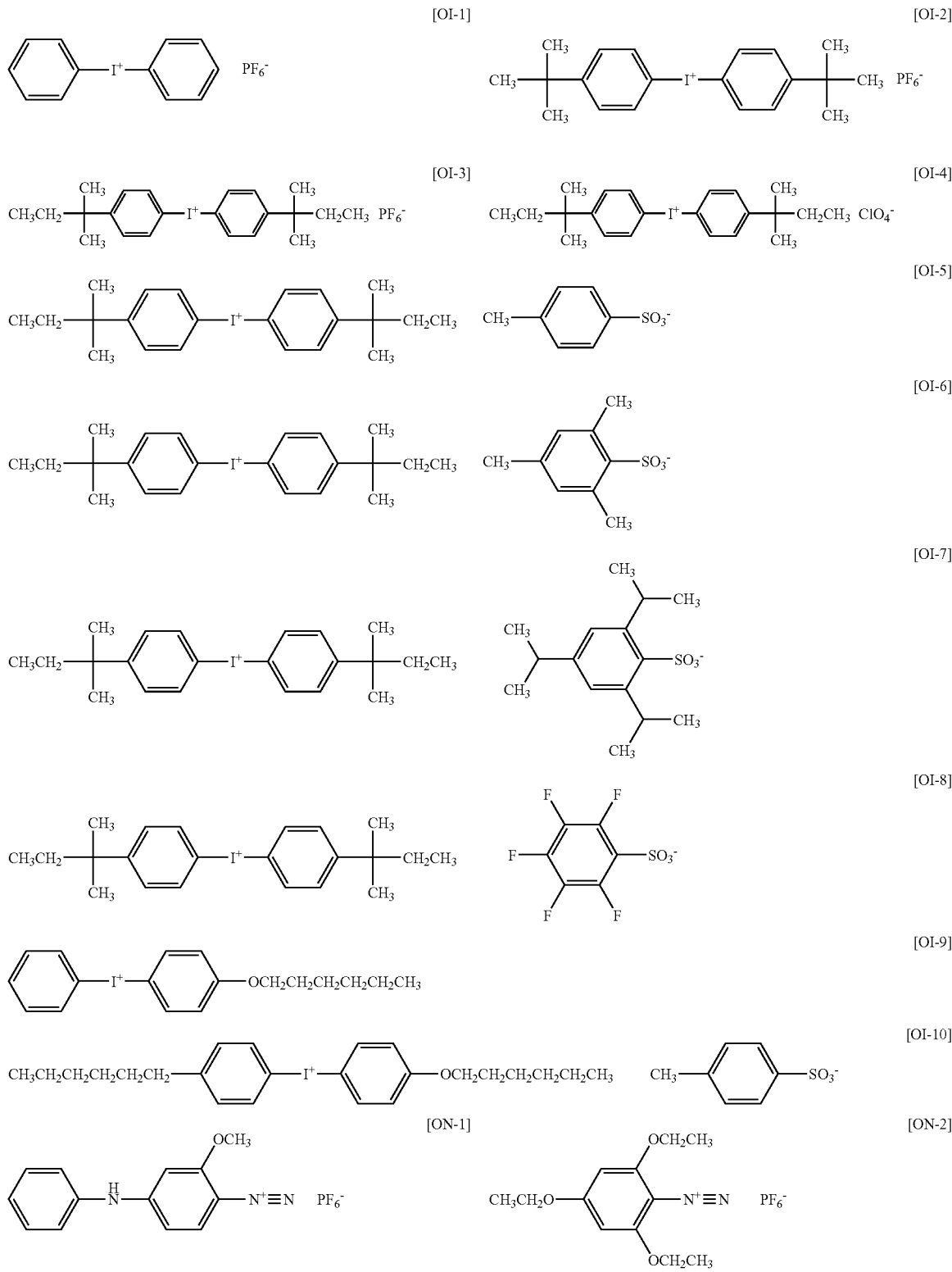

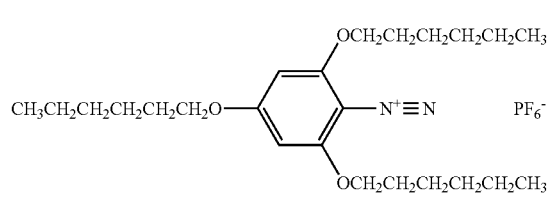
[ON-3]
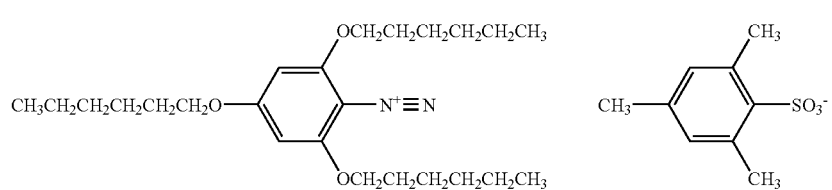
[ON-4]
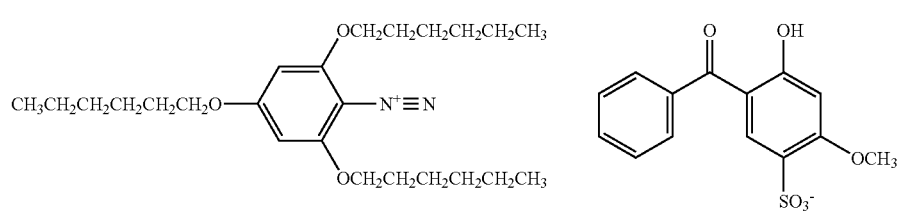
[ON-5]
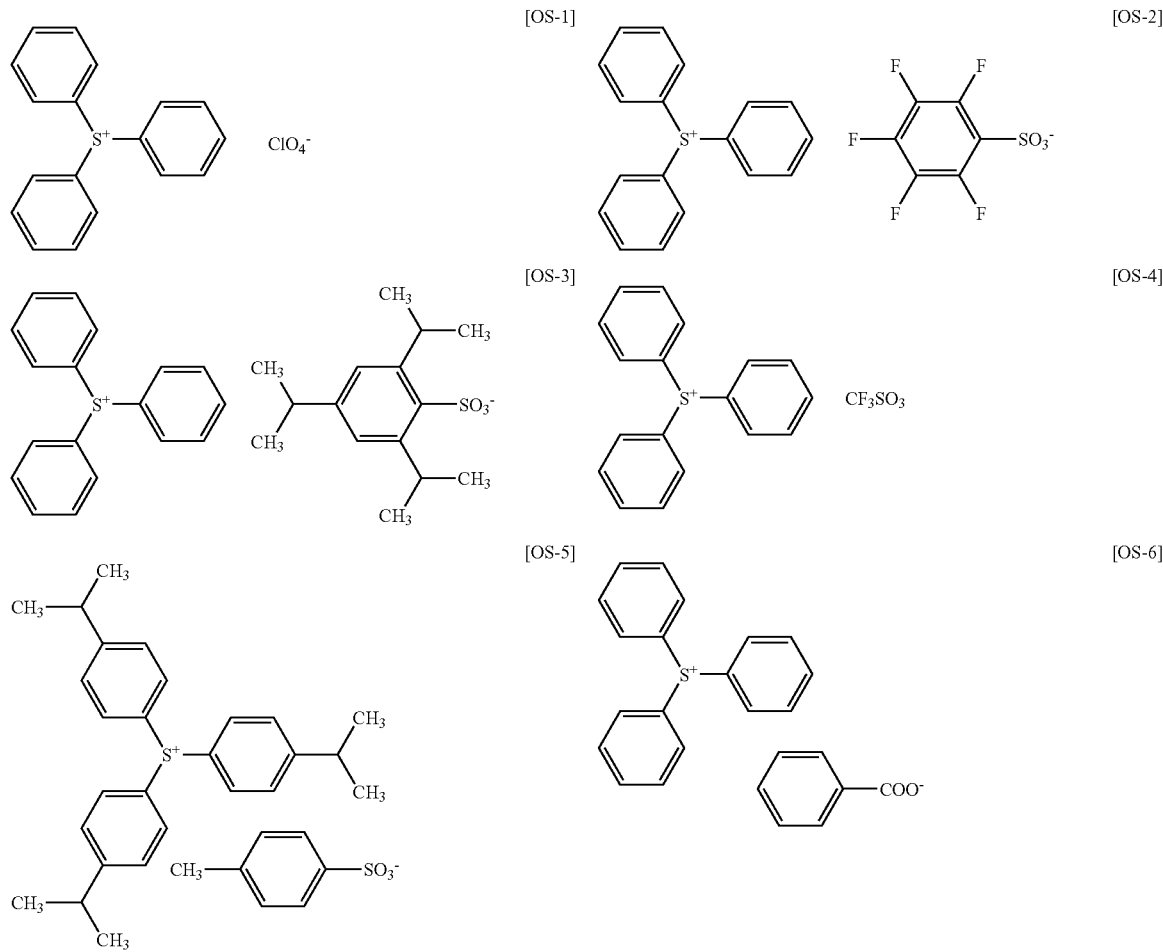

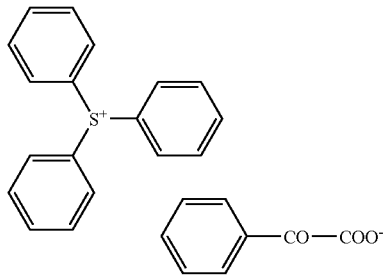

It is preferable that the onium salt to be used in the invention has a maximum absorption wavelength of 400 nm or less, still preferably 360 nm or less. By thus controlling the maximum absorption wavelength within the ultraviolet region, the lithographic printing plate precursor can be handled under white light.

As other preferable polymerization initiators, citation may be made of specific aromatic sulfonium salts described in Japanese Patent Application 2000-266797, Japanese Patent Application 2001-177150, Japanese Patent Application 2000-160323 and Japanese Patent Application 2000-184603. Next, typical examples thereof will be given.

In addition, typical examples usable as other preferable polymerization initiators in the invention will be presented too.

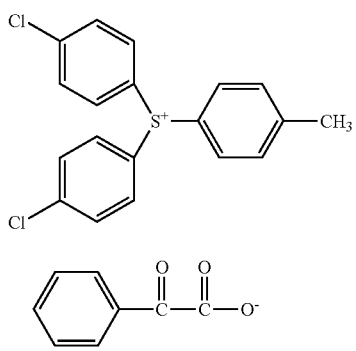

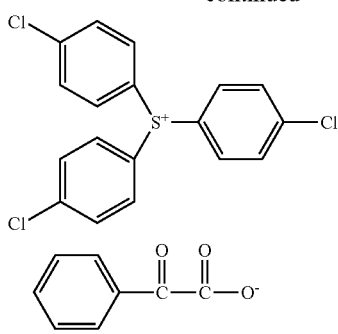

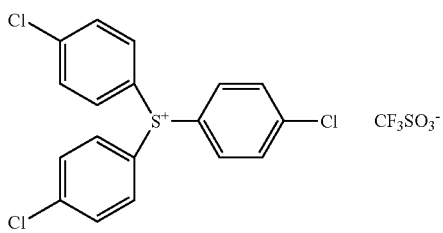

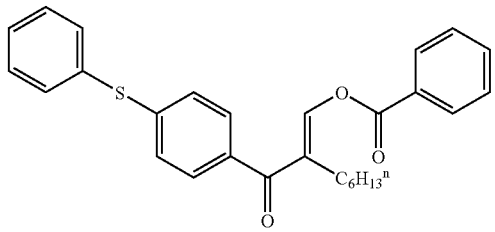

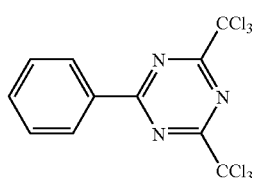

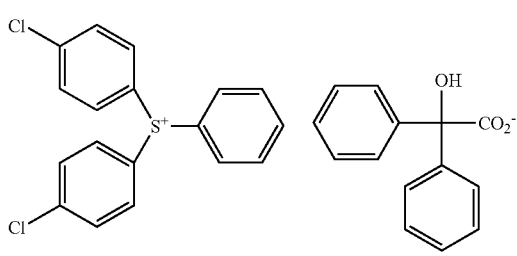

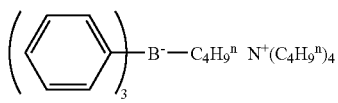

[OS-7]

Next, oxime ester compounds preferably usable as polymerization initiators in the invention will be illustrated. The oxime ester compounds represented by the following formula (D) are preferable.

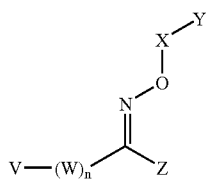

In the formula (D), X represents a carbonyl group, a sulfone group or a sulfoxide group. Y represents a cyclic or chain type alkyl group having from 1 to 12 carbon atoms, an alkenyl group, an alkynyl group, an aryl group having from 6 to 18 carbon atoms or a heterocyclic group. The term "aryl group" means an aromatic hydrocarbon compound such as a benzene ring, a naphthalene ring, an anthracene ring, a phenanthrene ring, a pyrene ring or a triphenylene ring. The term "heterocyclic group" means an aromatic compound having at least one of nitrogen, sulfur and oxygen atoms in its cyclic structure and examples thereof include a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acridine group, phenoxazine and phenothiazine. The substituent represented by Y can be substituted by a halogen atom, a hydroxyl group, a nitrile group, a nitro group, a carboxyl group, an aldehyde group, an alkyl group, a thiol group or an aryl group or a compound containing an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, a urethane group, an alkyl group, a thiol group, an aryl group, a phosphoroso group, a phospho group or a carbonyl ether group.

In the formula (D), Z has the same meaning as Y or represents a nitrile group, a halogen atom, a hydrogen atom or an amino group. The compound represented by Z can be substituted by a halogen atom, a hydroxyl group, a nitrile group, a nitro group, a carboxyl group, an aldehyde group, an alkyl group, a thiol group or an aryl group or a compound containing an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, a urethane group, an alkyl group, a thiol group, an aryl group, a phosphoroso group, a phospho group or a carbonyl ether group.

In the formula (D), W represents a divalent organic group such as a methylene group, a carbonyl group, a sulfoxide group, a sulfone group or an imino group. A methylene group and an imino group can be substituted by a compound having an alkyl group, an aryl group, an ester group, a nitrile group, a carbonyl ether group, a sulfo group, a sulfo ether group, an ether group and so on. n is an integer of 0 or 1.

In the formula (D), V represents a cyclic or chain type alkyl group having from 1 to 12 carbon atoms, an alkenyl group, an alkynyl group, an aryl group having from 6 to 18 carbon atoms, an alkoxy group or an aryloxy group. The term "aryl group" means an aromatic hydrocarbon compound such as a benzene ring, a naphthalene ring, an anthracene ring, a phenanthrene ring, a pyrene ring or a triphenylene ring, a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acridine group, or a hetero atom-containing aromatic compound such as phenoxazine or phenothiazine. The compound represented by V can be substituted by a halogen atom, a hydroxyl group, a nitrile group, a nitro group, a carboxyl group, an aldehyde group, an alkyl group, a thiol group or an aryl group or a compound containing an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, a urethane group, an alkyl group, a thiol group, an aryl group, a phosphoroso group, a phospho group or a carbonyl ether group.

Alternatively, V and Z may be bonded to each other to form a ring.

From the viewpoint of sensitivity, it is preferable that, in the oxime ester compound represented by the above formula (D), Y is an aryl group or a benzoyl group, Z is an alkyl group or an aryl group, W is a carbonyl group and V is an aryl group. It is still preferable that the aryl group represented by V has a thioether substituent.

In the above formula (D), the N—O bond may be either in the E-form or the Z-form.

Other oxime compounds appropriately usable in the invention are compounds described in Progress in Organic Coatings, 13 (1985) 123-150; J. C. S. Perkin II (1979) 165-1660; Journal of Photopolymer Science and Technology (1995) 205-232; J. C. S. Perkin II (1979) 156-162; JP-A-2000-66385; and JP-A-2000-80068.

Next, specific examples of the oxime ester compounds appropriately usable in the invention will be given, though the invention is not restricted thereto.

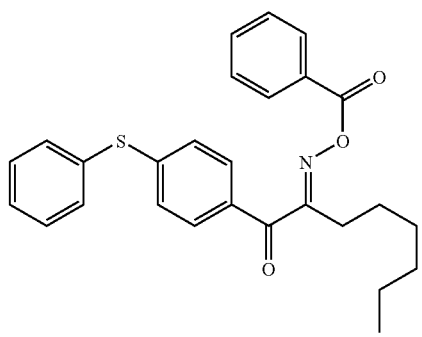

-continued
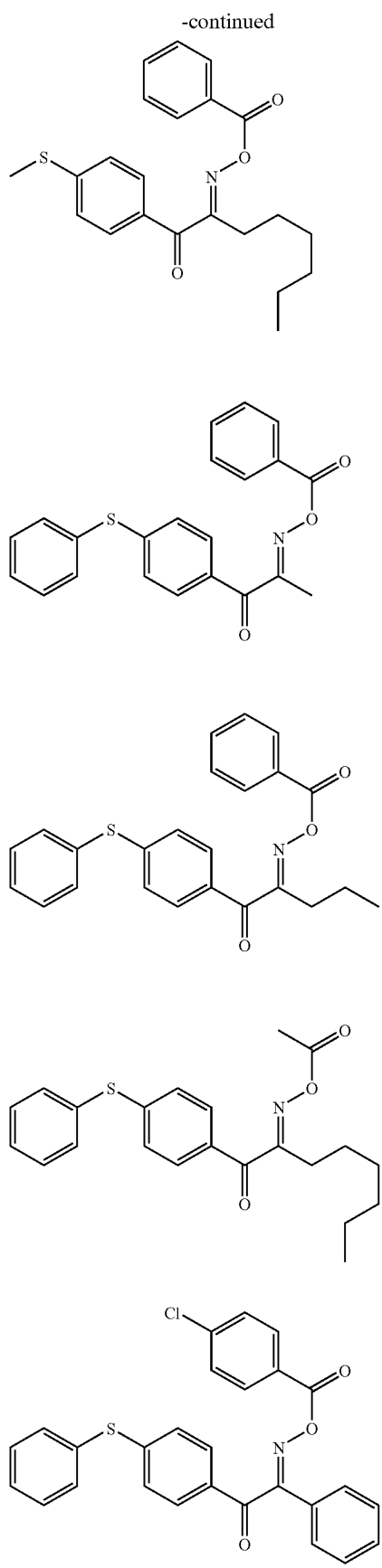
-continued
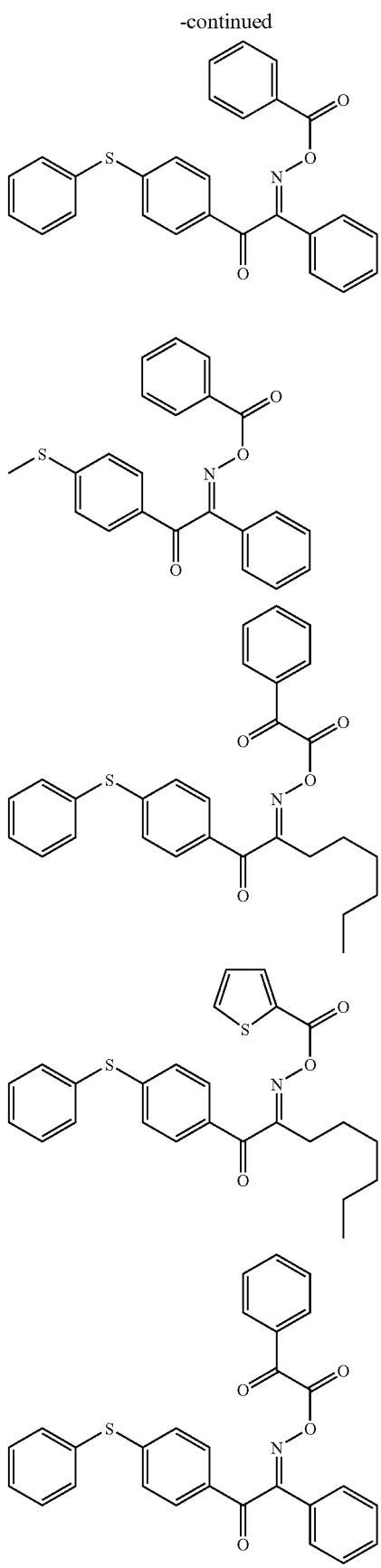

-continued
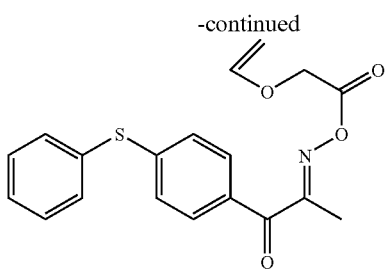
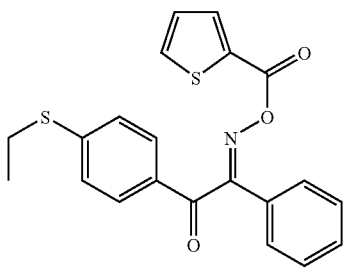
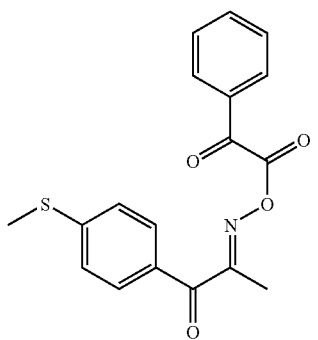
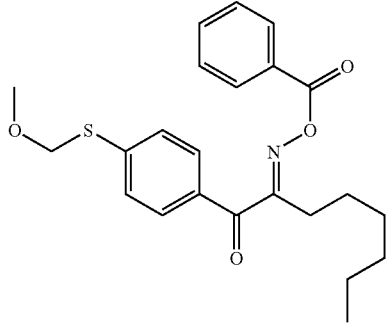
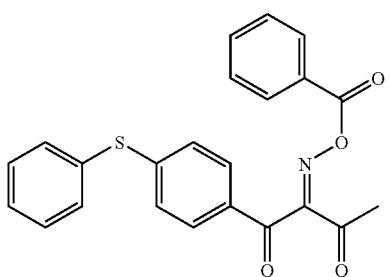
-continued
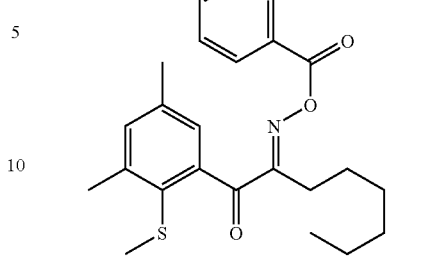
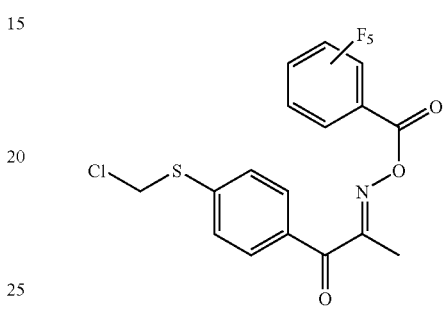
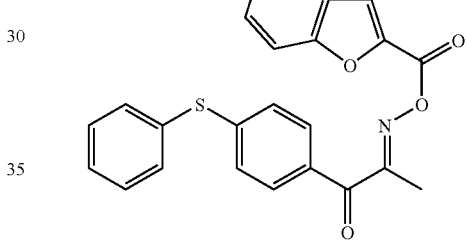
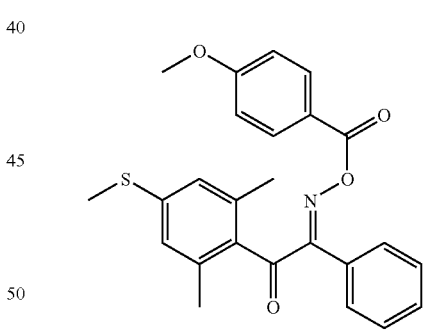
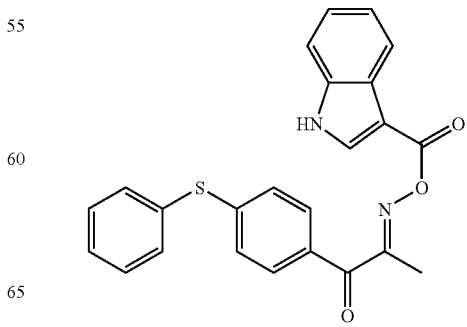

-continued
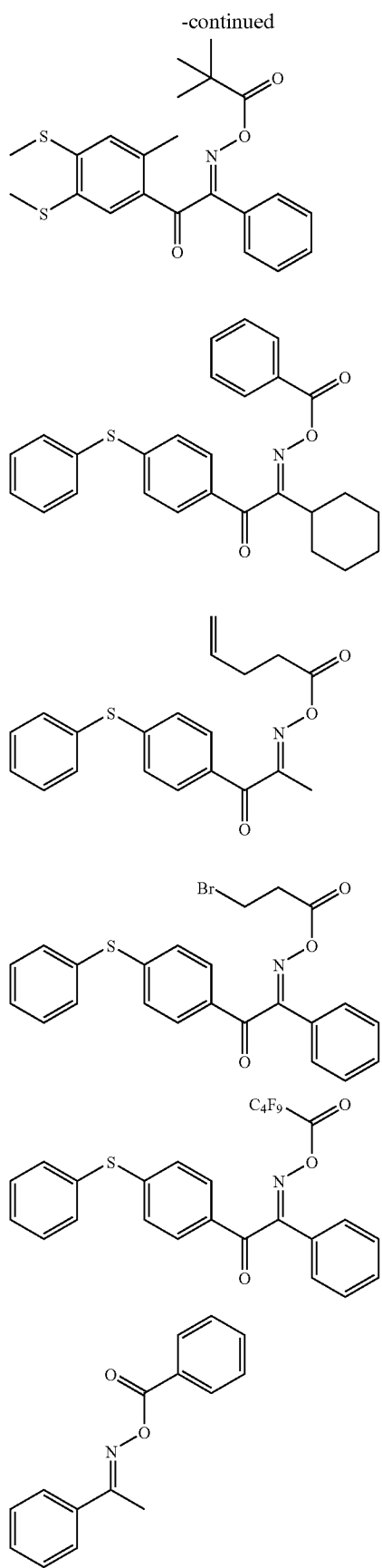
-continued
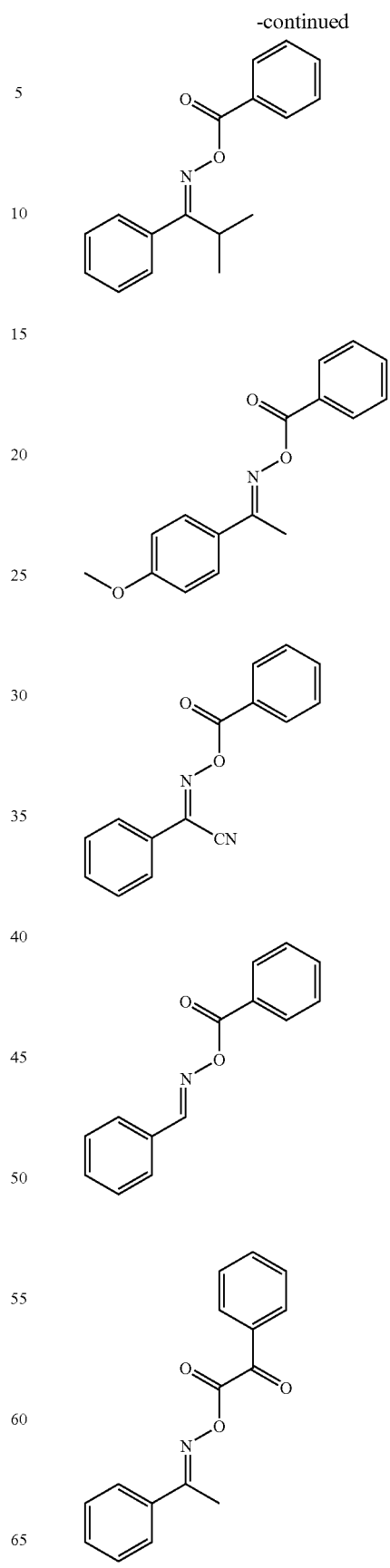

-continued
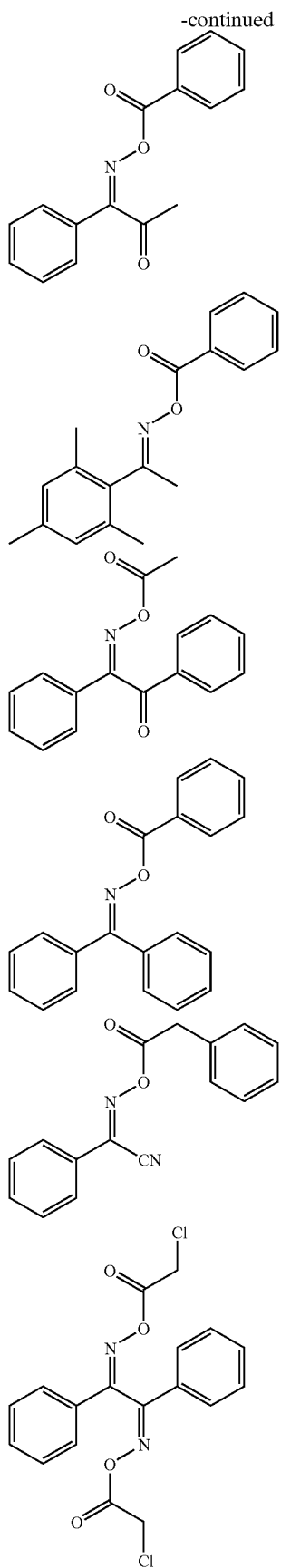
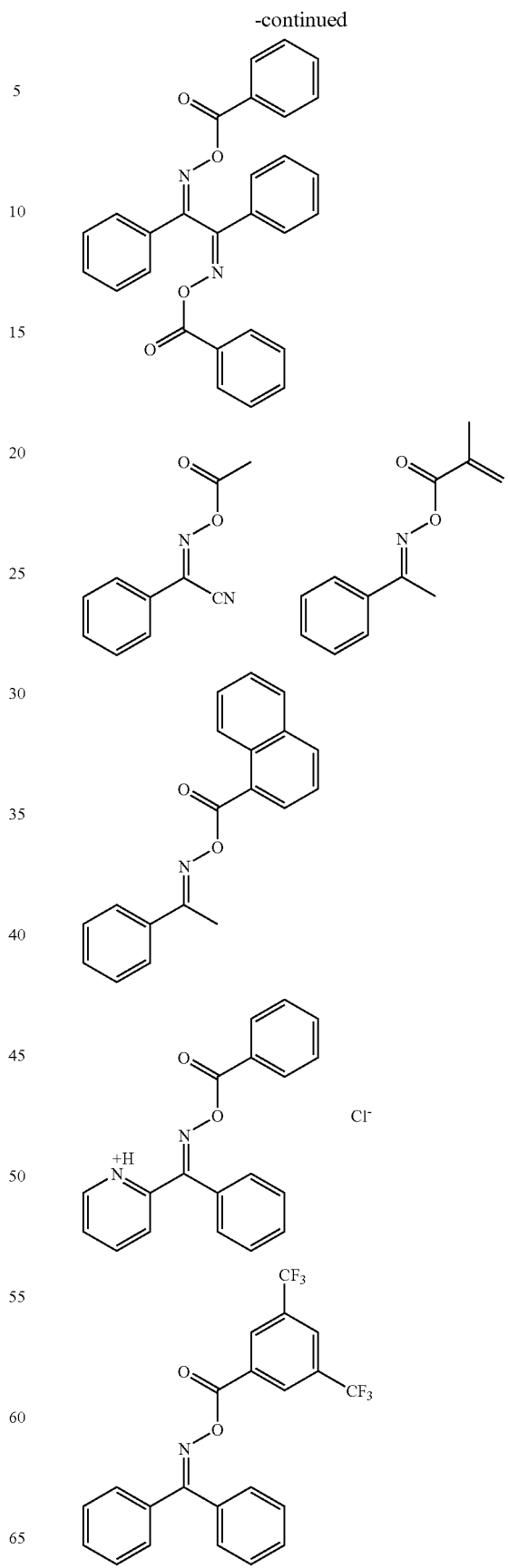

-continued
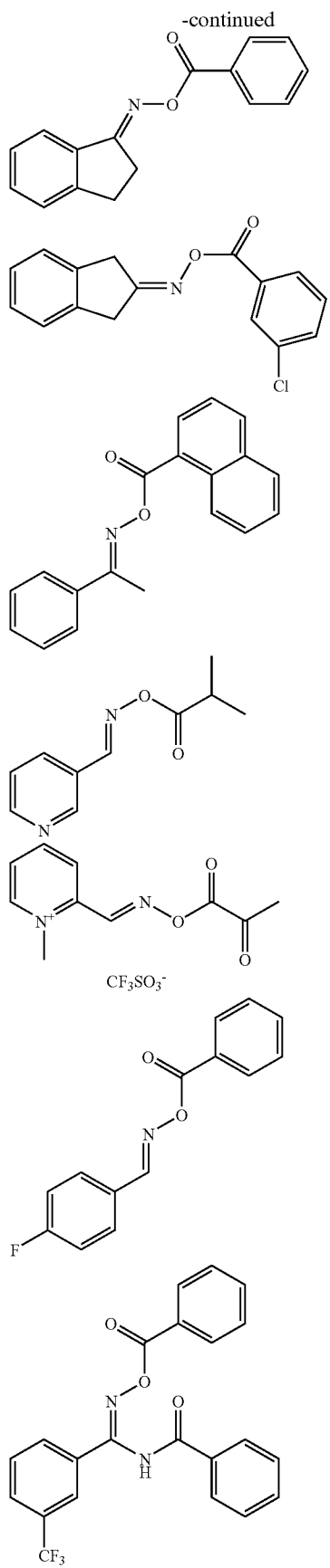
-continued
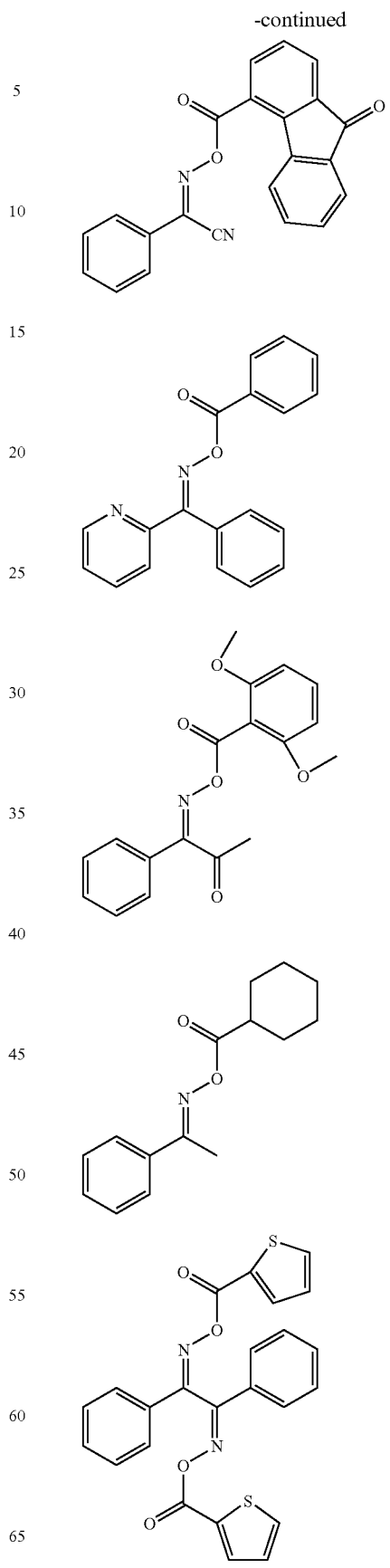

-continued
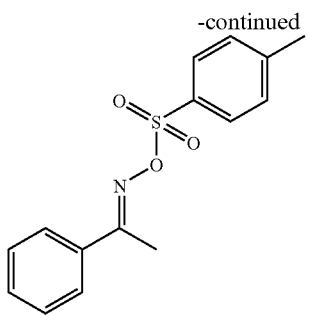
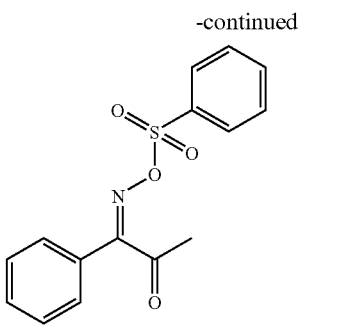

-continued
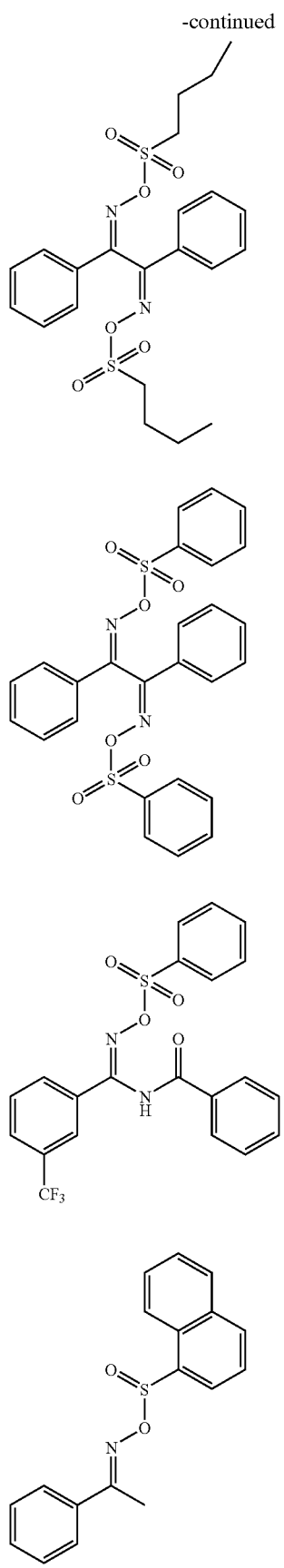
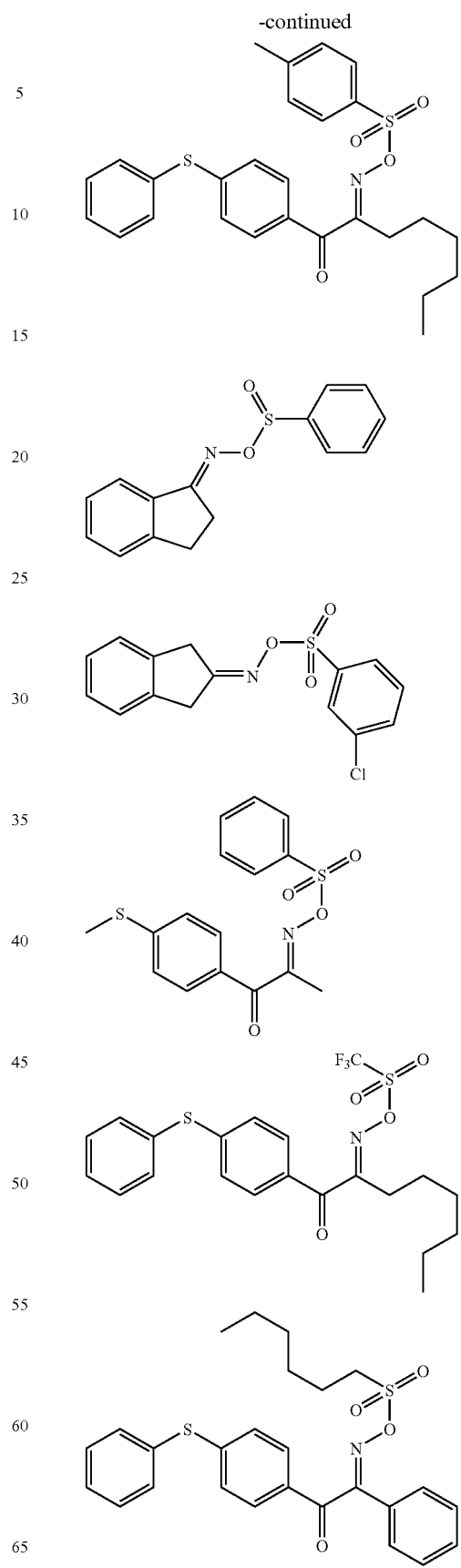

-continued
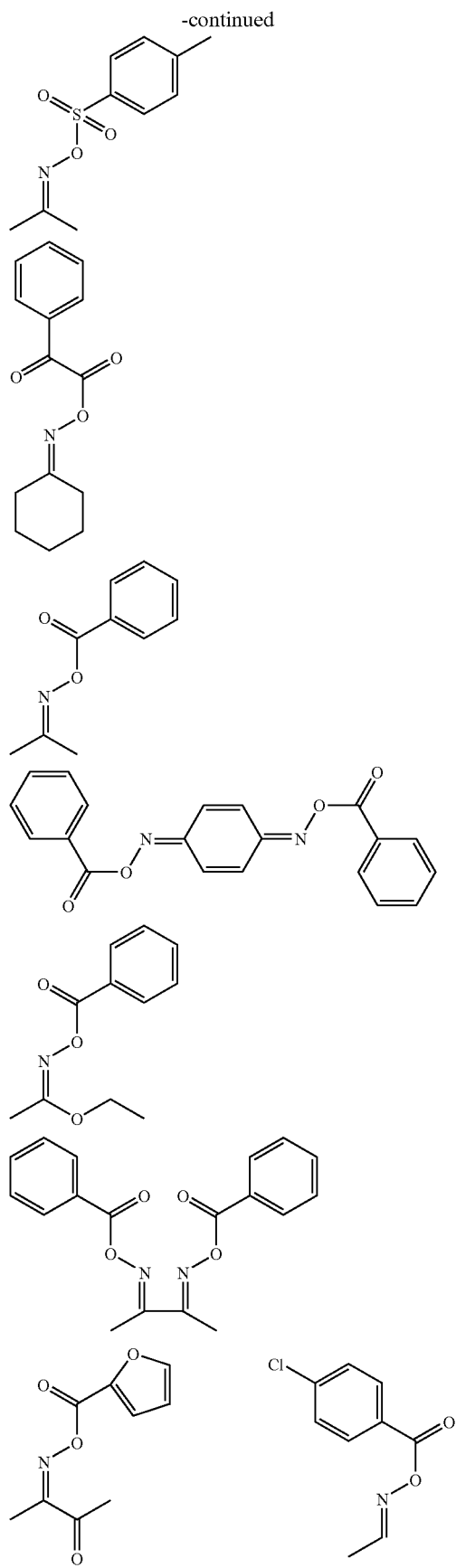
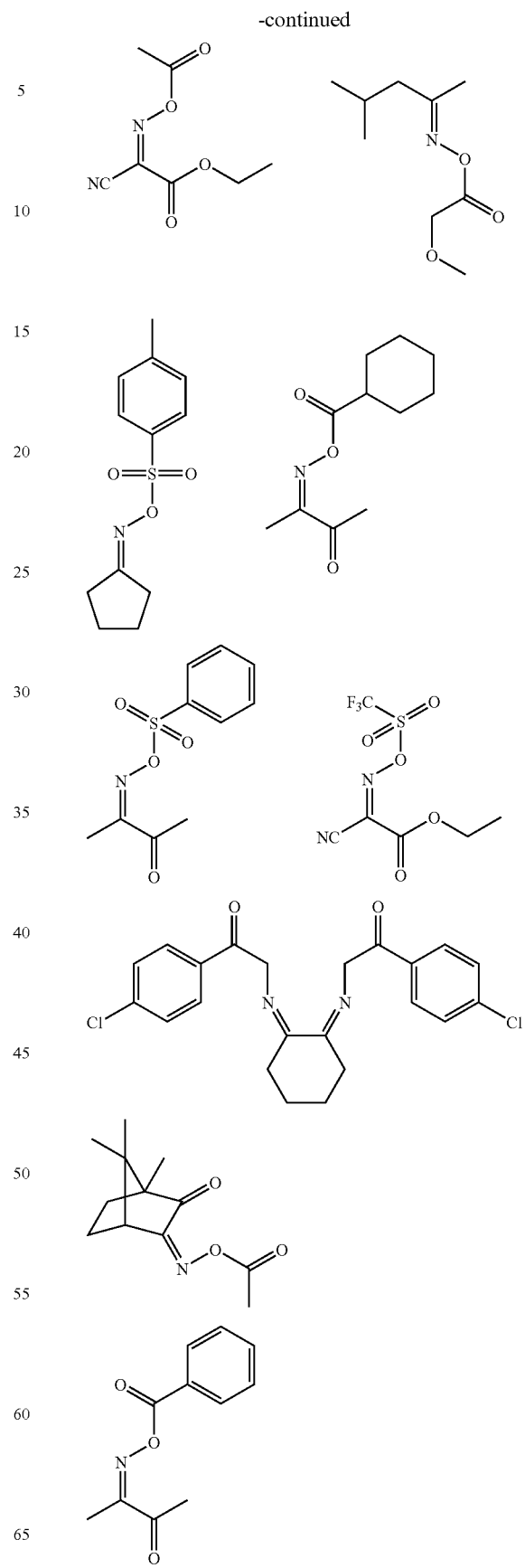

-continued

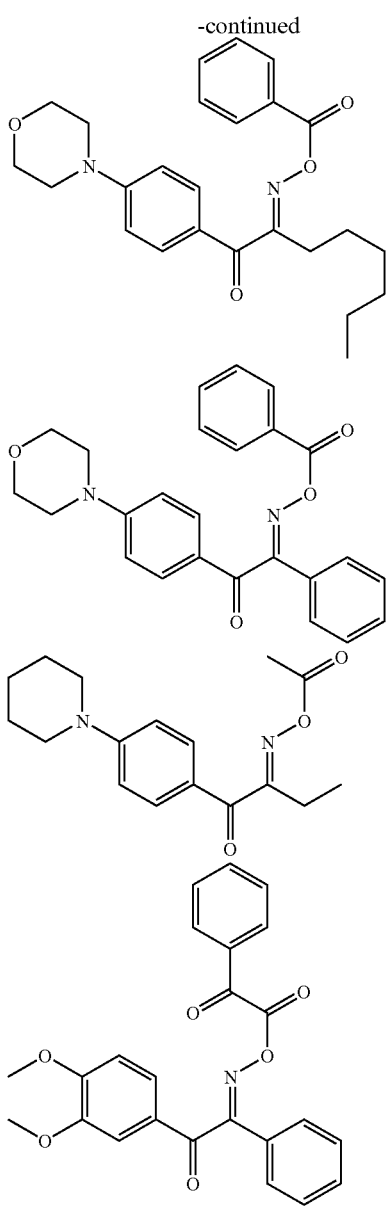

From the viewpoints of sensitivity and staining in a non-image part occurring at printing, such a polymerization initiator can be added in an amount of preferably from 0.1 to 50% by mass, more preferably from 0.5 to 30% by mass and still more preferably from 1 to 20% by mass, based on the total solid content in the photosensitive layer (such a polymerization initiator can be added in an amount of preferably from 0.1 to 50% by mass, more preferably from 0.5 to 30% by mass and still more preferably from 1 to 20% by mass, based on the nonvolatile components in the polymerizable composition). Either one of these polymerization initiators or a combination of two or more thereof may be used. The polymerization initiator may be added together with other components to a single layer. Alternatively, it is also possible to separately form a layer to which the polymerization initiator is added.

(Sensitizing Colorant)

The polymerizable composition according to the invention can contain a sensitizing colorant. A sensitizing colorant having an absorption peak at 350 to 850 nm is preferred, and a sensitizing colorant having an absorption peak at 350 to 700 nm is more preferred. Examples of such a sensitizing colorant include spectral sensitizing colorant and dyes and pigments capable of absorbing rays from a light source and interacting with a photopolymerization initiator.

Preferable examples of the spectral sensitization colorant or dye include polynuclear aromatic compounds (for example, pyrene, perylene and triphenylene), xanthenes (for example, fluorescein, eosin, erythrosine, Rhodamine B and rose bengal), cyanines (for example, thiacarbocyanine and oxacarbocyanine), merocyanines (for example, merocyanine and carbomerocyanine), thiazines (for example, thionine, methylene blue and toluidine blue), acridines (for example, acridine orange, chloroflavin and acriflavin), phthalocyanines (for example, phthalocyanine and metal phthalocyanine), porphyrines (for example, tetraphenyl porphyrine and central metal-substituted porphyrine), chlorophyls (for example, chlorophyl, chlorophyline, central metal-substituted chlorophyl), metal complexes, anthraquinones (for example, anthraquinone) and squariums (for example, squarium).

Still preferable examples of the spectral sensitization colorant or dye include styryl colorants described in JP-B-37-13034, cationic dyes described in JP-A-62-143044 quinoxalinium salts described in JP-B-59-24147, new methylene blue compounds described in JP-A-64-33104, anthraquinones described in JP-A-64-56767,benzoxanthene dyes described in JP-A-2-1714, acridines described in JP-A-2-226148 and JP-A-2-226149, pyrilium salts described in JP-B-40-28499, cyanines described in JP-B-46-42363, benzofuran colorants described in JP-A-2-63053, conjugated ketone colorants described in JP-A-2-85858 and JP-A-2-216154, colorants described in JP-A-57-10605, azocinnamylidene derivatives described in JP-B-2-30321, cyanine colons described in JP-A-1-287105, xanthene colorants described in JP-A-62-31844, JP-A-62-31848 and JP-A-62-143043, aminostyryl ketones described in JP-B-59-28325, merocyanine colorants described in JP-B-61-9621, colorants described in JP-A-2-179643, merocyanine colorants described in JP-A-2-244050, merocyanine colorants described in JP-B-59-28326, merocyanine colorants described in JP-A-59-89303, merocyanine colorants described in JP-8-129257, benzopyran colorants described in JP-A-8-334897 and so on.

(Infrared Absorbing Agent)

In the case where exposure is carried out with the use of lasers emitting infrared rays at 760 to 1,200 nm as alight source in the invention, an infrared absorbing agent is usually employed. The infrared absorbing agent has a function of absorbing infrared rays and then converting them into heat. Owing to the heat thus generated, a radical generator (a polymerization initiator) thermally decomposes and generates radicals. The infrared absorbing agent to be used in the invention is a dye or a pigment having an absorption peak at a wavelength of from 760 to 1,200 nm.

As the dye, use can be made of commercially available dyes and publicly known ones described in documents, for example, *Senryo Binran* (ed. by The Society of Synthetic Organic Chemistry, Japan, 1970), etc. Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrilium salts, metal thiolate complexes and so on.

Examples of preferable dyes include cyanine dyes described in JP-A-58-125246, JP-A-59-84356, JP-A-59-202829, JP-A-60-78787, etc., methine dyes described in JP-A-58-173696, JP-A-58-181690, JP-A-58-194595, etc., naphthoquinone dyes described in JP-A-58-112793, JP-A-58-224793, JP-A-59-48187, JP-A-59-73996, JP-A-60-52940, JP-A-60-63744, etc., squarylium colorants described in JP-A-58-112792, etc., cyanine dyes described in British Patent 434,875, and so on.

Further, it is appropriate to use a near infrared absorbing sensitizer described in U.S. Pat. No. 5,156,938. Furthermore, use can be preferably made of substituted arylbenzo(thio)pyrilium salts described in U.S. Pat. No. 3,881,924, trimethine thiapyrilium salts described in JP-A-57-142645 (U.S. Pat. No. 4,327,169), pyrilium compounds described in JP-A-58-181051, JP-A-58-220143, JP-A-59-41363, JP-A-59-84248, JP-A-59-84249, JP-A-59-146063 and JP-A-59-146061, cyanine colorants described in JP-A-59-216146, pentamethine thiapyrilium salts described in U.S. Pat. No. 4,283,475 and pyrilium compounds described in JP-B-5-13514 and JP-B-5-19702. As preferable examples of the dye, it is also possible to cite near infrared absorbing dyes represented by formulae (I) and (II) in U.S. Pat. No. 4,756,993.

As other preferable examples of the infrared absorbing colorant usable in the invention, specific indolenine cyanine colorants described in Japanese Patent Application 2001-6325 and Japanese Patent Application 2001-237840 may be cited.

Among these dyes, particularly preferable examples include cyanine colorants, squarylium dyes, pyrilium dyes, thiopyrilium dyes, nickel thiolate complexes and indolenine cyanine colorants, and cyanine colorants indolenine cyanine colorants are still preferable. Cyanine colorants represented by the following formula (a) to the formula (e) can be cited as particularly preferable examples.

Formula (a)

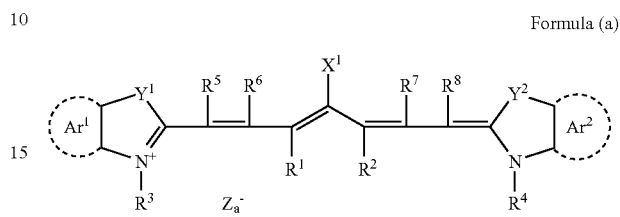

In the formula (a), $X^1$ represents a hydrogen atom, a halogen atom, $-NPh_2$, $X^2-L^1$ or a group as will be described hereinafter. $X^2$ represents an oxygen atom, a nitrogen atom or a sulfur atom, while $L^1$ represents a hydrocarbon group having 1 to 12 carbon atoms, an aromatic ring having a hetero atom or a hydrocarbon group containing a hetero atom and having 1 to 12 carbon atoms. The term hetero atom as used herein means, N, S, O, a halogen atom or Se. $Xa^-$ has the same meaning as $Za^-$ as will be defined hereinafter, and Ra represents a substituent selected from among a hydrogen atom, alkyl groups, aryl groups, a substituted or unsubstituted amino group and halogen atoms.

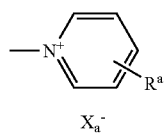

$R^1$ and $R^2$ independently represent each a hydrocarbon group having 1 to 12 carbon atoms. Taking the storage stability of the coating solution for photosensitive layer into consideration, it is preferable that $R^1$ and $R^2$ are each a hydrocarbon group having 2 or more carbon atoms. It is still preferable that $R^1$ and $R^2$ are bonded to each other to form a 5-membered ring or a 6-membered ring.

$Ar^1$ and $Ar^2$ may be either the same or different and each represents an optionally substituted aromatic hydrocarbon group. Preferable examples of the aromatic hydrocarbon group include a benzene ring and a naphthalene ring. Preferable examples of the substituent include hydrocarbon groups having 12 or less carbon atoms, halogen atoms and alkoxy groups having 12 or less carbon atoms. $Y^1$ and $Y^2$ may be either the same or different and each represents a sulfur atom or a dialkylmethylene group having 12 or less carbon atoms.

$R^3$ and $R^4$ may be either the same or different and each represents an optionally substituted hydrocarbon group having 20 or less carbon atoms. Preferable examples of the substituent include alkoxy groups having 12 or less carbon atoms, a carboxyl group and a sulfo group. $R^5$, $R^6$, $R^7$ and $R^8$ may be either the same or different and each represents a hydrogen atom or a hydrocarbon group having 12 or less carbon atoms. From the viewpoint of the availability of starting materials, a hydrogen atom is favorable. $Za^-$ represents a counter anion. However, $Za^-$ is unnecessary in the case of a cyanine colorant represented by the formula (a) which has an anionic substituent in its structure and thus requires no neutralization of the charge. From the viewpoint of the storage stability of a coating solution for the photosensitive layer, preferable examples of $Za^-$ include a halogen ion, a perchlorate ion, a tetrafluoroborate ion, a hexafluorophosphate ion and a sulfonate ion. In particular, a perchlorate ion, a hexafluorophosphate ion and an arylsulfonate ion are preferable therefor.

Specific examples of the cyanine colorants represented by the formula (a) which are appropriately usable in the invention include those as will be cited hereinafter as well as those described in paragraphs [0017] to [0019] in Japanese Patent Application 11-310623, paragraphs [0012] to [0038] in Japanese Patent Application 2000-244031, and paragraphs [0012] to [0023] in Japanese Patent Application 2000-211147.

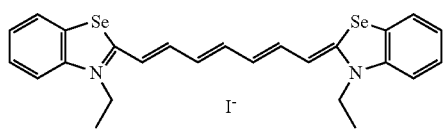

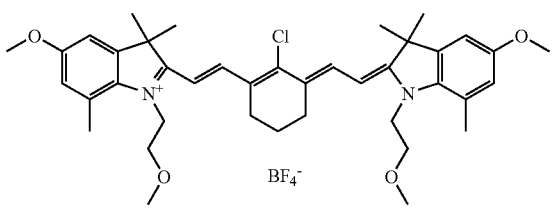

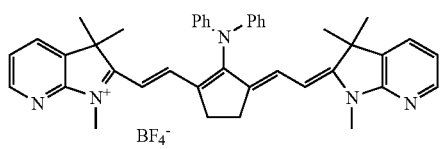

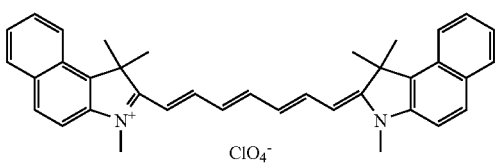

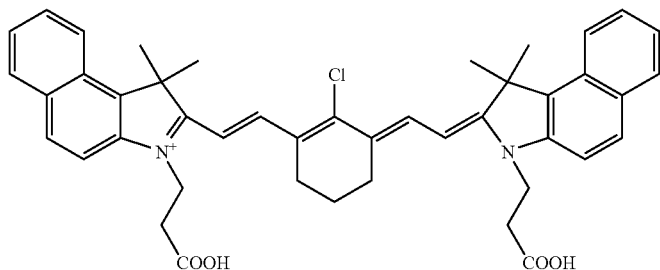

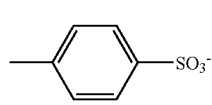

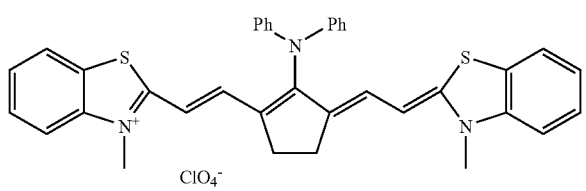

-continued
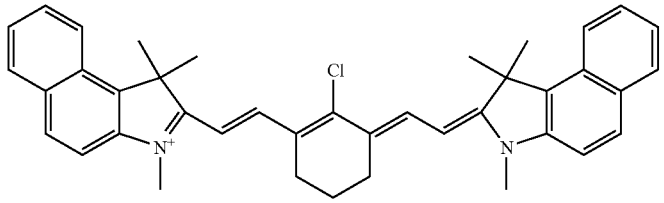
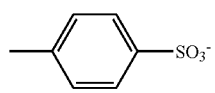
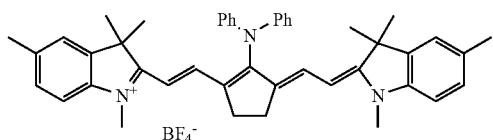
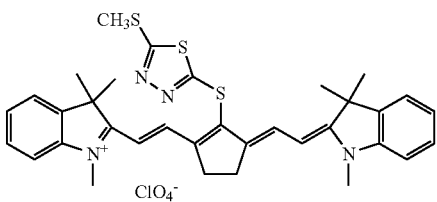
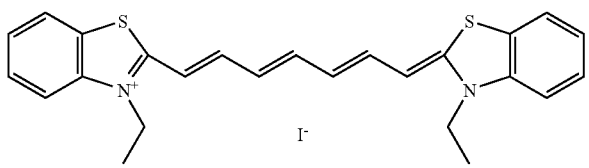
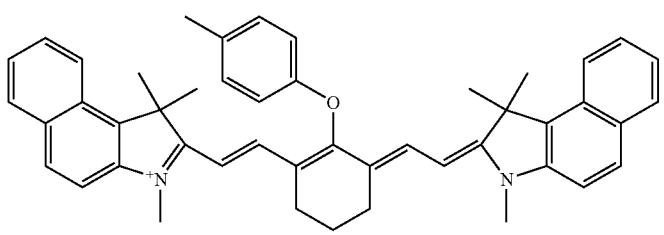
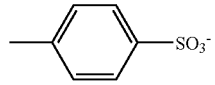
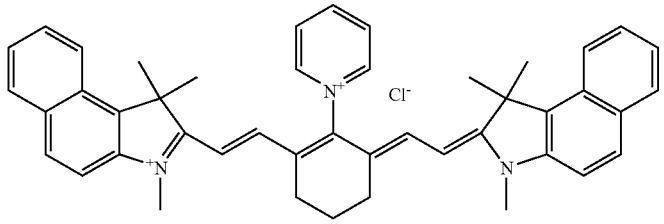
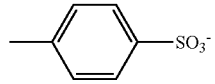
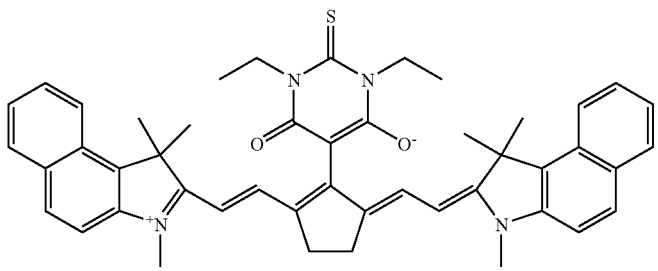
Formula (b)
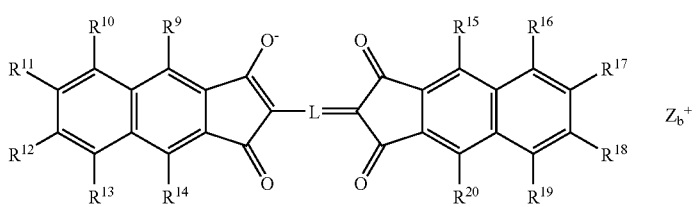

In the formula (b), L represents a methane chain having 7 or more conjugated carbon atoms. This methine chain may have substituents which may be bonded to each other to form a cyclic structure. $Zb^+$ represents a counter cation. Preferable examples of the counter cation include ammonium, iodonium, sulfonium, pyridinium, alkali metal cations ($Na^+$, $K^+$, $Li^+$) and the like. $R^9$ to $R^{14}$ and $R^{15}$ to $R^{20}$ independently represent each a hydrogen atom or a halogen atom, a substituent selected from among a cyano group, alkyl groups, aryl groups, alkenyl groups, alkynyl groups, a carbonyl group, a thio group, a sulfonyl group, a sulfinyl group, an oxy group and an amino group, or a combination of two or three of these substituents which may be bonded to each other to form a cyclic structure. From the viewpoints of availability and effects, a compound represented by the above formula (b) wherein L represents a methine chain having 7 conjugated carbon atoms and $R^9$ to $R^{14}$ and $R^{15}$ to $R^{20}$ all represent hydrogen atoms is preferable.

Specific examples of the dyes represented by the formula (b) which are appropriately usable in the invention include the following ones.

the definition of which is the same as the definition of $Za^-$ in the formula (a) as described above.

Specific examples of the dyes represented by the formula (c), which are appropriately usable in the invention, are the following ones.

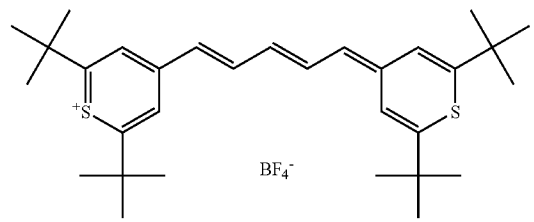

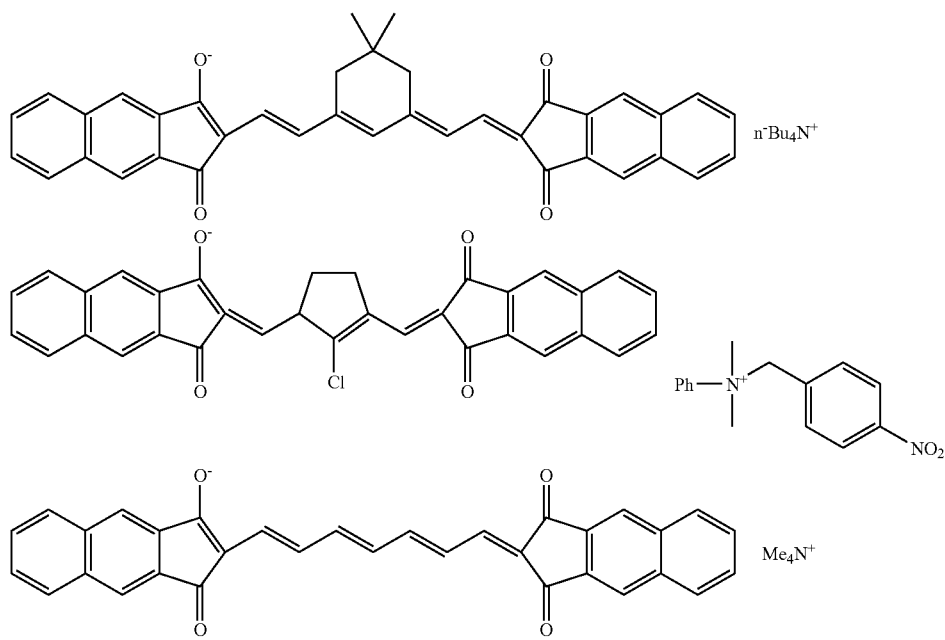

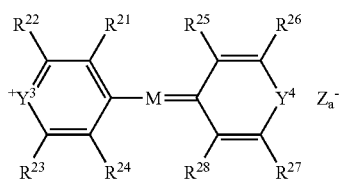

Formula (c)

In the formula (c), $Y^3$ and $Y^4$ represent each an oxygen atom, a sulfur atom, a selenium atom or a tellurium atom. M represents a mechine chain having 5 or more conjugated carbon atoms. $R^{21}$ to $R^{24}$ and $R^{25}$ to $R^{28}$ may be either the same or different and each represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group. In this formula, $Za^{31}$ represents a counter anion -continued

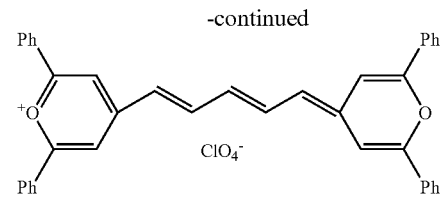

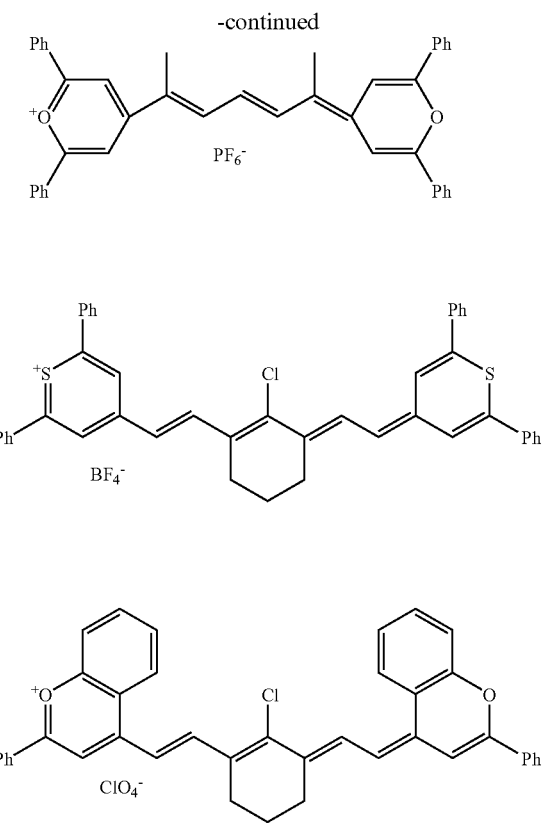

In the formula (d), $R^{29}$ to $R^{31}$ independently represent each a hydrogen atom, an alkyl group or an aryl group. $R^{33}$ and $R^{34}$ independently represent each an alkyl group, a substituted oxy group or a halogen atom. n and m independently represent each an integer of from 0 to 4. $R^{29}$ and $R^{30}$ or $R^{31}$ and $R^{32}$ may be bonded to each other to form a ring. Alternatively, $R^{29}$ and/or $R^{30}$ may be bonded to $R^{33}$, while $R^{31}$ and/or $R^{32}$ may be bonded to $R^{34}$ to form a ring. In the case where there are a plural number of $R^{33}$'s or $R^{34}$'s, $R^{33}$'s or $R^{34}$'s may be bonded to each other to form a ring. $X^2$ and $X^3$ independently represent each a hydrogen atom, an alkyl group or an aryl group, provided that at least one of $X^2$ and $X^3$ represents a hydrogen atom or an alkyl group. Q represents an optionally substituted trimethine group or a pentamethine group which may form a cyclic structure together with a divalent organic group. $Zc^-$ represents a counter anion the definition of which is the same as the definition of $Za^-$ in the formula (a) as described above.

Specific examples of the dyes represented by the formula (d), which are appropriately usable in the invention, are as follows.

In the formula (e), $R^{35}$ to $R^{50}$ independently represent each a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group or an onium salt structure and each of these groups may have a substituent if possible. M represents two hydrogen atoms or metal atoms, a halometal group or an oxymetal group. Examples of the metal atom contained therein include atoms of the IA, IIA, IIIB and IVB groups in the periodic table, transition atoms in the first, second and third periods and lanthanoid elements. Among all, copper, magnesium, iron, zinc, cobalt, aluminum, titanium and vanadium are preferable therefor.

Specific examples of the dyes represented by the formula (e), which are appropriately usable in the invention, are as follows.

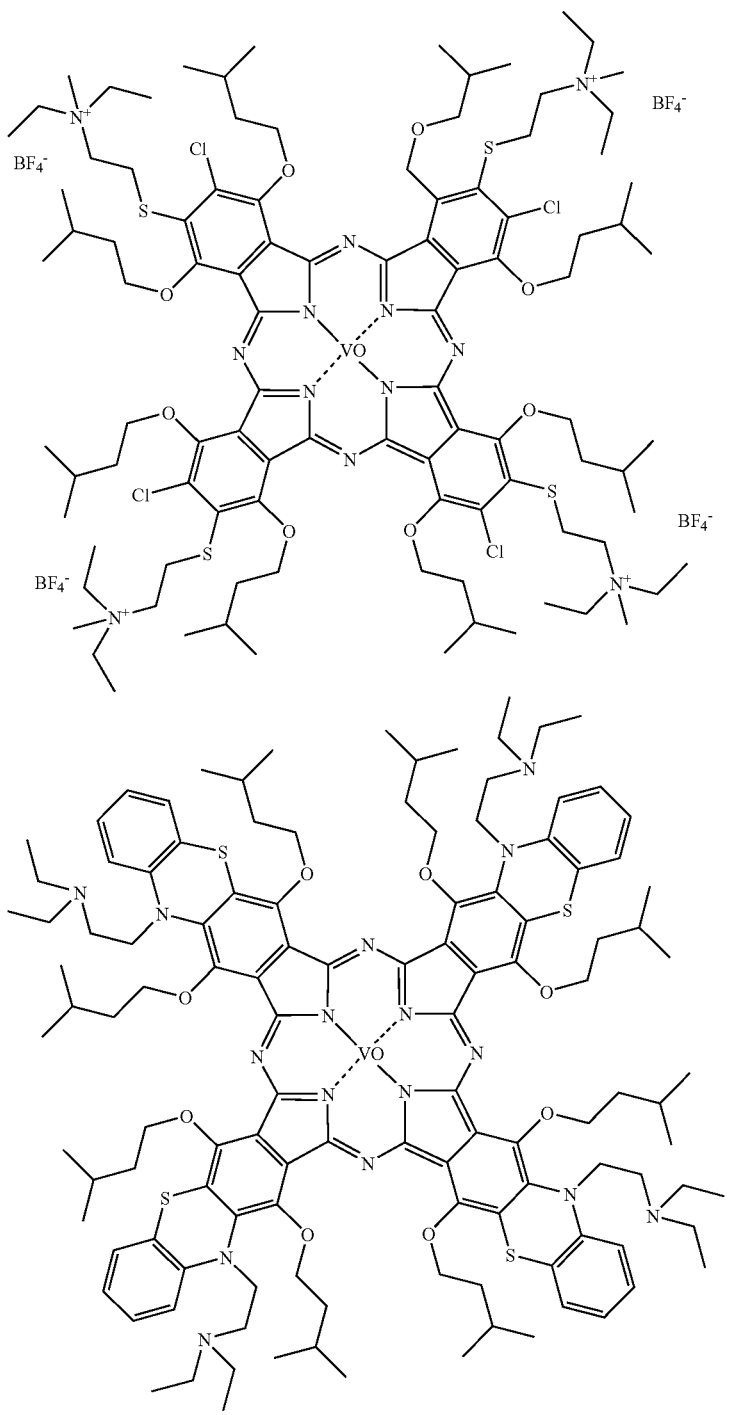

As examples of the pigment to be used in the invention, commercially available pigments and pigments described in *Color Index* (C.I.) *Binran, Saishin Ganryo Binran* (ed. by Nippon Ganryo Gijutsu Kyokai, 1977), *Saishin Ganryo Oyo Gijutsu* (CMC Shuppan, 1986) and *Insatsu Inki Gijutsu* (CMC Shuppan, 1984) may be cited.

Concerning the types of the pigments, use can be made of black pigments, yellow pigments, orange pigments, brown pigments, red pigments, purple pigments, blue pigments, green pigments, fluorescent pigments, metallic powder pigments, and polymer-binding pigments. More specifically speaking, use can be made of azo pigments, azo lake pigments, condensed azo pigments, chelate azo pigments, phthalocyanine-type pigments, anthraquinone-type pigments, perylene and perylene-type pigments, thioindigo-type pigments, quinacridone-type pigments, dioxazine-type pigments, isoindolinone-type pigments, quinophthalone-type pigments, underglaze lake pigments, azine pigments, nitroso pigments, nitro pigments, natural pigments, fluorescent pigments, inorganic pigments, carbon black and so on. Among these pigments, carbon black is preferred.

Such a pigment may be used without any surface treatment. Alternatively, it may be surface-treated before using. As the surface-treatment method, a method of coating the surface with a resin or a wax, a method of attaching a surfactant, a method of bonding a reactive substance (for example, a silane coupling agent, an epoxy compound, a polyisocyanate or the like) to the surface of the pigment, etc. may be suggested. These surface-treatment methods are reported by *Kinzoku Sekken no Seishitu to Oyo* (Saiwai Shobo), *Insatsu Inki Gijutsu* (CMC Shuppan, 1984) and *Saishin Ganryo Oyo Gijutsu* (CMC Shuppan, 1986).

The particle diameter of the pigment preferably ranges from 0.01 to 10 µm, still preferably from 0.05 to 1 µm and particularly preferably from 0.1 to 1 µm. It is undesirable, from the viewpoint of the stability of the dispersion in a coating solution of the image photosensitive layer, that the particle diameter of the pigment is less than 0.01 µm. On the other hand, it is undesirable from the viewpoint of the uniformity of the image photosensitive layer that the particle diameter thereof exceeds 10 µm.

To disperse the pigment, use can be made of a publicly known dispersion technique having been employed in producing inks, toners, etc. Examples of a dispersing machine include an ultrasonic disperser, a sand mill, an attritor, a pearl mill, a super mill, a ball mill, an impeller, a disperser, a KD mill, a colloid mill, a dynatron, a three-roll mill, a pressure kneader and so on. Details are described in *Saishin Ganryo Oyo Gijutsu* (CMC Shuppan, 1986).

Although the above-described infrared absorbing agent may be added to the photosensitive layer, it is also possible that a layer other than the photosensitive layer such as a overcoat layer or a undercoat layer is formed and the infrared absorbing agent is added thereto. In forming the negative type lithographic printing plate precursor, it is preferable that the photosensitive layer has an optical density ranging from 0.1 to 0.3 at the absorption maximum within the wavelength range of from 760 to 1200 nm. In the case where the optical density does not fall within this range, the sensitivity is liable to lower. Since the optical density is determined depending on the addition level of the above-described infrared absorbing agent and the thickness of the photosensitive layer, a definite optical density can be achieved by controlling these factors. The optical density of the photosensitive layer can be measured by a conventional method. Examples of the measurement method include a method wherein a photosensitive layer having such a thickness as being appropriately determined within a range so as to give a coating dose after drying required as a lithographic printing plate is formed on a transparent or white support and the optical density thereof is measured with a scanning optical densitometer, and a method wherein a photosensitive layer is formed on a reflective support made of aluminum etc. and the reflection density is measured.

In addition to the above-described components, the photopolymeriable or thermally polymerizable photosensitive layer of the negative type in the lithographic printing plate precursor according to the invention may further contain other components appropriate for the use, production process etc. Next, preferable additives will be illustrated.

(Cosensitizer)

The sensitivity of the polymerizable photosensitive layer can be further elevated by adding a cosensitizer thereto. Such compounds will be called cosensitizers hereinafter. Although the function mechanism thereof has not been clarified so far, it is considered that most of these cosensitizers would act based on the following chemical process. That is to say, it is assumed that a cosensitizer reacts with various intermediate active species (radicals, cations, oxidizers, reducing agents, etc.) which are formed in the course of the photoreaction initiated by a thermal polymerization initiator and the following addition polymerization to give new active radicals. These cosensitizers may be roughly classified into: (a) those forming active radicals after reduction; (b) those forming active radicals after oxidization; and (c) those reacting with less active radicals to thereby convert them into more active radicals or acting as chain transfer agents. However, no common belief can be found out in many cases concerning the attributions of individual compounds.

(a) Compound Forming Active Radical After Reduction

Compound having carbon-halogen bond: it is considered that the carbon-halogen bond is reductively cleaved to give an active radical. More specifically speaking, trihalomethyl-s-triazines, trihalomethyl oxadiazoles etc. are appropriately usable.

Compound having nitrogen-nitrogen bond: it is considered that the nitrogen-nitrogen bond is reductively cleaved to give an active radical. More specifically speaking, hexaaryl biimidazoles etc. are appropriately usable.

Compound having oxygen-oxygen bond: it is considered that the oxygen-oxygen bond is oxidatively cleaved to give an active radical. More specifically speaking, organic peroxides etc. are appropriately usable.

Onium compound: it is considered that a carbon-hetero bond or an oxygen-nitrogen bond is reductively cleaved to give an active radical. More specifically speaking, diaryliodonium salts, triarylsulfonium salts, N-alkoxypyridinium (adinium) salts etc. are appropriately usable. Ferrocene and iron-allene complex: an active radical can be reductively formed.

(b) Compound Forming Active Radical After Oxidization

Alkylate complex: it is considered that the carbon-hetero bond is oxidatively cleaved to give an active radical. More specifically speaking, triarylalkyl borates etc. are appropriately usable.

Alkylamine compound: it is considered that a C—X bond on carbon adjacent to nitrogen is cleaved due to oxidation to give an active radical. X preferably represents a hydrogen atom, a carboxyl group, a trimethylsilyl group, a benzyl group, etc. More specifically speaking, ethanolamine, N-phenylglycine, N-trimethylsilylmethylaniline etc. are appropriately usable.

Sulfur- or tin-containing compound: an active radical can be formed by the same mechanism as the one of the above-described amine but the nitrogen atom is substituted by a sulfur or tin atom. It is also known that a compound having an S—S bond has a sensitizing effect due to the S—S cleavage.

α-Substituted methylcarbonyl compound: an active radical can be formed by the cleavage of the carbonyl-α-carbon bond due to oxidation. Also, a compound wherein carbonyl is substituted by an oxime ether shows the same effect. More specifically speaking, 2-alkyl-1-[4-(alkylthio)phenyl]-2-morpholinopronones-1 and oxime ethers obtained by reacting them with hydroxyamines and etherifying N—OH can be cited.

Sulfinic acid salt: a radical can be reductively formed. More specifically speaking, sodium arylsulfinates can be cited.

(c) Compound reacting with less active radical to thereby convert it into more active radical or acting as chain transfer agent: use can be made of, for example, compounds having SH, PH, SiH or GeH. Such a compound donates hydrogen to a low active radical species to thereby form a radical. Alternatively, it is oxidized followed by the elimination of proton to thereby form a radical. More specifically speaking, 2-mercatptobenzimidazoles can be cited.

As more specific examples of these cosensitizers, a large number of compounds are described in, for example, JP-A-9-236913 as additives aiming at elevating sensitivity. Next, part of these compounds will be presented by way of example, though the invention is not restricted thereto.

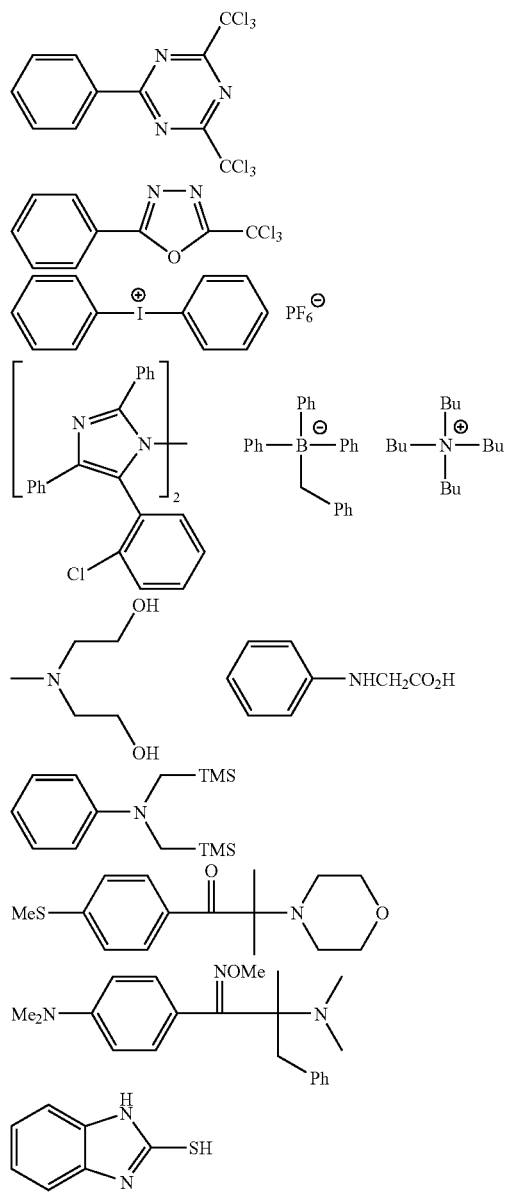

These cosensitizers may have various chemical modifications to improve the characteristics of the photosensitive layer. For example, use can be made of binding to a sensitizing colorant, titanocene, an addition-polymerizable unsaturated compound or another radical-generating part, introduction of a hydrophilic moiety, improvement in compatibility, introduction of a substituent for inhibiting crystallization, introduction of a substituent for improving adhesiveness, polymerization and so on.

Either one of these cosensitizers or a combination of two or more thereof can be employed. It is appropriate to use the cosensitizer in an amount of from 0.05 to 100 parts by mass, preferably from 1 to 80 parts by mass and still preferably from 3 to 50 parts by mass, per 100 parts by mass of the compound having ethylenically unsaturated bond.

(Polymerization Inhibitor)

It is preferable in the invention to add a small amount of a thermal polymerization inhibitor to inhibit the unnecessary thermal polymerization of the polymerizable compound during the production or storage of the negative type composition to be used in the phtopolymerizable or thermally polymerizable photosensitive layer of the negative type in the lithographic printing plate precursor according to the invention. Appropriate examples of the thermal polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), N-nitrosophenylhydroxyamine primary cerium salt, etc. It is preferable to add the thermal polymerization initiator in an amount of from about 0.01% by mass to about 5% by mass based on the total mass of the nonvolatile components. If necessary, a higher fatty acid derivative such as behenic acid or behenic acid amide, which is localized on the surface of the photosensitive layer in the course of the drying following the coating, may be added to prevent the enzymatic inhibition of the polymerization. It is preferable that the content of the higher fatty acid derivative ranges from about 0.5% by mass to about 10% by mass based on the nonvolatile components in the whole composition.

(Coloring Matter)

To color, the photosensitive layer of the lithographic printing plate precursor according to the invention may further contain a dye or a pigment. Thus, the so-called inspection properties as a printing plate such as the visibility after plate making and the suitability for an image density measurement machine can be improved. Since many dyes result in a decrease in the sensitivity of a thermal polymerization type photosensitive layer, it is particularly preferable to use a pigment as the coloring matter. Specific examples thereof include pigments such as phthalocyanine pigments, azo pigments, carbon black and titanium oxide and dyes such as ethyl violet, crystal violet, azo dyes, anthraquinone dyes and cyanine dyes. It is preferable that a dye and a pigment are added in an amount of from about 0.5% by mass to about 5% by mass based on the whole composition contained in the photosensitive layer.

(Other Additives)

The lithographic printing plate precursor according to the invention may further contain other publicly known additives, for example an inorganic filler for improving the physical properties of a hardened film, a plasticizer, a fat-sensitizer for improving the ink impression to the photosensitive layer surface, etc.

Examples of the above-described plasticizer include dioctyl phthalate, didodecyl phthalate, triethylene glycol dicaprylate, dimethylglycol phthalate, tricresyl phosphate, dioctyl adipate, dibutyl sebacate, triacetyl glycerol, etc. Such a plasticizer can be added in an amount of 10% by mass or less based on the sum of the masses of the compound having an ethylenically unsaturated double bond and a polymer binder.

It is also possible to add an UV initiator, a heat crosslinking agent, etc. in order to enhance the effects of the heating and exposure to thereby improve the film strength (press life) as will be described hereinafter.

The photosensitive layer can be produced by dissolving the photosensitive layer components in a solvent and coating the thus obtained solution on a support or an intermediate layer as will be discussed hereinafter.

Examples of the solvent to be used herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ehter, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methxyethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoetyl ether acetate, 3-methoxypropyl acetate, N,N-dimethylformamide, dimethyl sulfoxide, γ-butyrolactone, methyl, lactate, ethyl lactate and so on. Either one of these solvents or a mixture thereof may be used. The concentration of the solid matters in the coating solution appropriately ranges from 2 to 50% by mass.

It is desirable to appropriately select the coating dose of the photosensitive layer depending on the purposes, since the sensitivity of the photosensitive layer, the development characteristics, the strength and the press life of the exposure film, etc. are affected thereby. In the case where the coating dose is too small, the press life becomes insufficient. On the other hand, it is also undesirable that the coating dose is too large, since the sensitivity is lowered, a long time is needed for the exposure and, moreover, a prolonged time is needed for the development. In the case of a lithographic printing plate precursor for scanning exposure, i.e., the major object of the invention, it is generally appropriate that the coating dose ranges from about 0.1 to about 10 g/m$^2$, still preferably from 0.5 to 5 g/m$^2$, expressed in the mass after drying.

[Support]

As the support to be used in the lithographic printing plate precursor according to the invention, use can be made of any publicly known hydrophilic support employed in lithographic printing plate precursors without restriction.

It is preferable to use a support which is a sheet type material having a high dimensional stability. Examples thereof include papers, papers having plastics (for example, polyethylene, polypropylene, polystyrene, etc.) laminated thereon, metal sheets (for example, aluminum, zinc, copper, etc.), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), papers and plastic films having the above-described metals laminated or evaporated thereon, and so on. These supports may be appropriately surface-treated by publicly known physical or chemical treatments so as to impart hydrophilic nature or elevating the strength, if needed.

As particularly preferable supports, papers, polyester films and aluminum sheets may be cited. In particular, aluminum sheets are preferable because of being excellent in dimensional stability, relatively less expensive and capable of providing surface with excellent hydrophilic nature or strength by surface-treatment if needed. It is also preferable to employ a composite sheet comprising a polyethylene terephthalate film and an aluminum sheet bonded thereon as described in JP-B-48-18327.

An aluminum sheet is a dimensionally stable metal plate comprising aluminum as the main component which is selected from among pure aluminum sheets, alloy sheets comprising aluminum as the main component together with a different element in a trace amount and plastic films or papers having aluminum laminated or evaporated thereon. In the following description, supports made of aluminum or aluminum alloys are generally called aluminum supports. Examples of the different element contained in the aluminum alloys include silicon, iron, manganese, copper, magnesium, chromium, zinc, bismuth, nickel, titanium and so on. The content of such a different element in an alloy is 10% by weight at the largest. Although pure aluminum is appropriate as the aluminum support to be used in the invention, completely pure aluminum can be hardly produced from the viewpoint of refining techniques. Thus, use may be made of one containing a small amount of a different element. That is to say, the aluminum sheet to be applied in the invention is not restricted in its composition but aluminum sheets having been publicly known and used, for example, JISA 1050, JISA 1100, JISA 3013, JISA 3005, etc. can be appropriately employed.

The thickness of the aluminum sheet to be used in the invention ranges from about 0.1 to 0.6 mm. The thickness may be appropriately altered depending on printer size, printing plate size and user's demand. The aluminum support may be subjected to a surface treatment as will be described hereinafter, if necessary. Needless to say, no surface treatment is needed in some cases.

(Surface Roughening)

The treatment for roughening the aluminum sheet surface can be carried out by various methods, for example, a mechanical roughening method, chemical etching and electrolytic graining. Moreover, use can be made of an electrochemical surface roughening method whereby the surface is electrochemically roughened in a hydrochloric acid or nitric acid electrolyte solution, or a mechanical roughening method such as the wire brushing method whereby the aluminum surface is scratched with a metal wire, the ball graining method whereby the aluminum surface is sandblasted using a polishing ball and a polishing agent or the brush graining method whereby the surface is roughened with a nylon brush and a polishing agent. Either one of these surface roughening methods or a combination thereof may be used. Among all, the electrochemical method, wherein the surface is chemically roughened in a hydrochloric acid or nitric acid electrolyte solution, is most usefully employed in surface roughening. In this treatment, anodic electricity appropriately ranges from 50 C/dm$^2$ to 400 C/dm$^2$. More specifically speaking, it is preferable to carry out the electrolysis under an alternating current or a direct current in an electrolyte solution containing from 0.1 to 50% of hydrochloric acid or nitric acid at a temperature of from 20 to 80° C. for 1 second to 30 minutes at a current density of 100 C/dm$^2$ to 400 C/dm$^2$.

If desired, the thus surface-roughened aluminum sheet may be further subjected to chemical etching with an acid or an alkali. Examples of etching agents appropriately usable include caustic soda, soda carbonate, soda aluminate, soda metasilicate, soda phosphate, potassium hydroxide, lithium hydroxide, etc. The concentration thereof preferably ranges from 1 to 50%, while the treatment temperature preferably ranges from 20 to 100° C. After the completion of the etching, the surface is washed with an acid to remove stains (smuts)

remaining thereon. As the acid, use may be made of nitric acid, sulfuric acid, chromic acid, fluoric acid, fluoroboric acid, etc. As a desmatting method after the electrochemical surface-roughening, it is preferable to employ the method of contacting the surface with 15 to 65% by mass of sulfuric acid at 50 to 90° C. as described in JP-A-53-12739 or the alkali etching method as described in JP-B-48-28123. The method and conditions therefor are not particularly restricted so long as, after the completion of the above treatment, the centerline average roughness of the treated face is from 0.2 to 0.5 µm.

(Anodic Oxidation)

It is preferable that the thus treated aluminum support is further subjected to anodic oxidation.

In the anodic oxidation, aqueous solutions of oxalic acid or boric acid/sodium borate (either alone as a mixture thereof) are employed as the main components of an electrolytic bath. In this step, it is needless to say that the electrolyte solution may contain components commonly contained in Al alloy sheets, electrodes, tap water, underground water, etc. Moreover, it may contain second and third components. Examples of the second and third components include cations such as metal ions of Na, K, Mg, Li, Ca, Ti, Al, V, Cr, Mn, Fe, Co, Ni, Cu and Zn and ammonium ion, and anions such as nitrate ion, silicate ion and borate ion. The concentrations of these components may be from 0 to about 10000 ppm. Although the conditions for the anodic oxidation are not particularly restricted, it is preferably carried out at 30 to 500 g/L, a treating solution temperature of 10 to 70° C., a current density of 0.1 to 40 A/m$^2$ under an alternating current or a direct current. The anodic oxidation film thus formed has a thickness of form 0.5 to 1.5 µm, preferably form 0.5 to 1.0 µm. It is preferable that the treating conditions are selected so as to give a pore size of from 5 to 10 nm and a pore density of from $8 \times 10^{15}$ to $2 \times 10^{16}$ pores/m$^2$ of micropores in the anodic oxidation film of the support thus constructed.

For the hydrophilization of the support surface, use can be made of various publicly known methods. In a particularly preferable case, the hydrophilization may be carried out by using a silicate, polyvinylphosphonic acid, etc. The film is formed so as to give an Si or P content (as an element) of from 2 to 40 mg/m$^2$, preferably from 4 to 30 mg/m$^2$. The coating amount can be measured by the fluorescent X-ray analysis method.

The hydrophilization can be carried by soaking the aluminum support having the anodic oxidation film thereon as described above in an aqueous solution, which contains from 1 to 30% by mass (preferably from 2 to 15% by mass) of an alkali metal silicate or polyvinylsulfonic acid and has a pH value of 10 to 13 at 25° C., at 15 to 80° C. for 0.5 to 120 sec.

As the alkali metal silicate to be employed in the above hydrophilization treatment, use may be made of sodium silicate, potassium silicate, lithium silicate and the like. Examples of a hydroxide to be used for elevating the pH value of the aqueous alkali metal silicate solution include sodium hydroxide, potassium hydroxide, lithium hydroxide and so on. The treatment solution as described above may further contain an alkaline earth metal salt or a group IVB metal salt. Examples of the alkaline earth metal salt include water-soluble salts, e.g., nitrates such as calcium nitrate, strontium nitrate, magnesium nitrate and barium nitrate, sulfates, hydrochlorides, phosphates, acetates, oxalates and borates. Examples of the group IVB metal salt include titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride and so on.

Either one of these alkaline earth metal salts and group IVB metal salts or a combination of two or more thereof may be used. Such a metal salt is used preferably in an amount of from 0.01 to 10% by mass, still preferably from 0.05 to 5.0% by mass. It is also effective to employ silicate electrodeposition as described in U.S. Pat. No. 3,658,662. Moreover, it is useful to perform a surface treatment comprising a combination of an electrolytically grained support as disclosed in JP-A-52-58602 and JP-A-52-30503 with the above-described anodic oxidation and hydrophilic oxidation.

[Intermediate Layer]

To improve adhesion between the photosensitive layer and the substrate or stain resistance, the lithographic printing plate precursor according to the invention may have an intermediate layer (also called an undercoat layer). Particular examples of the intermediate layer include those described in JP-B-50-7481, JP-A-54-72104, JP-A-51-71123, JP-A-54-72104, JP-A-59-101651, JP-A-60-149491, JP-A-60-232998, JP-A-2-304441, JP-A-3-56177, JP-A-4-282637, JP-A-5-16558, JP-A-5-246171, JP-A-5-341532, JP-A-7-159983, JP-A-7-314937, JP-A-8-202025, JP-A-8-320551, JP-A-9-34104, JP-A-9-236911, JP-A-9-269593, JP-A-10-69092, JP-A-10-115931, JP-A-10-161317, JP-A-10-260536, JP-A-10-282679, JP-A-10-282682, JP-A-11-84674, JP-A-10-69092, JP-A-10-115931, JP-A-11-38635, JP-A-11-38629, JP-A-10-282645, JP-A-10-301262, JP-A-11-24277, JP-A-11-109641, JP-A-10-319600, JP-A-11-84674, JP-A-11-327152, JP-A-2000-10292, JP-A-11-36377, Japanese Patent Application 11-165861, Japanese Patent Application 11-284091, Japanese Patent Application 2000-14697 and so on.

[Protective Layer]

Because of being usually exposed in the atmosphere, it is preferable that the lithographic printing plate precursor according to the invention having the photopolymerizable or thermally polymerizable photosensitive layer of the negative type further has a protective layer (also called an overcoat layer) on the above-described photosensitive layer. The protective layer,(prevents the photosensitive layer from the invasion of low-molecular weight compounds such as oxygen and basic substances which occur in the atmosphere and inhibit the image formation reaction proceeding in the photosensitive layer due to the exposure, thereby enables the exposure in the atmosphere. Accordingly, it is required that such a protective layer has a low permeability for the low-molecular weight compounds such as oxygen but a substantially does not the penetration of light to be used in the exposure, is excellent in the adhesion to the photosensitive layer and can be easily removed in the development step following the exposure. Concerning such a protective layer, devices have been made as reported in detail in U.S. Pat. No. 3,458,311 and JP-B-55-49729.

As materials usable in the protective layer, it is favorable to employ, for example, water-soluble polymer compounds having relatively high crystallinity. More specifically speaking, there have been known water-soluble polymers such as polyvinyl alcohol, polyvinylpyrrolidone, acidic celluloses, gelatin, gum arabic and polyacrylic acid. Among these polymers, the most desirable results in fundamental properties (oxygen-blocking, removal in development, etc.) can be obtained by using polyvinyl alcohol as the main component. The polyvinyl alcohol to be used in the protective layer may be partly substituted by an ester, an ether or acetal, so long as it carries unsubstituted vinyl alcohol units for achieving the required oxygen-blocking properties and solubility in water. Similarly, it may partly have another comonomer. Particular examples of the polyvinyl alcohol include those which are hydrolyzed to an extent of 71 to 100% and have a molecular weight of from 300 to 2400.

More specifically speaking, use can be made of PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, etc. each manufactured by KURARAY.

The components (the type of PVA, use of additive(s)), coating amount, etc. of the protective layer are selected by taking the oxygen-blocking properties and development removal as well as fogging, adhesiveness and scuff resistance into consideration. In general, a higher hydrolysis ratio of the employed PVA (i.e., the higher content of the unsubstituted vinyl alcohol units in the protective layer) and a larger thickness thereof bring about the higher oxygen-blocking properties, which is advantageous from the viewpoint of sensitivity. When the oxygen-blocking properties are extremely elevated, however, there arise some problems such as the occurrence of an unnecessary polymerization during production or storage and unnecessary fogging or line thickening during exposure of the image. In addition, the adhesiveness to the image part and the scuff resistance are highly important factors in handling. That is to say, when a hydrophilic layer made of a water-soluble polymer is laminated upon a lipophilic recording layer, the insufficient adhesive force frequently causes film separation and the separated part induces troubles such as film hardening failure due to the inhibition of the polymerization by oxygen. To overcome this problem, various proposals have been made to improve the pressure-sensitive adhesion between these two layers. For example, U.S. Pat. Nos. 292,501 and 44,563 report that a sufficient pressure-sensitive adhesion can be achieved by mixing a hydrophilic polymer mainly comprising polyvinyl alcohol with 20 to 60% by mass of an acrylic emulsion, a water-insoluble vinylpyrrolidone/vinyl acetate copolymer, etc. and laminating on the polymerization layer.

Any of these publicly known techniques are applicable to the protective layer in the invention. Methods of coating the protective layer are described in, for example, U.S. Pat. No. 3,458,311 and JP-B-55-49729.

Other plate-making processes for obtaining a lithographic printing plate form the lithographic printing plate precursor according to the invention are as follows.

[Plate Making]

For the plate-making of the lithographic printing plate precursor according to the invention, exposure and development processes should be at least carried out.

As the beams to be used in the exposure, publicly known ones can be employed without restriction. A desirable light source is one having a wavelength of from 300 nm to 1200 nm. More specifically speaking, various lasers can be appropriately used as the light source. Among all, it is appropriate to employ an infrared laser having a wavelength of form 780 nm to 1200 nm.

As the exposure mechanism, any of the inner drum system, the outer drum system, the flat bed system and so on may be employed.

As other exposure light sources for the lithographic printing plate precursor according to the invention, use can be made of ultrahigh pressure, high pressure, medium pressure and low pressure mercury lamps, chemical lamps, carbon arc lamps, xenon lamps, metal halide lamps, various laser lamps of the visible and ultraviolet types, fluorescent lamps, tungsten lamps, solar light, etc.

After the completion of the exposure, the lithographic printing plate precursor according to the invention is developed. As the developing solution to be used in the development, an aqueous alkali solution having a pH value of 14 or lower is preferable. It is still preferable to use an aqueous alkali solution of pH 8 to 12 containing an anionic surfactant. Examples thereof include inorganic alkali salts such as sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Also, use can be made of organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine. Either one of these alkali agents or a combination of two or more thereof may be used.

In the development of the lithographic printing plate precursor according to the invention, it is preferable to add from 1 to 20% by mass, still preferably from 3 to 10% by mass, of an anionic surfactant to the developing solution. When the content of the surfactant is too small, satisfactory effect of improving the development characteristics can be hardly obtained. When a surfactant is added in an excessively large amount, on the other hand, there frequently arise some problems such as a decrease in the strength (abrasion resistance, etc.) of the image. Preferable examples of the anionic surfactant include sodium salt of lauryl alcohol sulfate, ammonium salt of lauryl alcohol sulfate, sodium salt of octyl alcohol sulfate, alkylarylsulfonic acid salts such as sodium salt of isopropylnaphthalenesulfonic acid, sodium salt of isobutylnaphthalenesulfonic acid, sodium salt of polyoxyethylene glycol mononaphthylethyl sulfuric acid ester, sodium salt of dodecylbenzenesulfonic acid and sodium salt of meta-nitrobenzenesulfonic acid, sulfuric acid esters of higher alcohols having 8 to 22 carbon atoms such as secondary sodium alkylsulfates, aliphatic alcohol phosphoric acid ester salts such as sodium salt of cetyl alcohol phosphoric acid ester, sulfonic acid salts of alkylamides such as $C_{17}H_{33}CON(CH_3)CH_2CH_2SO_3Na$, sulfonic acid salts of dibasic aliphatic esters such as sodium sulfosuccinic acid dioctyl ester and sodium sulfosuccinic acid dihexyl ester.

If needed, an organic solvent miscible with water such as benzyl alcohol may be added to the developing solution. As preferable examples of the organic solvent, those having a solubility in water of about 10% by mass or less, still preferably 5% by mass or less, are cited. For example, use can be made of 1-phenylethanol, 2-phenylethanol, 2-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, 3-methylcyclohexanol and so on. It is appropriate that the content of the organic solvent ranges from 1 to 5% by mass based on the total mass of the developing solution in using. The amount of the organic solvent closely relates to the amount of the surfactant. Namely, it is favorable to increase the amount of the surfactant with an increase in the amount of the organic solvent. This is because a large amount of the organic solvent cannot be dissolved in the case of using the surfactant only in a small amount and thus favorable developing characteristics cannot be ensured.

Moreover, the developing solution may contain other additives such as an antifoamer and a hard water softener. Examples of the hard water softener include polyphosphoric acid salts such as $Na_2P_2O_7$, $Na_5P_3O_3$, $Na_3P_3O_3$, $Na_2O_4P$ $(NaO_3P)PO_3Na_2$ and calgon (sodium polymetaphosphate), aminopolycarboxzylic acids (for example, ethylenediaminetetraacetic acid, its potassium salt and its sodium salt; diethylenetriaminepentaacetic acid, its potassium salt and its sodium salt; triethylenetetraminehexaacetic acid, its potassium salt and its sodium salt; hydroxyethylethylenediaminetriacetic acid, its potassium salt and its sodium salt; nitrilotriacetic acid, its potassium salt and its sodium salt; 1,2-diaminocyclohexanetetraacetic acid, its potassium salt and its sodium salt; and 1,3-diamino-2-propanoltetraacetic acid, its potassium salt and its sodium salt), other polycarboxylic acids (for example, 2-phosphonobutanetricarboxylic acid-1,2,4, its potassium salt and its sodium salt; and 2-phosphonobutanetricarboxylic acid-2,3,4, its potassium salt and its sodium salt), organic phosphonic acids (for example, 1-phosphonoethanetricarboxylic acid-1,2,2, its potassium salt and its sodium salt; 1-hydroxyethane-1,1-diphosphonic acid, its potassium salt and its sodium salt; and aminotri (methylenephosphonic acid), its potassium salt and its sodium salt). The optimum amount of such a hard water softener varies depending on the hardness of the hard water employed and the amount of the same. In general, it may be added to the developing solution in an amount of from 0.01 to 5% by mass, still preferably from 0.01 to 0.5% by mass.

In the case of developing the lithographic printing plate with the use of an automatic developing machine, the developing solution fatigues as the processing proceeds. Therefore, the processing performance may be restored by using an auxiliary solution or a fresh developing solution. In this case, the replenishment is carried out preferably by the method described in U.S. Pat. No. 4,882,246. It is also preferable to employ developing solutions reported in JP-A-50-26601, JP-A-58-54341, JP-B-56-39464, JP-B-56-42860 and JP-B-57-7427.

After developed as described above, the printing plate may be post-treated with washing water, a rinsing solution containing a surfactant etc. and a grease desensitization solution containing gum arabic and a starch derivative, as described in JP-A-54-8002, JP-A-55-115045, JP-A-59-58431 and so on. The post-treatment for the lithographic printing plate precursor according to the invention may be carried out by combining these procedures.

If necessary, the lithographic printing plate precursor according to the invention may be heated, as a whole, in the course of the plate making, i.e., before or during the exposure or between the exposure and the development. Due to the heating, the image-forming reaction in the photosensitive layer is accelerated, which brings about some advantages such as improvement in sensitivity and press life and stabilization of sensitivity. It is also effective to heat or expose the whole developed image so as to improve the image strength and press life.

From the viewpoint of preventing undesired hardening reaction, it is usually preferred to carry out the heating before the development under mild conditions of 150° C. or lower. The heating after the development can be carried out under extremely strong conditions. From the viewpoints of strengthening the image and preventing thermal decomposition in the image part, the heating is usually carried out at a temperature of form 200 to 500° C.

The lithographic printing plate obtained by these treatments can be used in multisheet printing by using an offset printer etc.

Stains on the printing plate subjected to printing can be removed with a plate cleaner. As the plate cleaner to be used in removing stains on the plate during the printing, use can be made of known plate cleaners for PS plates such as CL-1, CL-2, CP, CN-4, CN, CG-1, PC-1, SR and IC (each manufactured by Fuji Photo Film).

EXAMPLES

Next the invention will be illustrated in greater detail by reference to the following Examples. However, it is to be understood that the invention is not construed as being restricted thereto.

[Synthesis Example 1: Polyurethane Resin (P-1)]

(1) 1,1,1-Tris(hydroxymethyl)ethane (120.2 g) and 2-methoxypropene (75.0 g) were suspended in acetone (300 ml). After adding one drop of conc. sulfuric acid at 0° C., the mixture was stirred for 1 hour and then at room temperature for additional 2 hours. After distilling off the acetone, a fraction obtained under reduced pressure (1.7 mmHg) at 70° C. was collected to give (1,4,4-trimethyl-3,5-dioxanyl)methan-1-ol (155.2 g).

(2) Next, succinic anhydride (32 g), the (1,4,4-trimethyl-3,5-dioxanyl)methan-1-ol (46.3 g) obtained above and triethylamine (35 g) were dissolved in acetone (150 ml) and the solution was stirred at room temperature for 20 hours. After distilling off the acetone, the residue was poured into 3 L of a 0.5 mol/l aqueous solution of sodium hydrogencarbonate followed by stirring for 30 minutes. Then 500 ml of ethyl acetate was added and the aqueous layer was collected. The aqueous layer thus collected was adjusted to pH 1 to 2 with a 1 mol/l aqueous solution of hydrochloric acid and stirred at room temperature for 2 hours. After adding 300 g of sodium chloride to this aqueous solution, 1.5 L of ethyl acetate was further added and the ethyl acetate layer was collected. Anhydrous magnesium sulfate was added to the ethyl acetate solution thus collected and the mixture was filtered. From the obtained filtrate, ethyl acetate was distilled off to give a compound DA-1 (30 g).

(3) Into a 500 ml three-necked round bottom flask provided with a condenser and a stirrer, the compound DA-1 obtained above (12.66 g), hexamethylene diisocyanate (3.87 g, manufactured by Wako Pure Chemical Industries, Inc.), diphenylmethane diisocyanate (23.02 g, manufactured by Wako Pure Chemical Industries, Inc.), polypropylene glycol having an average molecular weight of 1000 (34.50 g, manufactured by Wako Pure Chemical Industries, Inc.), tetraethylene glycol (4.47 g, manufactured by Wako Pure Chemical Industries, Inc.), N,N-dimethylacetamide (65.00 g, manufactured by Wako Pure Chemical Industries, Inc.) and di-n-butyltin dilaurate (5 drops, manufactured by Tokyo Kasei Kogyo) were introduced and heated at 100° C. for 8 hours. Then the mixture was diluted with methanol (100 ml) and N,N-dimethylacetamide (200 ml). The reaction solution was poured into water (4 L) under stirring and thus a white polymer was precipitated. This polymer was separated by filtration, washed with water and dried in vacuo to give a polyurethane resin (P-1) according to the invention (51.35 g).

Polyurethane resins (P-2) to (P-15) according to the invention and polyurethane resins (CP-1) to (CP-3) for comparison were obtained as in the above SYNTHESIS EXAMPLE 1 but using the diisocyanate compounds and the diol compounds listed in Tables 1 to 5.

TABLE 1
| Polyurethane resin | Diisocyanate compound employed (mol %) | Diol compound employed (mol %) | Weight-average molecular weight (×10⁴) |
|---|---|---|---|
| P-1 | 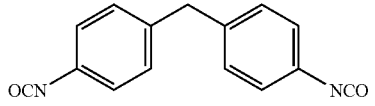 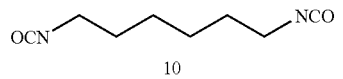 | 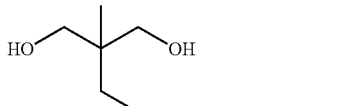 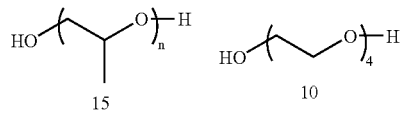 | 6.2 |
| P-2 | 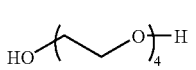 | 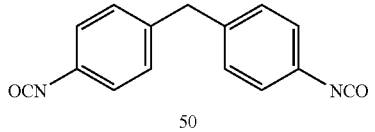 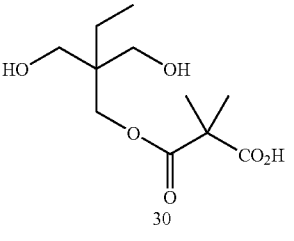 | 7.9 |
| P-3 | 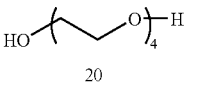 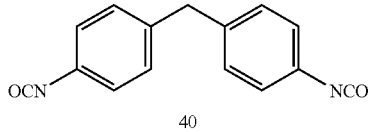 | 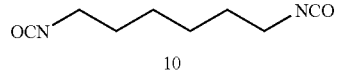 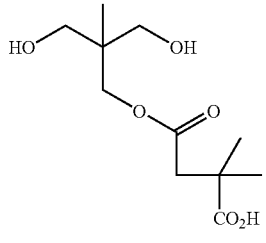 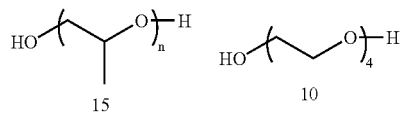 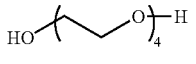 | 6.2 |

TABLE 1-continued
| Polyurethane resin | Diisocyanate compound employed (mol %) | Diol compound employed (mol %) | Weight-average molecular weight (×10⁴) |
|---|---|---|---|
| P-4 | 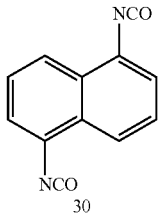 30, 20 | 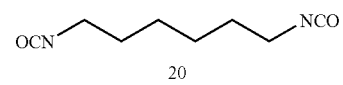 35, 15 Mw: 400 | 5.7 |
TABLE 2
| Polyurethane resin | Diisocyanate compound employed (mol %) | Diol compound employed (mol %) | Weight-average molecular weight (×10⁴) |
|---|---|---|---|
| P-5 | 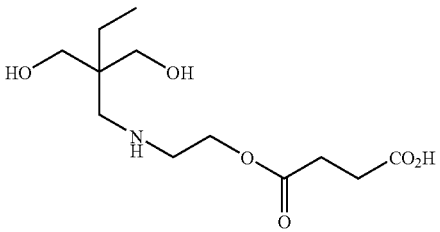 30, 20 | 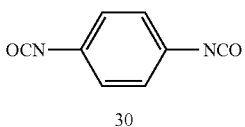 25, 25 | 8.8 |
| P-6 | 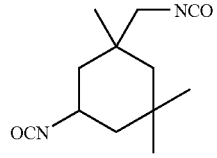 40, 10 | 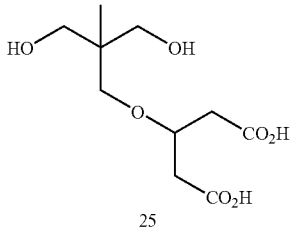 30, 10, 10 Mw: 1000 | 5.9 |

TABLE 2-continued
| Polyurethane resin | Diisocyanate compound employed (mol %) | Diol compound employed (mol %) | Weight-average molecular weight (×10⁴) |
|---|---|---|---|
| P-7 | 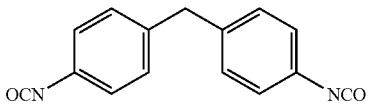 40<br>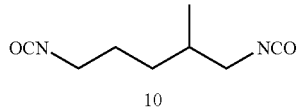 10 | 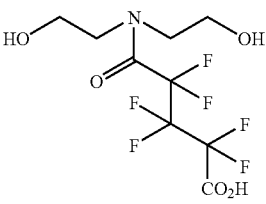 25    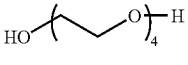 25 | 6.9 |
| P-8 | 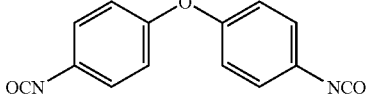 40<br>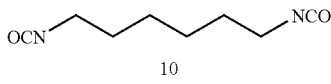 10 | 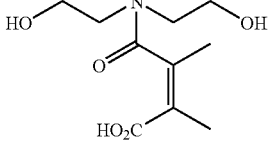 30<br>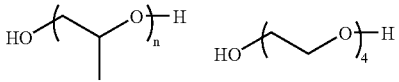 5    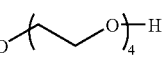 15<br>Mw: 1000 | 7.7 |
TABLE 3
| Polyurethane resin | Diisocyanate compound employed (mol %) | Diol compound employed (mol %) | Weight-average molecular weight (×10⁴) |
|---|---|---|---|
| P-9 | 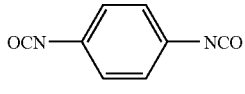 20<br>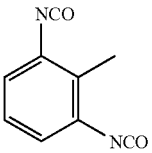 30 | 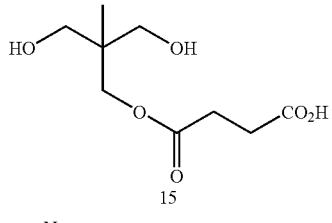 15<br>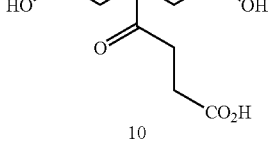 10     25<br>Mw: 2000 | 6.0 |

TABLE 3-continued

| Polyurethane resin | Diisocyanate compound employed (mol %) | Diol compound employed (mol %) | Weight-average molecular weight ($\times 10^4$) |
|---|---|---|---|
| P-10 | isophorone diisocyanate structure, 40; OCN-(CH2)6-NCO, 10 | 2,2-bis(hydroxymethyl) compound with methacrylate/CO2H ester, 10; HN(CH2CH2OH)2 amide with CO2H branched chain, 20; HO-(CH2CH2O)4-H, 20 | 4.3 |
| P-11 | 4,4'-methylenebis(phenyl isocyanate), 40; OCN-(CH2)6-NCO, 10 | 2,2-bis(hydroxymethyl) compound with glutarate/CO2H, 20; 2,2-bis(hydroxymethyl) compound with methacrylate ester, 20; HO-(CH(CH3)CH2O)n-H, 10, Mw: 1000 | 6.1 |

TABLE 3-continued
| Polyurethane resin | Diisocyanate compound employed (mol %) | Diol compound employed (mol %) | Weight-average molecular weight (×10⁴) |
|---|---|---|---|
| P-12 | 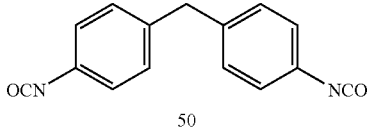 | 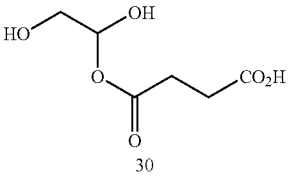 | 7.0 |
TABLE 4
| Polyurethane resin | Diisocyanate compound employed (mol %) |
|---|---|
| P-13 | 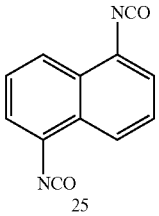 |
| P-14 | 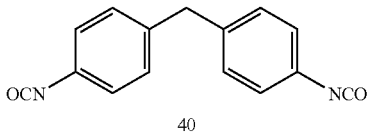 |

TABLE 4-continued
P-15
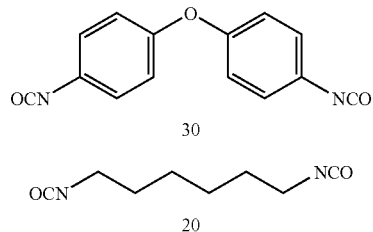
30
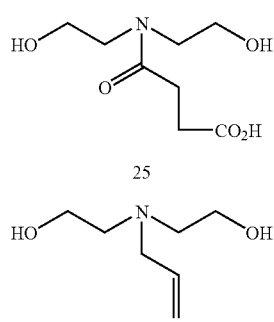
20
| Polyurethane resin | Diol compound employed (mol %) | Weight-average molecular weight (×10⁴) |
|---|---|---|
| P-13 | 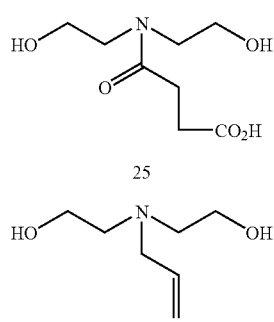 25<br><br>25 | 3.3 |
| P-14 | 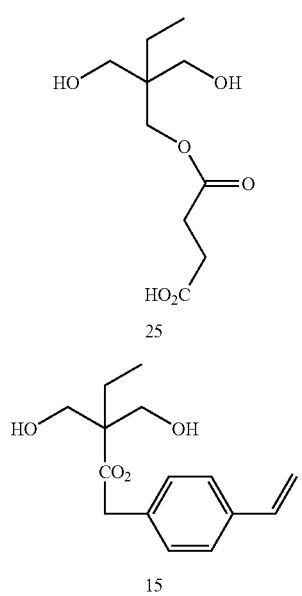 25<br><br>15<br><br>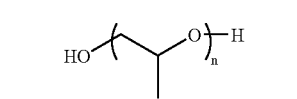 10<br>Mw: 2000 | 5.0 |

TABLE 4-continued
| | | |
|---|---|---|
| P-15 | 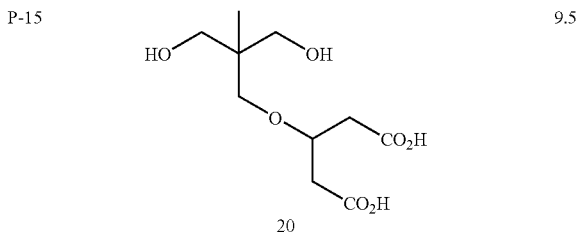 20 | 9.5 |
| | 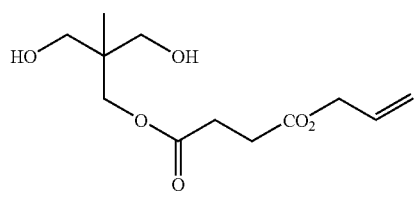 10 | |
| | 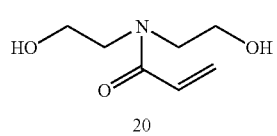 20 | |
TABLE 5
| Polyurethane resin | Diisocyanate compound employed (mol %) | Diol compound employed (mol %) | Weight-average molecular weight ($\times 10^4$) |
|---|---|---|---|
| CP-1 | 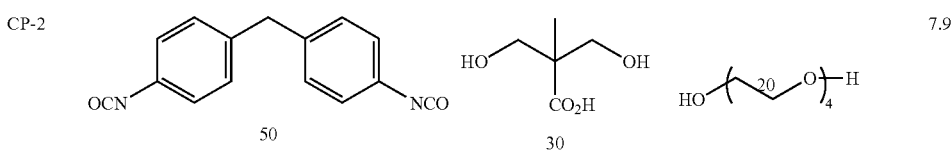 | | 6.5 |
| CP-2 | | | 7.9 |

TABLE 5-continued

| Polyurethane resin | Diisocyanate compound employed (mol %) | Diol compound employed (mol %) | Weight-average molecular weight (×10⁴) |
|---|---|---|---|
| CP-3 | 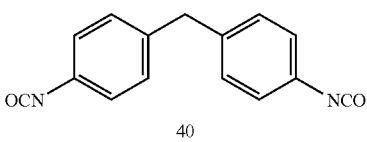 40 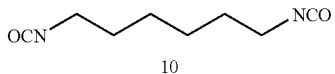 10 | 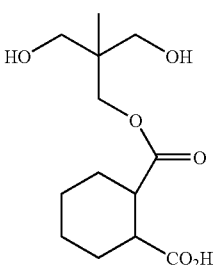 25 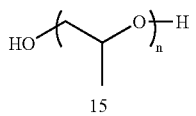 15 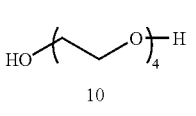 10 Mw: 1000 | 6.2 |

Examples 1 to 15, Comparative Examples 1 to 3

The lithographic printing plate precursors of the negative type of EXAMPLES 1 to 15 and COMPARATIVE EXAMPLES 1 to 3 as shown in Table 6 were constructed in the following manner and evaluated in printing performance. Table 6 shows the results too.

[Construction of Support]

An aluminum sheet (JIS A 1050) of 0.24 mm in thickness and 1030 mm in width was continuously treated as follows.

(a) By using a conventional mechanical roughening device, the aluminum sheet was surface-roughened with a rotating nylon brush roller while feeding a suspension (a polishing slurry) of polishing agent (Pumice) having a specific gravity of 1.12 in water to the surface. The average grain size of the polishing agent was 40 to 45 μm while the maximum grain size thereof was 200 μm. The nylon brushes were made of 610 Nylon and the bristle length and the bristle diameter thereof were 50 mm and 0.3 mm respectively. The nylon brushes had bristles closely located on a cylinder (diameter: 300 mm) made of stainless. Three rotational brushes were employed. Below the brushes, two supporting rollers (diameter: 20 mm) were provided at an interval of 300 mm. The brush roller was pressed until the load on the driving motor for rotating the brushes attained to a level larger by 7 kg than the load before pressing the brush roller to the aluminum sheet. The brushes were rotated in the same direction as the driving direction of the aluminum sheet and the rotational speed was 200 rpm.

(b) The aluminum sheet was etched by spraying with the use of 2.6% by mass of caustic soda and 6.5% by mass of aluminum ion at 70° C. and thus 0.3 g/m² of the aluminum sheet was etched. Then, it was spray-washed with water.

(c) Then the aluminum sheet was desmatted by spraying a 1% by mass aqueous solution of nitric acid (containing 0.5% by mass of aluminum ion) at 30° C. and spray-washed with water. As the aqueous nitric acid solution employed in the desmatting, use was made of the waste solution from the electrochemical roughening step in an aqueous nitric acid solution under an alternating current.

(d) Under an alternating current at 60 Hz, the aluminum sheet was continuously surface-roughened electrochemically. The electrolyte solution employed was a 1% by mass aqueous solution of nitric acid (containing 0.5% by mass of aluminum ion and 0.007% by mass of ammonium ion) at 40° C. In the alternating power source employed, the time TP required for the achievement of the peak current value from zero was 2 msec and the duty ratio was 1:1. By using a combination of a trapezoidal wave with a rectangular wave as an alternate current, electrochemical surface-roughening was effected with the use of a carbon electrode as a counter electrode. Ferrite was employed as a supporting anode. The current density at the peak was 30 A/dm², and the electricity expressed in the total electricity at the point of using the aluminum plate as the anode was 255 C/dm². 5% of the current flowing from the power source was shunted. Subsequently, the aluminum sheet was spray-washed with water.

(e) Next, the aluminum plate was etched at 0.2 g/m² by spraying an aqueous solution of a caustic soda concentration of 26% by mass and an aluminum ion concentration of 6.5% by mass at an etching temperature of 32° C. Thus, smat components mainly comprising aluminum hydroxide formed in the previous electrochemical surface-roughening under the alternating current were removed and the pit edge thus formed was dissolved to smoothen the edge. Next, the sheet was spray-washed with water.

(f) The sheet was desmatted by spraying an aqueous solution of a sulfuric acid concentration of 25% by mass (containing 0.5% by mass of aluminum ion) followed by spray-washing with water.

(g) Next anodic oxidation was carried out by using a conventional anodic oxidation device for the two-stage feeding/electrolyzing method (lengths of first and second electrolysis parts: each 6 m, first feeding part length: 3 m, second feeding part length: 3 mm, lengths of first and second feeding electrodes: each 2.4 m) at a sulfuric acid concentration in the electrolysis parts of 170 g/L (containing 0.5% by mass of aluminum ion) at a temperature of 38° C. Next, the sheet was spray-washed with water. In the anodic oxidation device, a current from a power source flew into the first feeding electrode provided in the first feeding part and then, via an electrolyte solution, into the aluminum sheet so as to form an oxidation film on the surface of the aluminum sheet in the first electrolysis part. Next, he current returned to the power source through the electrolysis electrode provided in the first feeding part. On the other hand, a current from the power source flew into the second feeding electrode provided in the second feeding part and then, similarly via an electrolyte solution, into the aluminum sheet so as to form an oxidation film on the surface of the aluminum sheet in the second electrolysis part. The electricity fed form the power source into the first feeding part was the same as the electricity fed from the power source into the second feeding part. The feeding current density on the oxidation film face in the second feeding part was about 25 A/dm². In the second feeding part, the electricity was fed form the oxidation film face of 1.35 g/m². The final oxidation film amount was 2.7 g/m². The aluminum support thus formed was referred to as [AS-1].

[Hydrophilization]

The aluminum support [AS-1] was treated with silicate to elevate the hydrophilic nature as a non-image part of a printing plate. The treatment was performed by maintaining a 1.5% aqueous solution of No. 3 soda silicate at 70° C. and carrying the aluminum web in such a manner as to give a contact time of 15 seconds. Further, it was washed with water. The Si deposition amount was 10 mg/m². The obtained support was referred to as [AS-2].

[Formation of Intermediate Layer]

A liquid composition (a sol) of the SG method was prepared as follows. The following components were weighed into a beaker and stirred at 25° C. for 20 minutes.

| | |
|---|---|
| tetraethoxysilane | 38 g |
| 3-methacryloxypropyltrimethoxysilane | 13 g |
| 85% aqueous solution of phosphoric acid | 12 g |
| ion-exchanged water | 15 g |
| methanol | 100 g |

This solution was transferred into a three-necked flask. After providing a reflux condenser, the three-necked flask was soaked in an oil bath at room temperature. Then the contents of the three-necked flask was heated to 50° C. within 30 minutes while stirring with a magnetic stirrer. While maintaining the bath temperature at 50° C. the reaction was performed for additional 1 hour to give a liquid composition (a sol). This sol was diluted with methanol/ethylene glycol=20/1 (ratio by mass) to 0.5% by mass and the obtained dilution was applied to the aluminum substrate [AS-1] with a foiler and dried at 100° C. for 1 minute. The coating amount was 3.5 mg/m². This coating amount was determined by quantifying Si element by the fluorescent X-ray analysis and referring the obtained value as the coating amount. The support thus constructed was referred to as [AS-3].

Next, a solution of the following composition was applied the aluminum support [AS-2] with a wire bar and dried at 90° C. for 30 seconds with a hot-air dryer. After the drying, the coating amount was 10 mg/m².

| | |
|---|---|
| Ethyl methacrylate/sodium 2-acrylamide-2-methyl-2-propane sulfonate copolymer (molar ratio 75:15) | 0.1 g |
| 2-aminoethylphosphonic acid | 0.1 g |
| methanol | 50 g |
| ion-exchanged water | 50 g |

The support thus constructed was referred to as [AS-4].

[Formation of Photosensitive Layer]

On the aluminum support thus treated, a coating solution for photosensitive layer of the following composition was applied to give a coating amount of 1.0 to 1.2 g/m² and dried at 100° C. for 1 minute to form a photosensitive layer.

| (Coating solution for photosensitive layer) | |
|---|---|
| addition-polymerizable compound (listed in Table 6) | 1.5 g |
| specific polyurethane resin (listed in Table 6) | 2.0 g |
| sensitizing colorant (listed in Table 6) | 0.2 g |
| photopolymerization initiator (listed in Table 6) | 0.4 g |
| cosensitizing colorant (listed in Table 6) | 0.4 g |
| fluorine-type nonionic surfactant (Megafac F-177, manufactured by Dainippon Ink and Chemicals Inc.) | 0.03 g |
| thermal polymerization initiator | 0.01 g |
| (N-nitrosophenylhydroxylamine aluminum salt) | 0.01 g |
| coloring pigment dispersion of the following composition | 2.0 g |
| methyl ethyl ketone | 20.0 g |
| propylene glycol monomethyl ether | 20.0 g |

| Composition of coloring pigment dispersion | |
|---|---|
| Pigment Blue 15:6 | 15 parts by mass |
| allyl methacrylate/methacrylic acid copolymer (copolymerization molar ratio 80/20, mass-average molecular weight 40,000) | 10 parts by mass |
| cyclohexanone | 15 parts by mass |
| methoxypropyl acetate | 20 parts by mass |
| propylene glycol monomethyl ether | 40 parts by mass |

[Formation of Protective Layer]

On the photosensitive layer thus obtained, an aqueous solution of 3% by mass of polyvinyl alcohol (degree of saponification 98% by mol, degree of polymerization 550) was applied to give a dry coating mass of 2 g/m² and dried at 100° C. for 2 minutes.

[Exposure of Lithographic Printing Plate Precursor]

Using the lithographic printing plate precursor thus obtained, solid images and 1 to 99% halftone images (intervals: 1%) were subjected to scanning exposure with the use of an FD-YAG (532 nm) laser exposure machine (GUTENBERG: plate setter manufactured by HEIDELBERG) with controlling the exposure power to give a plate exposure energy density of 200 μJ/cm² and at a resolution of 2540 dpi at 175 lines/inch.

[Development/Plate Making]

After the exposure, each of the developing solutions listed in Tables 8 to 6 and FINISHER FP-2W (manufactured by Fuji Photo Film Co.) were fed into an automatic developing machine FLP-813 (manufactured by Fuji Photo Film Co.). Then the exposed plate was subjected to development/plate making at a developing solution temperature of 30° C. for 28 seconds (development time) to give a lithographic printing plate.

[Press Life Test in Image Part]

Using the lithographic printing plate thus obtained, printing was performed by a Printer R201 (manufactured by Rholand) using an ink Graph G(N) (manufactured by Dainippon Ink and Chemicals). Solid image parts of the prints were observed and the press life was evaluated based on the number of paper sheets having been printed before squeeze out of the ink. A larger number of paper sheets indicates the higher press life. Table 3 summarizes the results.

[Stain Resistance Test in Non-Image Part]

The stain resistance in a non-image part was evaluated by observing the prints for each 10,000 sheets with the naked eye in the press life test in image part as described above until the ink was squeezed out. A case where no staining was observed in the nonimage part of the print was evaluated as good.

TABLE 6

| | Polyurethane resin | Polymerizable compound | Polymerization initiator | Senzitizing dye | Other additive | Protective layer | Support | Developing solution | Press life ($10^4$ sheets) | Stain resistance in non-image part | Light source (nm) |
|---|---|---|---|---|---|---|---|---|---|---|---|
| Ex.1 | P-1 | M-2 | I-1 | S-2 | C-1 | Yes | AS-3 | D-2 | 28 | Good | 400 |
| Ex.2 | P-2 | M-1 | I-2 | S-2 | C-1 | Yes | AS-3 | D-2 | 24 | Good | 400 |
| Ex.3 | P-3 | M-2 | I-1 | S-2 | C-1 | Yes | AS-3 | D-2 | 26 | Good | 400 |
| Ex.4 | P-4 | M-3 | I-1 | S-2 | C-1 | Yes | AS-3 | D-2 | 27 | Good | 400 |
| Ex.5 | P-5 | M-4 | I-2 | S-2 | C-1 | Yes | AS-3 | D-2 | 26 | Good | 400 |
| Ex.6 | P-6 | M-4 | I-3 | S-2 | C-1 | Yes | AS-3 | D-2 | 27 | Good | 400 |
| Ex.7 | P-7 | M-3 | I-3 | S-2 | C-2 | Yes | AS-3 | D-2 | 25 | Good | 400 |
| Ex.8 | P-8 | M-2 | I-2 | S-2 | C-2 | Yes | AS-3 | D-2 | 26 | Good | 400 |
| Ex.9 | P-9 | M-1 | I-2 | S-2 | C-2 | Yes | AS-3 | D-2 | 27 | Good | 400 |
| Ex.10 | P-10 | M-1 | I-1 | S-2 | C-2 | Yes | AS-3 | D-2 | 26 | Good | 400 |
| Ex.11 | P-11 | M-2 | I-1 | S-2 | C-1 | Yes | AS-3 | D-2 | 27 | Good | 400 |
| Ex.12 | P-12 | M-3 | I-2 | S-2 | C-1 | Yes | AS-4 | D-3 | 31 | Good | 400 |
| Ex.13 | P-13 | M-3 | I-3 | S-2 | C-1 | Yes | AS-4 | D-3 | 30 | Good | 400 |
| Ex.14 | P-14 | M-4 | I-3 | S-2 | C-2 | Yes | AS-4 | D-3 | 29 | Good | 400 |
| Ex.15 | P-15 | M-2 | I-2 | S-2 | C-2 | Yes | AS-4 | D-3 | 29 | Good | 400 |
| C.Ex.1 | CP-1 | M-2 | I-1 | S-2 | C-1 | Yes | AS-3 | D-2 | 17 | Good | 400 |
| C.Ex.2 | CP-2 | M-1 | I-2 | S-2 | C-1 | Yes | AS-3 | D-2 | 23 | Stained | 400 |
| C.Ex.3 | CP-3 | M-4 | I-3 | S-2 | C-2 | Yes | AS-4 | D-3 | 26 | Stained | 400 |

Next, the addition-polymerizable compounds, polymerization initiators, sensitizing colorants, infrared absorbing agents and other additives listed in Table 6 and the developing solutions employed (including those employed in other EXAMPLES as will be described hereinafter) will be presented.

<Addition-Polymerizable Compound>

M-1: pentaerythritol tetraacrylate (NK ESTER A-TMMT, manufactured by Shin Nakamura Kogyo)

M-2: glycerol dimethacrylate hexamethylene diisocyanate urethane prepolymer (UA010H, manufactured by Kyoeisha Kagaku)

M-3 dipentaerythritol acrylate (NK Ester A-9530 manufactured by Shin Nakamura Kogyo)

M-4:

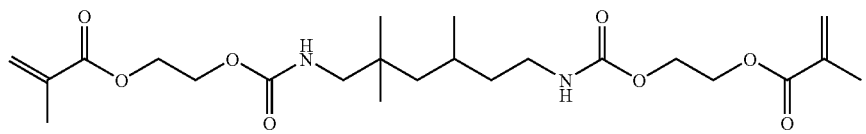

<Polymerization Initiator>
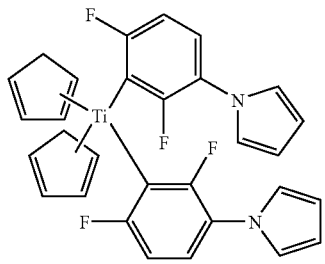
(I-1)
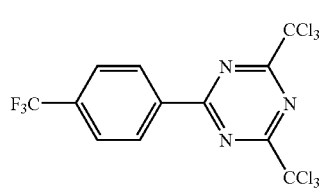
(I-2)
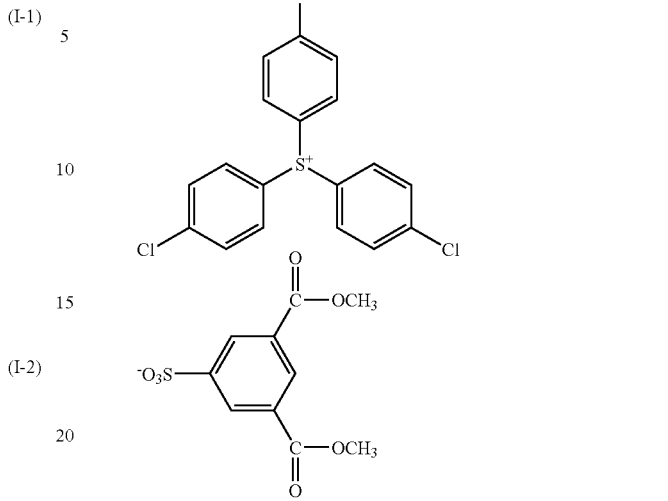
(I-4)
<Sensitizing Colorant>
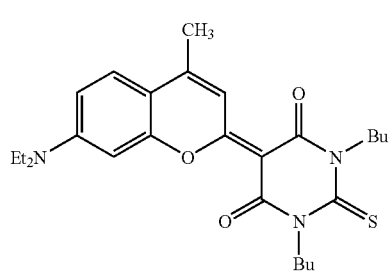
(S-1)
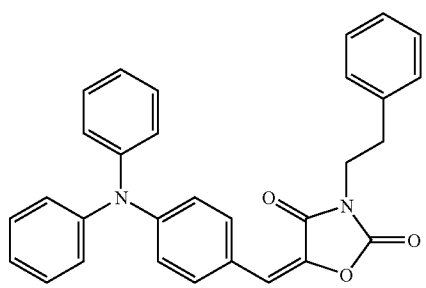
(S-2)
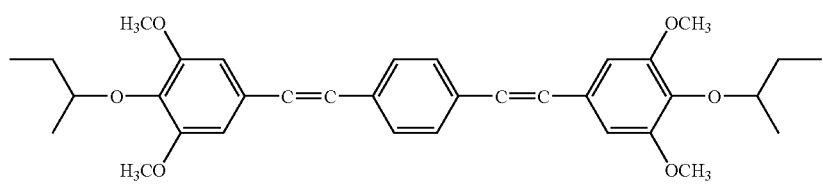
(S-3)
-continued
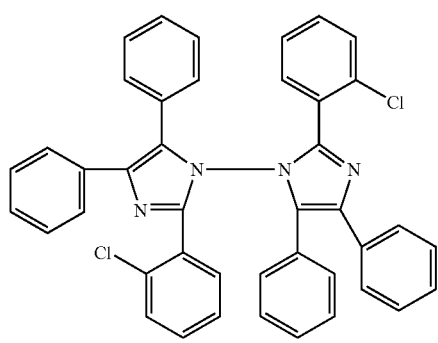
(I-3)
<Infrared Absorbing Agent>
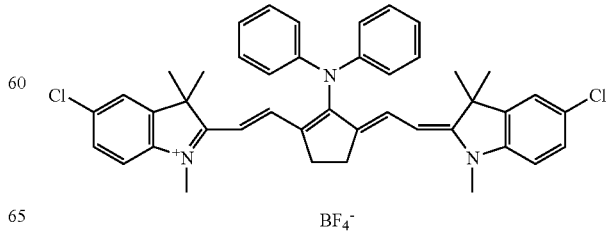
(S-4)

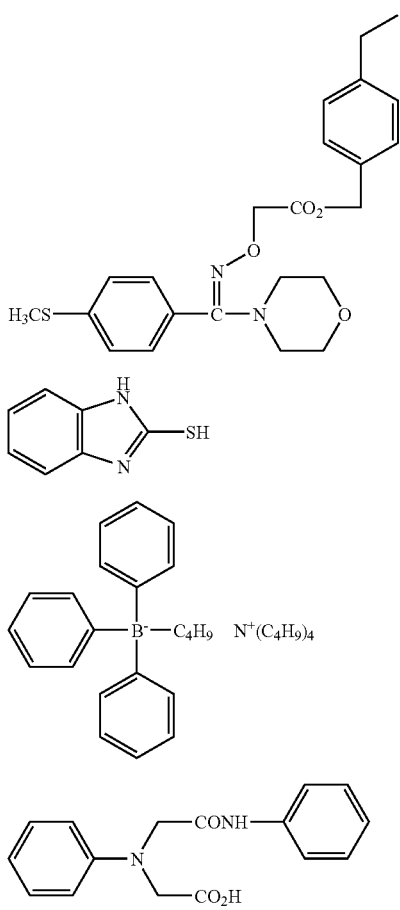

(C-1)
(C-2)
(C-3)
(C-4)

<Developing Solution>
D-1:

An aqueous solution of pH 10 having the following composition.

| monoethanolamine | 0.1 part by mass |
| --- | --- |
| triethanolamine | 1.5 parts by mass |
| compound of formula 1 | 4.0 parts by mass |
| compound of formula 2 | 2.5 parts by mass |
| compound of formula 3 | 0.2 part by mass |
| water | 91.7 parts by mass |

(Formula 1)

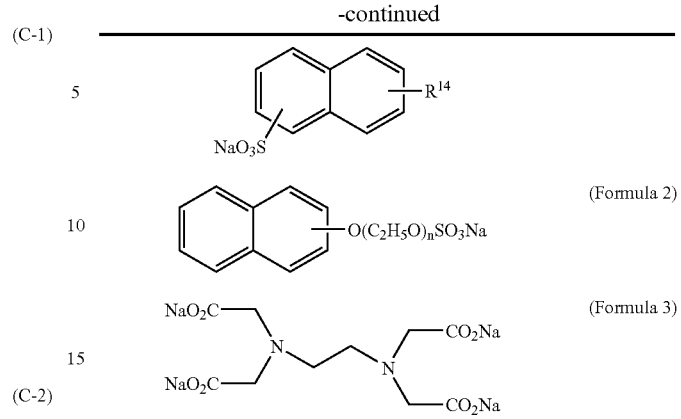

(Formula 2)

(Formula 3)

In the above (formula 1), $R^{14}$ represents a hydrogen atom or a butyl group.

D-2:

An aqueous solution of pH 10 having the following composition.

| 1K potassium silicate | 3.0 parts by mass |
| --- | --- |
| potassium hydroxide | 1.5 parts by mass |
| compound of the above formula | 30.2 part by mass |
| water | 95.3 parts by mass |

D-3:

| sodium carbonate monohydrate | 10 g |
| --- | --- |
| potassium hydrogencarbonate | 10 g |
| sodium isopropylnapthalenesulfonate | 15 g |
| sodium dibutylnaphthalenesulfonate | 15 g |
| ethylene glycol mononaphthyl ether monosulfate sodium salt | 10 g |
| sodium sulfite | 1 g |
| tetrasodium ethylenediaminetetracetate | 0.1 g |
| ion-exchanged water | 938.9 g |

Examples 16 to 30 and Comparative Examples 4 to 6

Lithographic printing plate precursors of the negative type (EXAMPLES 16 to 30 and COMPARATIVE EXAMPLES 4 to 6) as listed in Table 7 were constructed as in EXAMPLES 1 to 13 and COMPARATIVE EXAMPLES 1 to 3. The obtained lithographic printing plate precursors were evaluated in printing performance as in EXAMPLES 1 to 13 and COMPARATIVE EXAMPLES 1 to 3. In these EXAMPLES and COMPARATIVE EXAMPLES, the coating amounts of photosensitive layer after drying were controlled to 1.3 to 1.5 g/m². Table 7 shows the results too.

TABLE 7

| | Polyurethane resin | Polymerizable compound | Polymerization initiator | Senzitizing dye | Other additive | Protective layer | Support | Developing solution | Press life ($10^4$ sheets) | Stain resistance in non-image part | Light source (nm) |
| --- | --- | --- | --- | --- | --- | --- | --- | --- | --- | --- | --- |
| Ex.16 | P-1 | M-2 | I-1 | S-1 | C-1 | Yes | AS-1 | D-1 | 25 | Good | 532 |
| Ex.17 | P-2 | M-1 | I-2 | S-1 | C-2 | Yes | AS-2 | D-1 | 23 | Good | 532 |
| Ex.18 | P-3 | M-2 | I-1 | S-1 | C-1 | Yes | AS-1 | D-1 | 20 | Good | 532 |
| Ex.19 | P-4 | M-4 | I-1 | S-1 | C-1 | Yes | AS-1 | D-1 | 25 | Good | 532 |
| Ex.20 | P-5 | M-2 | I-1 | S-1 | C-1 | Yes | AS-2 | D-1 | 22 | Good | 532 |
| Ex.21 | P-6 | M-2 | I-1 | S-1 | C-2 | Yes | AS-2 | D-1 | 25 | Good | 532 |
| Ex.22 | P-7 | M-4 | I-2 | S-1 | — | Yes | AS-1 | D-2 | 22 | Good | 532 |
| Ex.23 | P-8 | M-1 | I-1 | S-1 | C-2 | Yes | AS-1 | D-2 | 24 | Good | 532 |

TABLE 7-continued

| | Polyurethane resin | Polymerizable compound | Polymerization initiator | Senzitizing dye | Other additive | Protective layer | Support | Developing solution | Press life (10⁴ sheets) | Stain resistance in non-image part | Light source (nm) |
|---|---|---|---|---|---|---|---|---|---|---|---|
| Ex.24 | P-9 | M-2 | I-2 | S-1 | C-1 | Yes | AS-1 | D-2 | 25 | Good | 532 |
| Ex.25 | P-10 | M-3 | I-2 | S-1 | C-1 | Yes | AS-2 | D-2 | 22 | Good | 532 |
| Ex.26 | P-11 | M-2 | I-2 | S-1 | C-1 | Yes | AS-1 | D-1 | 30 | Good | 532 |
| Ex.27 | P-12 | M-3 | I-1 | S-1 | C-1 | Yes | AS-2 | D-2 | 29 | Good | 532 |
| Ex.28 | P-13 | M-3 | I-1 | S-1 | C-2 | Yes | AS-2 | D-2 | 26 | Good | 532 |
| Ex.29 | P-14 | M-3 | I-2 | S-1 | C-2 | Yes | AS-1 | D-1 | 26 | Good | 532 |
| Ex.30 | P-15 | M-3 | I-3 | S-1 | — | Yes | AS-1 | D-1 | 28 | Good | 532 |
| C.Ex.4 | CP-1 | M-2 | I-1 | S-1 | C-1 | Yes | AS-1 | D-1 | 18 | Stained | 532 |
| C.Ex.5 | CP-2 | M-1 | I-2 | S-1 | C-2 | Yes | AS-2 | D-1 | 12 | Good | 532 |
| C.Ex.6 | CP-3 | M-2 | I-1 | S-1 | C-1 | Yes | AS-1 | D-1 | 22 | Good | 532 |

Examples 31 to 46 and Comparative Examples 7 to 10

[Formation of Photosensitive Layer]

A coating solution for photosensitive layer was prepared and applied to the aluminum support [AS-1] with a wire bar to give a coating amount of 1.4 to 1.6 g/m² after drying and dried with a hot-air dryer at 115° C. for 45 seconds to form a photosensitive layer.

| (Coating solution for photosensitive layer) | |
|---|---|
| addition-polymerizable compound (listed in Table 8) | 1.0 g |
| specific polyurethane resin (listed in Table 8) | 1.0 g |
| infrared absorber (S-4) | 0.08 g |
| thermal polymerization initiator (listed in Table 8) | 0.3 g |
| fluorine-type nonionic surfactant (Megafac F-176, manufactured by Dainippon Ink and Chemicals Inc.) | 0.01 g |
| naphthalenesulfonate of Victoria Pure Blue | 0.04 g |
| methyl ethyl ketone | 9.0 g |
| propylene glycol monomethyl ether | 8.0 g |
| methanol | 10.0 g |

[Formation of Protective Layer]

On the photosensitive layer thus obtained, an aqueous solution of 3% by mass of polyvinyl alcohol (degree of saponification 98% by mol, degree of polymerization 550) was applied, if needed, to give a dry coating mass of 2 g/m² and dried at 100° C. for 2 minutes.

[Exposure of Lithographic Printing Plate Precursor]

The lithographic printing plate precursor thus obtained was eased by using Trendsetter 3244VFS provided with a 40 W watercooling infrared semiconductor laser at a power of 9W, a rotational speed of the outer face drum of 210 rpm, a plate energy of 100 mJ/cm² and a resolution of 2400 dpi.

[Development/Plate Making]

After the exposure, each of the developing solutions listed in Table 5 and FINISHER FN-6 (manufactured by Fuji Photo Film Co.) diluted with water (1:1) were fed into an automatic developing machine Stablon 900N (manufactured by Fuji Photo Film Co.). Then the exposed plate was subjected to development/plate making at 30° C. to give a lithographic printing plate.

[Press Life Test in Image Part]

Using the lithographic printing plate thus obtained, printing was performed by a printer LITHRONE (manufactured by Komori Co.) using an ink Graph G(N) (manufactured by Dainippon Ink and Chemicals). Solid image parts of the prints were observed and the press life was evaluated based on the number of paper sheets having been printed before squeeze out of the ink. A larger number of paper sheets indicates the higher press life.

[Stain Resistance Test in Non-Image Part]

The stain resistance in a non-image part was evaluated by observing the prints for each 10,000 sheets with the naked eye in the press life test in image part as described above until the ink was squeezed out. A case where no staining was observed in the nonimage part of the print was evaluated as good.

TABLE 8

| | Polyurethane resin | Polymerizable compound | Polymerization initiator | Senzitizing dye | Other additive | Protective layer | Support | Developing solution | Press life (10⁴ sheets) | Stain resistance in non-image part | Light source (nm) |
|---|---|---|---|---|---|---|---|---|---|---|---|
| Ex.31 | P-1 | M-2 | I-4 | S-4 | C-4 | Yes | AS-1 | D-1 | 30 | Good | 830 |
| Ex.32 | P-2 | M-1 | I-4 | S-4 | C-3 | Yes | AS-1 | D-2 | 27 | Good | 830 |
| Ex.33 | P-3 | M-2 | I-4 | S-4 | C-4 | Yes | AS-1 | D-1 | 27 | Good | 830 |
| Ex.34 | P-4 | M-2 | I-4 | S-4 | C-4 | Yes | AS-1 | D-1 | 29 | Good | 830 |
| Ex.35 | P-5 | M-2 | I-4 | S-4 | — | Yes | AS-1 | D-1 | 27 | Good | 830 |
| Ex.36 | P-6 | M-4 | I-4 | S-4 | C-4 | Yes | AS-1 | D-2 | 28 | Good | 830 |
| Ex.37 | P-7 | M-3 | I-4 | S-4 | — | Yes | AS-1 | D-1 | 27 | Good | 830 |
| Ex.38 | P-8 | M-3 | I-4 | S-4 | C-4 | Yes | AS-1 | D-1 | 27 | Good | 830 |
| Ex.39 | P-9 | M-4 | I-4 | S-4 | — | Yes | AS-1 | D-1 | 28 | Good | 830 |
| Ex.40 | P-10 | M-2 | I-4 | S-4 | C-3 | Yes | AS-1 | D-2 | 27 | Good | 830 |
| Ex.41 | P-11 | M-2 | I-4 | S-4 | C-4 | Yes | AS-1 | D-1 | 35 | Good | 830 |
| Ex.42 | P-12 | M-1 | I-4 | S-4 | — | Yes | AS-1 | D-1 | 34 | Good | 830 |
| Ex.43 | P-13 | M-2 | I-4 | S-4 | C-4 | No | AS-1 | D-1 | 22 | Good | 830 |
| Ex.44 | P-14 | M-1 | I-4 | S-4 | — | No | AS-1 | D-2 | 22 | Good | 830 |
| Ex.45 | P-15 | M-1 | I-4 | S-4 | C-4 | No | AS-1 | D-2 | 20 | Good | 830 |
| Ex.46 | P-1 | M-2 | I-4 | S-4 | C-4 | No | AS-1 | D-1 | 19 | Good | 830 |

TABLE 8-continued

| | Poly-urethane resin | Polymer-izable compound | Polymer-ization initiator | Senzitiz-ing dye | Other additive | Protective layer | Support | Developing solution | Press life (10⁴ sheets) | Stain resistance in non-image part | Light source (nm) |
|---|---|---|---|---|---|---|---|---|---|---|---|
| C.Ex.7 | CP-1 | M-2 | I-4 | S-4 | C-4 | Yes | AS-1 | D-1 | 24 | Stained | 830 |
| C.Ex.8 | CP-2 | M-1 | I-4 | S-4 | C-3 | Yes | AS-1 | D-2 | 21 | Good | 830 |
| C.Ex.9 | CP-3 | M-2 | I-4 | S-4 | C-4 | Yes | AS-1 | D-1 | 26 | Good | 830 |
| C.Ex.10 | CP-1 | M-2 | I-4 | S-4 | C-4 | No | AS-1 | D-1 | 15 | Good | 830 |

As Tables 6 to 8 clearly show, the lithographic printing plate precursors having photosensitive layer comprising polymerizable composition containing specific polyurethane resin (i.e., the polymerizable composition according to the invention) each showed excellent press life and no stain was observed in the nonimage part thereof, which indicates that these lithographic printing plate precursors are suitable for high-speed writing by laser exposure as carried out in EXAMPLES. Thus, it can be concluded that a lithographic printing plate precursor to which the invention is applied exhibits a high productivity.

On the other hand, the lithographic printing plate precursors of COMPARATIVE EXAMPLES, which were constructed in the same manner as the lithographic printing plate precursors of EXAMPLES but using polymerizable compositions other than the specific polyurethane resin, were each inferior in press life to the lithographic printing plate precursors of EXAMPLES and some of these lithographic printing plate precursors showed poor stain resistance in nonimage part.

This application is based on Japanese Patent application JP 2004-61114, filed Mar. 4, 2004, the entire content of which is hereby incorporated by reference, the same as if set forth at length.

What is claimed is:

1. A polymerizable composition comprising:
a polyurethane resin synthesized by using a compound represented by the following formula (II) as one of starting materials;
a photopolymerization or thermal polymerization initiator; and
an addition-polymerizable compound having an ethylenically unsaturated bond:

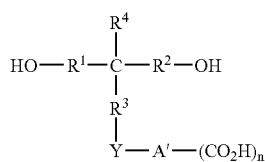

wherein $R^1$ and $R^2$ each independently represent a single bond or an alkylene group optionally having a substituent, provided that $R^1$ and $R^2$ do not represent a single bond at a same time; A' represents a straight chain linking group; $R^3$ represents an alkylene group; $R^4$ represents a straight chain or cyclic alkyl group; Y represents an oxygen atom, a nitrogen atom or a sulfur atom; and n is an integer of from 1 to 5.

2. The polymerizable composition as claimed in claim 1, wherein the polyurethane resin contains a functional group having an unsaturated bond in its side chain.

3. The polymerizable composition as claimed in claim 1, wherein the polyurethane resin has a weight-average molecular weight of from 5000 to 500000.

4. The polymerizable composition as claimed in claim 1, wherein a main skeleton constituting the linking group represented by A' has from 1 to 30 atoms.

5. The polymerizable composition as claimed in claim 1, wherein a main skeleton constituting the linking group represented by A' has from 3 to 25 atoms.

6. The polymerizable composition as claimed in claim 1, further comprising a sensitizing colorant having an absorption peak at a wavelength of from 350 to 700 nm.

7. An image-recording method comprising: exposing the polymerizable composition as claimed in claim 6 with a laser having a wavelength of from 350 to 700 nm; and developing the exposed composition in an aqueous alkali solution.

8. The polymerizable composition as claimed in claim 1, further comprising an infrared absorbing agent having an absorption peak at a wavelength of from 760 to 1,200 nm.

9. An image-recording method comprising: exposing the polymerizable composition as claimed in claim 8 with a laser having a wavelength of from 760 to 1,200 nm; and developing the exposed composition in an aqueous alkali solution.

10. A lithographic printing plate precursor comprising a support and a photosensitive layer containing the polymerizable composition as claimed in claim 1.

11. The lithographic printing plate precursor as claimed in claim 10 further comprising a protective layer so that the support, the photosensitive layer and the protective layer are in this order.

12. A method comprising: exposing the lithographic printing plate precursor as claimed in claim 11 with a laser having a wavelength of from 350 to 1,200 nm; and developing the exposed lithographic printing plate precursor in an aqueous alkali solution.

* * * * *